(12) United States Patent
Yamazaki et al.

(10) Patent No.: US 11,063,066 B2
(45) Date of Patent: Jul. 13, 2021

(54) C-AXIS ALIGNMENT OF AN OXIDE FILM OVER AN OXIDE SEMICONDUCTOR FILM

(71) Applicant: Semiconductor Energy Laboratory Co., Ltd., Atsugi (JP)

(72) Inventors: Shunpei Yamazaki, Setagaya (JP);
Junichi Koezuka, Tochigi (JP);
Yasutaka Nakazawa, Tochigi (JP);
Yukinori Shima, Tatebayashi (JP);
Masami Jintyou, Shimotsuga (JP);
Masayuki Sakakura, Isehara (JP);
Motoki Nakashima, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/420,858

(22) Filed: May 23, 2019

(65) Prior Publication Data
US 2019/0280020 A1 Sep. 12, 2019

Related U.S. Application Data

(63) Continuation of application No. 14/247,676, filed on Apr. 8, 2014, now Pat. No. 10,304,859.

(30) Foreign Application Priority Data

Apr. 12, 2013 (JP) .................................. 2013-084074

(51) Int. Cl.
*H01L 29/786* (2006.01)
*H01L 29/04* (2006.01)
(Continued)

(52) U.S. Cl.
CPC ...... *H01L 27/1225* (2013.01); *H01L 29/4925* (2013.01); *H01L 29/66969* (2013.01);
(Continued)

(58) Field of Classification Search
CPC .......... H01L 21/02609; H01L 27/1225; H01L 27/1229; H01L 29/04; H01L 29/045;
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2105967 A | 9/2009 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Eduardo A Rodela
*Assistant Examiner* — Christopher M Roland
(74) *Attorney, Agent, or Firm* — Robinson Intellectual Property Law Office; Eric J. Robinson

(57) ABSTRACT

The stability of a step of processing a wiring formed using copper, aluminum, gold, silver, molybdenum, or the like is increased. Moreover, the concentration of impurities in a semiconductor film is reduced. Moreover, the electrical characteristics of a semiconductor device are improved. In a transistor including an oxide semiconductor film, an oxide film in contact with the oxide semiconductor film, and a pair of conductive films being in contact with the oxide film and including copper, aluminum, gold, silver, molybdenum, or the like, the oxide film has a plurality of crystal parts and has c-axis alignment in the crystal parts, and the c-axes are (Continued)

aligned in a direction parallel to a normal vector of a top surface of the oxide semiconductor film or the oxide film.

15 Claims, 33 Drawing Sheets

(51) Int. Cl.
  *H01L 27/12* (2006.01)
  *H01L 29/66* (2006.01)
  *H01L 29/49* (2006.01)
  *H01L 21/02* (2006.01)

(52) U.S. Cl.
  CPC .... *H01L 29/7869* (2013.01); *H01L 29/78696* (2013.01); *H01L 21/02609* (2013.01); *H01L 27/1229* (2013.01); *H01L 29/04* (2013.01); *H01L 29/045* (2013.01)

(58) Field of Classification Search
  CPC .......... H01L 29/4925; H01L 29/66969; H01L 29/7869; H01L 29/78696
  See application file for complete search history.

(56) References Cited

U.S. PATENT DOCUMENTS

| | | | |
|---|---|---|---|
| 6,207,969 B1 | 3/2001 | Yamazaki | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,652,740 B2 | 1/2010 | Hwang et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,994,500 B2 | 8/2011 | Kim et al. | |
| 8,039,842 B2 * | 10/2011 | Jinbo | H01L 27/1214 257/59 |
| 8,058,645 B2 | 11/2011 | Jeong et al. | |
| 8,148,779 B2 | 4/2012 | Jeong et al. | |
| 8,178,884 B2 | 5/2012 | Ha et al. | |
| 8,188,480 B2 | 5/2012 | Itai | |
| 8,203,143 B2 | 6/2012 | Imai | |
| 8,232,551 B2 | 7/2012 | Kim et al. | |
| 8,309,961 B2 | 11/2012 | Yamazaki et al. | |
| 8,362,478 B2 | 1/2013 | Yamazaki et al. | |
| 8,461,583 B2 | 6/2013 | Yano et al. | |
| 8,497,502 B2 | 7/2013 | Yaegashi | |
| 8,551,824 B2 | 10/2013 | Yamazaki et al. | |
| 8,633,480 B2 | 1/2014 | Yamazaki et al. | |
| 8,664,658 B2 | 3/2014 | Yoneda | |
| 8,669,556 B2 | 3/2014 | Yamazaki et al. | |
| 8,680,522 B2 | 3/2014 | Yamazaki et al. | |
| 8,692,252 B2 | 4/2014 | Takata et al. | |
| 8,723,175 B2 | 5/2014 | Yano et al. | |
| 8,728,883 B2 | 5/2014 | Yamazaki et al. | |
| 8,748,881 B2 | 6/2014 | Yamazaki | |
| 8,779,420 B2 | 7/2014 | Yamazaki | |
| 8,791,457 B2 | 7/2014 | Yano et al. | |
| 8,853,690 B2 | 10/2014 | Yamazaki et al. | |
| 8,866,140 B2 | 10/2014 | Koike et al. | |
| 8,872,171 B2 | 10/2014 | Yamazaki et al. | |
| 8,895,978 B2 | 11/2014 | Koike et al. | |
| 8,946,702 B2 | 2/2015 | Yamazaki et al. | |
| 8,952,377 B2 | 2/2015 | Yamazaki et al. | |
| 8,994,021 B2 | 3/2015 | Yamazaki et al. | |
| 9,029,852 B2 | 5/2015 | Honda et al. | |
| 9,093,544 B2 | 7/2015 | Yamazaki et al. | |
| 9,123,817 B2 | 9/2015 | Kwon et al. | |
| 9,130,049 B2 | 9/2015 | Sano et al. | |
| 9,142,681 B2 | 9/2015 | Watanabe et al. | |
| 9,190,528 B2 | 11/2015 | Yamazaki et al. | |
| 9,196,745 B2 | 11/2015 | Yamazaki et al. | |
| 9,214,520 B2 | 12/2015 | Yamazaki | |
| 9,236,491 B2 | 1/2016 | Takata et al. | |
| 9,281,358 B2 | 3/2016 | Yamazaki et al. | |
| 9,287,411 B2 | 3/2016 | Koezuka et al. | |
| 9,324,880 B2 | 4/2016 | Ono et al. | |
| 9,331,208 B2 | 5/2016 | Yamazaki et al. | |
| 9,385,238 B2 | 7/2016 | Yamazaki | |
| 9,406,808 B2 | 8/2016 | Yamazaki et al. | |
| 9,419,146 B2 * | 8/2016 | Yamazaki | H01L 29/78693 |
| 9,472,679 B2 | 10/2016 | Yamazaki et al. | |
| 9,530,897 B2 | 12/2016 | Yamazaki et al. | |
| 9,583,637 B2 | 2/2017 | Sano et al. | |
| 9,634,082 B2 | 4/2017 | Yamazaki et al. | |
| 9,711,655 B2 | 7/2017 | Yamazaki et al. | |
| 9,741,860 B2 | 8/2017 | Honda et al. | |
| 9,837,548 B2 | 12/2017 | Yamazaki | |
| 9,905,516 B2 | 2/2018 | Watanabe et al. | |
| 9,947,797 B2 | 4/2018 | Yamazaki et al. | |
| 10,050,153 B2 * | 8/2018 | Koezuka | H01L 29/42384 |
| 10,103,277 B2 | 10/2018 | Yamazaki et al. | |
| 10,290,744 B2 | 5/2019 | Honda et al. | |
| 10,439,072 B2 | 10/2019 | Yamazaki | |
| 10,615,287 B2 | 4/2020 | Sano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |

(56) References Cited

U.S. PATENT DOCUMENTS

| | | |
|---|---|---|
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127551 A1 | 5/2009 | Imai |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0218572 A1 | 9/2009 | Dairiki et al. |
| 2009/0236596 A1 | 9/2009 | Itai |
| 2009/0250693 A1 | 10/2009 | Jeong et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0006833 A1 | 1/2010 | Ha et al. |
| 2010/0038641 A1 | 2/2010 | Imai |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0099216 A1 | 4/2010 | Suzawa et al. |
| 2010/0109002 A1 | 5/2010 | Itagaki et al. |
| 2010/0117999 A1 | 5/2010 | Matsunaga et al. |
| 2010/0148170 A1 | 6/2010 | Ueda et al. |
| 2010/0163866 A1 | 7/2010 | Akimoto et al. |
| 2010/0163868 A1 | 7/2010 | Yamazaki et al. |
| 2010/0276688 A1 | 11/2010 | Yano et al. |
| 2010/0301328 A1 | 12/2010 | Yamazaki et al. |
| 2011/0024751 A1 | 2/2011 | Yamazaki et al. |
| 2011/0062436 A1 | 3/2011 | Yamazaki et al. |
| 2011/0068335 A1 | 3/2011 | Yamazaki et al. |
| 2011/0109351 A1 | 5/2011 | Yamazaki et al. |
| 2011/0127522 A1 | 6/2011 | Yamazaki |
| 2011/0127523 A1* | 6/2011 | Yamazaki ......... H01L 21/02554 257/43 |
| 2011/0127579 A1 | 6/2011 | Yamazaki |
| 2011/0140100 A1 | 6/2011 | Takata et al. |
| 2011/0156026 A1 | 6/2011 | Yamazaki et al. |
| 2011/0175082 A1 | 7/2011 | Kim et al. |
| 2011/0193083 A1 | 8/2011 | Kim et al. |
| 2011/0269266 A1 | 11/2011 | Yamazaki |
| 2012/0033152 A1 | 2/2012 | Ha et al. |
| 2012/0052624 A1 | 3/2012 | Yamazaki |
| 2012/0119205 A1 | 5/2012 | Taniguchi et al. |
| 2012/0132903 A1 | 5/2012 | Yamazaki et al. |
| 2012/0138922 A1 | 6/2012 | Yamazaki et al. |
| 2012/0153278 A1 | 6/2012 | Jeong et al. |
| 2012/0220077 A1 | 8/2012 | Ha et al. |
| 2012/0256179 A1 | 10/2012 | Yamazaki et al. |
| 2012/0280227 A1 | 11/2012 | Wakana et al. |
| 2012/0298999 A1 | 11/2012 | Jinbo et al. |
| 2012/0302003 A1 | 11/2012 | Shieh et al. |
| 2012/0305912 A1 | 12/2012 | Koyama et al. |
| 2012/0319102 A1 | 12/2012 | Yamazaki et al. |
| 2012/0319112 A1 | 12/2012 | Cho et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0082262 A1 | 4/2013 | Honda et al. |
| 2013/0112972 A1 | 5/2013 | Koike et al. |
| 2013/0168671 A1 | 7/2013 | Koike et al. |
| 2013/0181218 A1 | 7/2013 | Maeda et al. |
| 2013/0228926 A1 | 9/2013 | Maeda et al. |
| 2013/0299819 A1* | 11/2013 | Yamazaki ........... H01L 29/7869 257/43 |
| 2013/0308073 A1* | 11/2013 | Yamazaki ........... H01L 27/1225 349/46 |
| 2013/0320330 A1 | 12/2013 | Yamazaki |
| 2013/0320334 A1 | 12/2013 | Yamazaki et al. |
| 2014/0038351 A1 | 2/2014 | Yamazaki et al. |
| 2014/0042434 A1 | 2/2014 | Yamazaki |
| 2014/0042438 A1 | 2/2014 | Yamazaki |
| 2014/0110705 A1 | 4/2014 | Koezuka et al. |
| 2014/0110708 A1 | 4/2014 | Koezuka et al. |
| 2014/0113405 A1 | 4/2014 | Tsubuku et al. |
| 2014/0124776 A1 | 5/2014 | Takahashi et al. |
| 2014/0151687 A1* | 6/2014 | Yamazaki ......... H01L 29/66969 257/43 |
| 2014/0175433 A1* | 6/2014 | Yamazaki ........... H01L 27/1255 257/43 |
| 2014/0183530 A1* | 7/2014 | Yamazaki ............. H01L 29/517 257/43 |
| 2014/0206133 A1 | 7/2014 | Koezuka et al. |
| 2014/0209897 A1 | 7/2014 | Kubota et al. |
| 2014/0231798 A1 | 8/2014 | Ono et al. |
| 2014/0241978 A1 | 8/2014 | Yamazaki et al. |
| 2014/0306217 A1 | 10/2014 | Yamazaki et al. |
| 2014/0326992 A1 | 11/2014 | Hondo et al. |
| 2014/0347588 A1 | 11/2014 | Hatsumi et al. |
| 2014/0361293 A1* | 12/2014 | Yamazaki ......... H01L 29/78696 257/43 |
| 2015/0008428 A1* | 1/2015 | Yamamoto ........ H01L 29/40114 257/43 |
| 2015/0011046 A1* | 1/2015 | Tanaka ................ H01L 29/4908 438/104 |
| 2015/0021596 A1* | 1/2015 | Yamazaki ........... H01L 29/7869 257/43 |
| 2015/0054548 A1* | 2/2015 | Kato ................. H01L 29/66833 326/55 |
| 2015/0054550 A1* | 2/2015 | Koyama ............... H03F 1/0261 327/109 |
| 2015/0102342 A1* | 4/2015 | Yamazaki ........... H01L 27/1225 257/43 |
| 2015/0108552 A1* | 4/2015 | Yamazaki ......... H01L 29/78696 257/288 |
| 2015/0270405 A1 | 9/2015 | Takahashi et al. |
| 2015/0294994 A1 | 10/2015 | Takahashi et al. |
| 2016/0336456 A1 | 11/2016 | Yamazaki et al. |
| 2017/0069765 A1 | 3/2017 | Yamazaki et al. |
| 2017/0309753 A1 | 10/2017 | Yamazaki et al. |
| 2018/0308989 A1 | 10/2018 | Yamazaki et al. |

FOREIGN PATENT DOCUMENTS

| | | |
|---|---|---|
| EP | 2141743 A | 1/2010 |
| EP | 2144294 A | 1/2010 |
| EP | 2146379 A | 1/2010 |
| EP | 2197034 A | 6/2010 |
| EP | 2226847 A | 9/2010 |
| EP | 2256814 A | 12/2010 |
| EP | 2423966 A | 2/2012 |
| EP | 2453480 A | 5/2012 |
| EP | 2453481 A | 5/2012 |
| EP | 2455975 A | 5/2012 |
| EP | 2535936 A | 12/2012 |
| EP | 2544237 A | 1/2013 |
| GB | 2153589 | 8/1985 |

(56) References Cited

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-133422 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2007-096055 A | 4/2007 |
| JP | 2007-123861 A | 5/2007 |
| JP | 2007-150158 A | 6/2007 |
| JP | 2008-276212 A | 11/2008 |
| JP | 2009-231613 A | 10/2009 |
| JP | 2009-253204 A | 10/2009 |
| JP | 2010-003822 A | 1/2010 |
| JP | 2010-004027 A | 1/2010 |
| JP | 2010-016347 A | 1/2010 |
| JP | 2010-016348 A | 1/2010 |
| JP | 2010-021333 A | 1/2010 |
| JP | 2010-021520 A | 1/2010 |
| JP | 2010-021555 A | 1/2010 |
| JP | 2010-034534 A | 2/2010 |
| JP | 2010-040552 A | 2/2010 |
| JP | 2010-067954 A | 3/2010 |
| JP | 2010-073881 A | 4/2010 |
| JP | 2010-186860 A | 8/2010 |
| JP | 2010-267955 A | 11/2010 |
| JP | 2011-009719 A | 1/2011 |
| JP | 2011-086923 A | 4/2011 |
| JP | 2011-100997 A | 5/2011 |
| JP | 2011-124360 A | 6/2011 |
| JP | 2011-135063 A | 7/2011 |
| JP | 2011-138934 A | 7/2011 |
| JP | 2011-243745 A | 12/2011 |
| JP | 2011-249823 A | 12/2011 |
| JP | 2012-059860 A | 3/2012 |
| JP | 2012-094853 A | 5/2012 |
| JP | 2012-119664 A | 6/2012 |
| JP | 2012-134467 A | 7/2012 |
| JP | 2012-134475 A | 7/2012 |
| JP | 2012-160679 A | 8/2012 |
| JP | 2012-191131 A | 10/2012 |
| JP | 2013-004958 A | 1/2013 |
| JP | 2013-038399 A | 2/2013 |
| JP | 2013-038402 A | 2/2013 |
| JP | 2013-041944 A | 2/2013 |
| JP | 2013-041945 A | 2/2013 |
| JP | 2013-084940 A | 5/2013 |
| JP | 2015-130466 A | 7/2015 |
| KR | 2011-0126071 | 11/2011 |
| KR | 2012-0037838 A | 4/2012 |
| KR | 2013-0033308 A | 4/2013 |
| WO | WO-2004/114391 | 12/2004 |
| WO | WO-2006/051993 | 5/2006 |
| WO | WO-2008/126884 | 10/2008 |
| WO | WO-2009/034953 | 3/2009 |
| WO | WO-2009/072532 | 6/2009 |
| WO | WO-2009/081885 | 7/2009 |
| WO | WO-2010/093051 | 8/2010 |
| WO | WO-2011/033936 | 3/2011 |
| WO | WO-2011/043203 | 4/2011 |
| WO | WO-2011/065243 | 6/2011 |
| WO | WO-2011/065329 | 6/2011 |
| WO | WO-2012/002573 | 1/2012 |
| WO | WO-2012/002574 | 1/2012 |
| WO | WO-2012/073844 | 6/2012 |
| WO | WO-2012/073918 | 6/2012 |
| WO | WO-2013/008407 | 1/2013 |
| WO | WO-2013/024646 | 2/2013 |
| WO | WO-2013/047629 | 4/2013 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006. vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

(56) References Cited

OTHER PUBLICATIONS

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUs on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2OS—In2OS—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 35, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Sorida.N et al., "Nanometer-scale crystallinity in In—Ga—Zn-oxide thin film deposited at room temperature observed by nanobeam electron diffraction", Jpn. J. Appl. Phys. (Japanese Journal of Applied Physics) , Mar. 16, 2014, vol. 53, pp. 115501-1-115501-6.

Dairiki.K et al., "Evaluation of Crystallinity by Nano-Beam Electron Diffraction", Extended Abstract of the 60th JSAP Spring Meeting, Mar. 29, 2013, pp. 21-066.

Takahashi.M et al., "Existence of Nano-Crystals in IGZO Thin Film", Extended Abstract of the 60th JSAP Spring Meeting, Mar. 29, 2013, pp. 21-067.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Nathan.A et al., "Amorphous Oxide TFTs: Progress and Issues", SID Digest '12 : SID International Symposium Digest of Technical Papers, Jun. 5, 2012, vol. 43, No. 1, pp. 1-4.

Jeon.S et al., "Low-Frequency Noise Performance of a Bilayer InZnO_InGaZnO Thin-Film Transistor for Analog Device Applications", IEEE Electron Device Letters, Oct. 1, 2010, vol. 31, No. 10, pp. 1128-1130.

Ghaffarzadeh.K et al., "Light-Bias Induced Instability and Persistent Photoconductivity in In—Zn—O/Ga—In—Zn—O Thin Film Transistors", SID Digest '11 : SID International Symposium Digest of Technical Papers, Jun. 1, 2011, vol. 42, No. 1, pp. 1154-1157.

\* cited by examiner c-axis

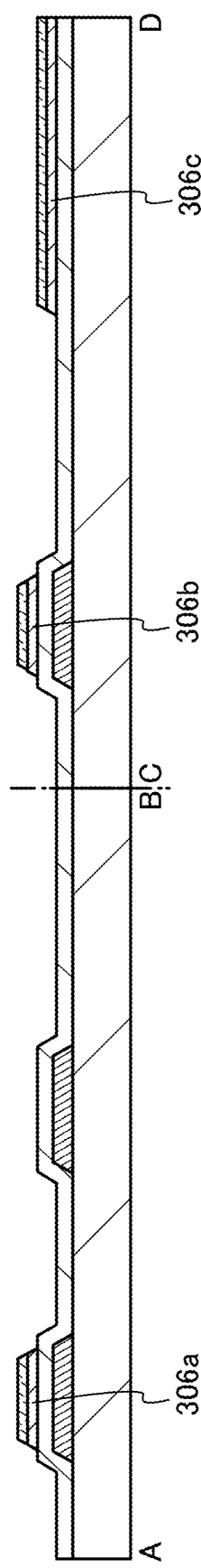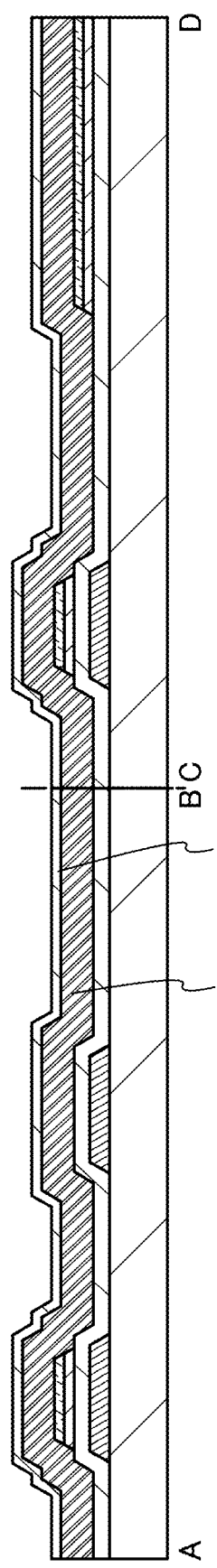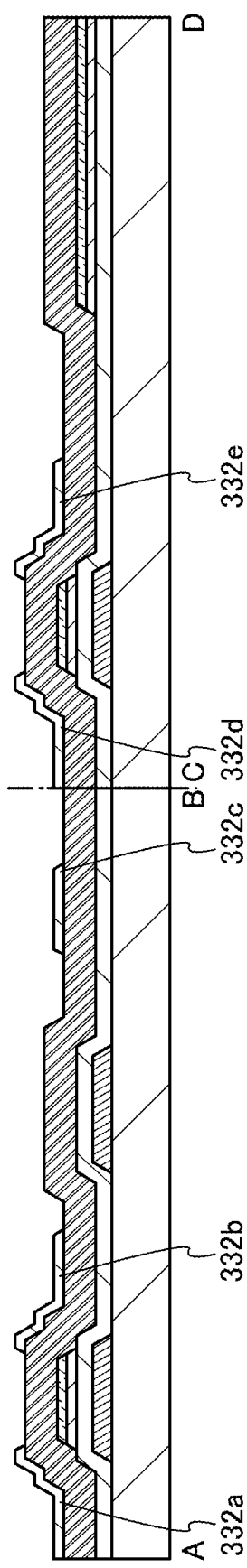

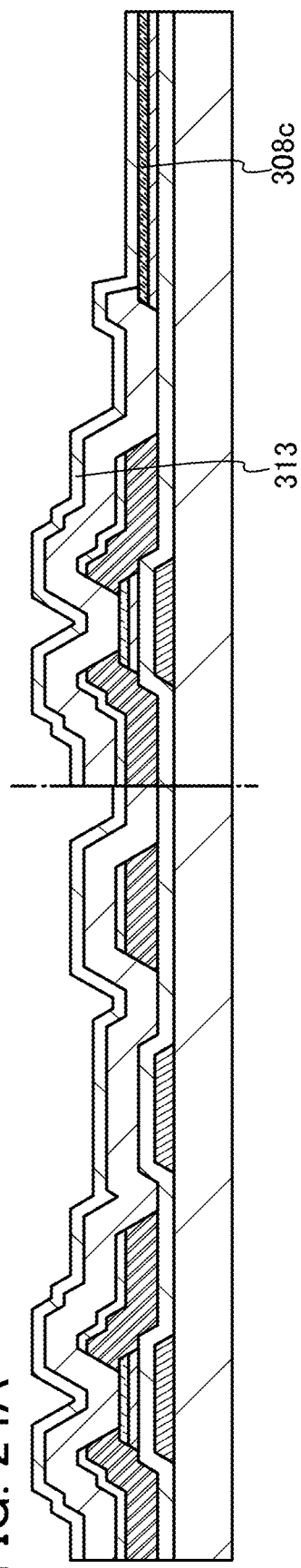
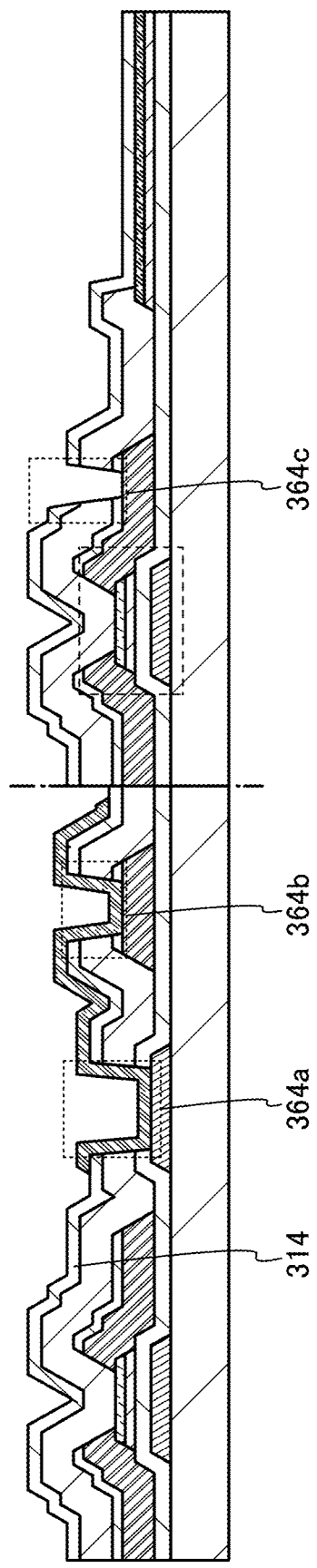
FIG. 24A
FIG. 24B

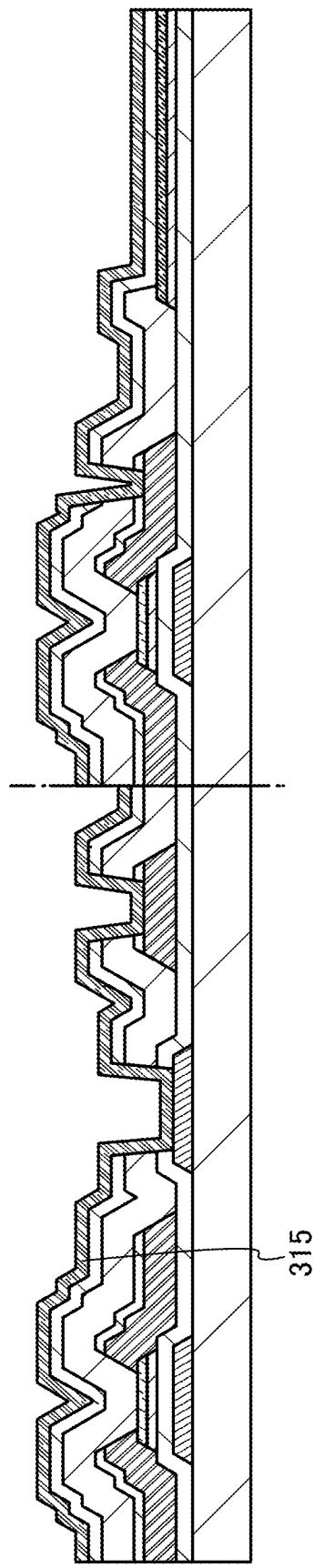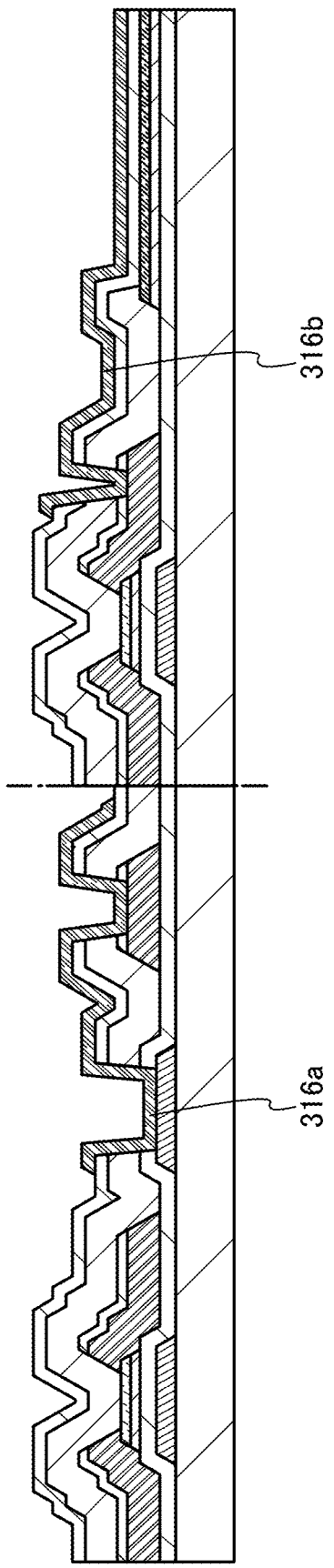

C-AXIS ALIGNMENT OF AN OXIDE FILM OVER AN OXIDE SEMICONDUCTOR FILM

BACKGROUND OF THE INVENTION

1. Field of the Invention

The present invention relates to a semiconductor device including a transistor and a manufacturing method thereof.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, such a technique is disclosed that a transistor is manufactured using zinc oxide or an In—Ga—Zn-based oxide as an oxide semiconductor and the transistor is used as a switching element or the like in a pixel of a display device (see Patent Documents 1 and 2).

Further, in accordance with increasing size and increasing definition of a flat panel display, the driving frequency is increased and the resistance and the parasitic capacitance of a wiring are increased, so that wiring delay occurs. In order to inhibit the wiring delay, a technique for forming a wiring using copper has been studied (Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2004-133422

SUMMARY OF THE INVENTION

However, there are problems in that copper, aluminum, gold, silver, molybdenum, or the like, which is a constituent element of the wiring, is difficult to process, and they are diffused in an oxide semiconductor film in the course of the processing.

Copper, aluminum, gold, silver, molybdenum, or the like, which is a constituent element of the wiring, is one of impurities causing poor electrical characteristics of a transistor. Therefore, there is a problem in that mixing of the impurities into an oxide semiconductor film reduces the resistance of the oxide semiconductor film and the amount of change in electrical characteristics, typically in threshold voltage, of the transistor is increased by change over time or a stress test.

Thus, an object of one embodiment of the present invention is to increase the stability of a step of processing a wiring formed using copper, aluminum, gold, silver, molybdenum, or the like. Another object of one embodiment of the present invention is to reduce the concentration of impurities in an oxide semiconductor film. Another object of one embodiment of the present invention is to improve electrical characteristics of a semiconductor device. Another object of one embodiment of the present invention is to improve the reliability of a semiconductor device. Another object of one embodiment of the present invention is to realize high speed operation of a semiconductor device. Another object of one embodiment of the present invention is to realize reduction in power consumption of a semiconductor device. Another object of one embodiment of the present invention is to realize a semiconductor device having excellent yield. In one embodiment of the present invention, there is no need to achieve all the objects.

In one embodiment of the present invention, in a transistor including an oxide semiconductor film, an oxide film in contact with the oxide semiconductor film, a pair of conductive films being in contact with the oxide film and including copper, aluminum, gold, silver, molybdenum, or the like, the oxide film has a plurality of crystal parts and has c-axis alignment in the crystal parts, and the c-axes are aligned in a direction parallel to a normal vector of a top surface of the oxide semiconductor film or the oxide film. The oxide film which includes the plurality of crystal parts and has c-axis alignment in the plurality of crystal parts, and in which the c-axes are aligned in a direction parallel to the normal vector of a top surface of the oxide semiconductor film or the oxide film is provided between the oxide semiconductor film and the pair of conductive films, whereby transfer of a metal element included in the pair of conductive films, typically, copper, aluminum, gold, silver, molybdenum, or the like, to the oxide semiconductor film can be prevented. As a result, in the oxide semiconductor film, copper, aluminum, gold, silver, molybdenum, or the like can be reduced.

One embodiment of the present invention is a semiconductor device including a transistor including an oxide semiconductor film, an oxide film in contact with the oxide semiconductor film, a pair of conductive films being in contact with the oxide film and including copper, aluminum, gold, silver, or molybdenum, a gate insulating film in contact with the oxide semiconductor film or the oxide film, and a gate electrode overlapping with the oxide semiconductor film and the oxide film with the gate insulating film provided between the gate electrode and the oxide semiconductor layer and between the gate electrode and the oxide film. The oxide film has a plurality of crystal parts and has c-axis alignment in the crystal parts. The c-axes are aligned in a direction parallel to a normal vector of a top surface of the oxide semiconductor film or the oxide film.

In the plurality of crystal parts of the oxide film, the directions of a-axes and b-axes are irregular. The pair of conductive films may have a single-layer structure. Alternatively, the pair of conductive films may have a stacked-layer structure. In the case where the pair of conductive films has a stacked-layer structure, at least a film in contact with the oxide film includes copper, aluminum, gold, silver, or molybdenum.

In the case where the transistor is a bottom-gate transistor, the gate insulating film, the oxide semiconductor film, and the oxide film are provided between the gate electrode and the pair of conductive films in this order, and the gate insulating film includes an oxide insulating film in contact with a surface of the oxide semiconductor film opposite to a surface in contact with the oxide film and a nitride insulating film in contact with the gate electrode and the oxide insulating film.

In the case where the transistor is a top-gate transistor, the oxide film, the pair of conductive films, and the gate insulating film are provided between the oxide semiconductor film and the gate electrode in this order, the oxide semiconductor film is in contact with a base insulating film, and the base insulating film includes an oxide insulating film in contact with a surface of the oxide semiconductor film opposite to a surface in contact with the oxide film and a nitride insulating film in contact with the oxide insulating film.

Moreover, a protective film may be provided on surfaces opposite to surfaces in contact with the oxide film of the pair of conductive films.

The protective film is a nitride insulating film, and may be formed of, typically, silicon nitride, silicon nitride oxide, aluminum nitride, or aluminum nitride oxide.

Alternatively, the protective film is a light-transmitting conductive film and may be formed of, typically, indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide.

Alternatively, the protective film is an oxide film containing In, Ga, or Zn, and is formed of, typically, In—Ga oxide, In—Zn oxide, or an In-M-Zn oxide (M is Ga, Y, Zr, La, Ce, or Nd).

According to one embodiment of the present invention, the stability of a step of processing a wiring formed using copper, aluminum, gold, silver, molybdenum, or the like can be increased. Further, according to one embodiment of the present invention, in a semiconductor device or the like including an oxide semiconductor film, the concentration of impurities in the oxide semiconductor film can be reduced. Further, according to one embodiment of the present invention, in a semiconductor device including an oxide semiconductor film, electrical characteristics can be improved. Further, according to one embodiment of the present invention, in a semiconductor device including an oxide semiconductor film, the reliability can be improved. Further, according to one embodiment of the present invention, high speed operation of a semiconductor device can be realized. Further, according to one embodiment of the present invention, reduction in power consumption of a semiconductor device can be realized. Further, according to one embodiment of the present invention, a semiconductor device having excellent productivity can be realized.

BRIEF DESCRIPTION OF THE DRAWINGS

In the accompanying drawings:

FIGS. 22A to 22C are cross-sectionals views illustrating one embodiment of a method for manufacturing a semiconductor device;

FIGS. 24A and 24B are cross-sectionals views illustrating one embodiment of a method for manufacturing a semiconductor device;

FIGS. 25A and 25B are cross-sectionals views illustrating one embodiment of a method for manufacturing a semiconductor device;

DETAILED DESCRIPTION OF THE INVENTION

Figure 1A:
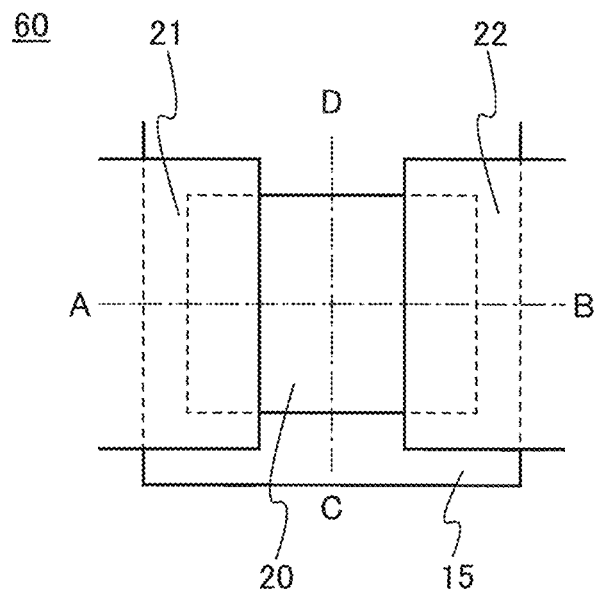
FIGS. 1A to 1C are a top view and cross-sectional views illustrating one embodiment of a transistor.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and an example. In addition, in the following embodiments and an example, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a semiconductor device which is one embodiment of the present invention and a manufacturing method thereof are described with reference to drawings.

In a transistor including an oxide semiconductor film, oxygen vacancies are given as an example of a defect which leads to poor electrical characteristics of the transistor. For example, the threshold voltage of a transistor including an oxide semiconductor film which contains oxygen vacancies in the film easily shifts in the negative direction, and such a transistor tends to have normally-on characteristics. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation. Further, there is a problem in that the amount of change in electrical characteristics, typically in threshold voltage, of the transistor is increased by change over time or a stress test.

One factor in generating oxygen vacancies is damage caused in a manufacturing process of a transistor. For example, when an insulating film, a conductive film, or the like is formed over an oxide semiconductor film by a plasma CVD method or a sputtering method, the oxide semiconductor film might be damaged depending on formation conditions thereof.

Further, not only oxygen vacancies but also impurities such as silicon or carbon which is a constituent element of the insulating film cause poor electrical characteristics of a transistor. In the case where a transistor is manufactured using a large substrate of the 8th generation or later, for example, a wiring is formed using a low-resistance material, such as copper, aluminum, gold, silver, or molybdenum to inhibit wiring delay. However, copper, aluminum, gold, silver, molybdenum, or the like which is a constituent element of the wiring is also one of impurities causing poor electrical characteristics of a transistor. Therefore, there is a problem in that mixing of the impurities into an oxide semiconductor film reduces the resistance of the oxide semiconductor film and the amount of change in electrical characteristics, typically in threshold voltage, of the transistor is increased by change over time or a stress test.

Thus, an object of this embodiment is to reduce oxygen vacancies in an oxide semiconductor film having a channel region and the concentration of impurities in the oxide semiconductor film, in a semiconductor device including a transistor having the oxide semiconductor film.

Moreover, there is a trend in a commercially available display device toward a larger screen, e.g., a 60-inch diagonal screen, and further, the development of a display device is aimed even at a screen size of a diagonal of 120 inches or more. Hence, a glass substrate for a display device has grown in size, e.g., to the 8th generation or more. However, in the case of using a large-sized substrate, because heat treatment is performed at high temperatures, e.g., at 450° C. or higher, an expensive, large-sized heating apparatus is needed. Accordingly, the manufacturing cost is increased. Further, high-temperature heat treatment causes a warp or a shrink of the substrate, which leads to a reduction in yield.

Thus, one object of this embodiment is to manufacture a semiconductor device using heat treatment at a temperature which allows the use of a large-sized substrate and using a small number of heat treatment steps.

Figure 1C:
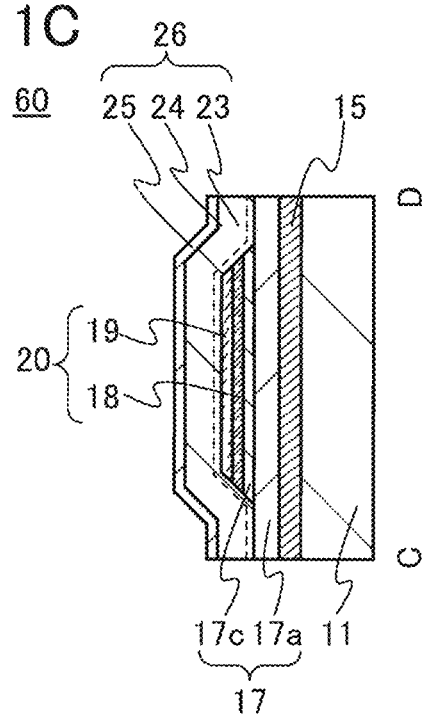
Figure 1B:
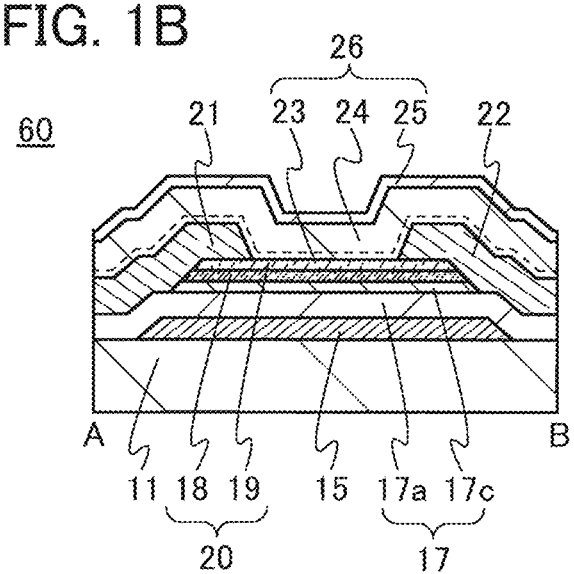

FIGS. 1A to 1C are a top view and cross-sectional views of a transistor 60 of a semiconductor device. The transistor 60 shown in FIGS. 1A to 1C is a channel-etched transistor. FIG. 1A is a top view of the transistor 60, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, one or more of components of the transistor 60 (e.g., a gate insulating film 17), an oxide insulating film 23, an oxide insulating film 24, a nitride insulating film 25, and the like are not illustrated for clarity.

The transistor 60 shown in FIGS. 1B and 1C includes a gate electrode 15 provided over the substrate 11, the gate insulating film 17 over the substrate 11 and the gate electrode 15, a multilayer film 20 overlapping with the gate electrode 15 with the gate insulating film 17 provided therebetween, and a pair of conductive films serving as electrodes (hereinafter referred to as a pair of electrodes 21 and 22) in contact with the multilayer film 20. Furthermore, a protective film 26 including the oxide insulating film 23, the oxide insulating film 24, and the nitride insulating film 25 is formed over the gate insulating film 17, the multilayer film 20, and the pair of electrodes 21 and 22.

In the transistor 60 described in this embodiment, the multilayer film 20 includes the oxide semiconductor film 18 and the oxide film 19. Further, part of the oxide semiconductor film 18 serves as a channel region. Furthermore, the oxide insulating film 23 is formed in contact with the oxide film 19, and the oxide insulating film 24 is formed in contact with the oxide insulating film 23. That is, the oxide film 19 is provided between the oxide semiconductor film 18 and the oxide insulating film 23.

In this embodiment, the oxide film 19 is formed using a c-axis aligned crystalline (CAAC) oxide film. The details of the CAAC oxide film will be described later. In the CAAC oxide film, which has c-axis alignment, a grain boundary is not found and the c-axes are aligned in a direction parallel to a normal vector of a formation surface or a normal vector of a top surface. Thus, the oxide film 19 functions as a film which prevents transfer of a metal element included in the pair of electrodes 21 and 22, for example, copper, aluminum, gold, silver, or molybdenum. Accordingly, the metal element included in the pair of electrodes 21 and 22 is not easily transferred to the oxide semiconductor film 18. As a result, the impurities in the oxide semiconductor film 18 of the multilayer film 20 can be reduced. Further, a transistor of which the electrical characteristics are improved can be manufactured.

Other details of the transistor 60 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 60 may be provided directly on the flexible substrate. Alternatively, a separation layer may be provided between the substrate 11 and the transistor 60. The separation layer can be used when part or the whole of a semiconductor device is formed over the separation layer and separated from the substrate 11 and transferred to another substrate. In such a case, the transistor 60 can be transferred to a substrate having low heat resistance or a flexible substrate as well.

The gate electrode 15 can be formed using a metal element selected from chromium, copper, aluminum, gold, silver, molybdenum, tantalum, titanium, and tungsten; an alloy containing any of these metal elements as a component; an alloy containing any of these metal elements in combination; or the like. Further, one or more metal elements selected from manganese or zirconium may be used. The gate electrode 15 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The gate electrode 15 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 15 and the gate insulating film 17. These films each have a work function higher than or equal to 5 eV, or higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride film, an In—Ga—Zn-based oxynitride film whose nitrogen concentration is higher than at least the nitrogen concentration of the oxide semiconductor film 18, specifically, an In—Ga—Zn-based oxynitride film whose nitrogen concentration is higher than or equal to 7 at. % is used.

The gate insulating film 17 includes a nitride insulating film 17a provided on the gate electrode 15 side and an oxide insulating film 17c in contact with the oxide semiconductor film 18. One surface of the nitride insulating film 17a is in contact with the gate electrode 15, and the other surface thereof is in contact with the oxide insulating film 17c and the pair of electrodes 21 and 22. One surface of the oxide insulating film 17c is in contact with the nitride insulating film 17a, and the other surface thereof is in contact with the oxide semiconductor film 18. That is, the side surfaces of the oxide semiconductor film 18 are substantially aligned with those of the oxide insulating film 17c.

The nitride insulating film 17a is formed using silicon nitride, silicon nitride oxide, aluminum nitride, aluminum nitride oxide, or the like.

The nitride insulating film 17a can be formed to have a single-layer structure or a stacked-layer structure. As an example of the stacked-layer structure, a stacked-layer structure in which a first nitride insulating film with a small number of defects and a second nitride insulating film with a high hydrogen blocking property are stacked in this order from the gate electrode 15 side can be given. When the first nitride insulating film with a small number of defects is provided, the withstand voltage of the gate insulating film 17 can be improved. Further, when the second nitride insulating film with a high hydrogen blocking property is provided, hydrogen can be prevented from being transferred from the gate electrode 15 and the first nitride insulating film to the oxide semiconductor film 18.

Alternatively, the nitride insulating film 17a can have a stacked-layer structure in which a first nitride insulating film with a high impurity blocking property, a second nitride insulating film with few defects, and a third nitride insulating film with a high hydrogen blocking property are stacked from the gate electrode 15 side in this order. When the first nitride insulating film with a high impurity blocking property is provided, an impurity, typically hydrogen, nitrogen, alkali metal, alkaline earth metal, or the like, can be prevented from being transferred from the gate electrode 15 to the oxide semiconductor film 18.

The oxide insulating film 17c is formed using silicon oxide, silicon oxynitride, aluminum oxide, hafnium oxide, gallium oxide, a Ga—Zn-based metal oxide, or the like.

In this embodiment, the gate insulating film 17 includes the nitride insulating film 17a in contact with the pair of electrodes 21 and 22, and an oxide insulating film 17c in contact with the oxide semiconductor film 18. Since the oxide semiconductor film 18 is in contact with the gate insulating film 17, the interface state density at the interface between the oxide semiconductor film 18 and the gate insulating film 17 can be reduced. Further, the pair of electrodes 21 and 22 is in contact with the nitride insulating film 17a. The nitride insulating film 17a has a function of preventing oxidization of the pair of electrodes 21 and 22 and has a function of preventing diffusion of the metal element included in the pair of electrodes 21 and 22. Thus, since the pair of electrodes 21 and 22 is in contact with the nitride insulating film 17a, an increase in resistance values of the pair of electrodes 21 and 22 can be prevented and a decrease in electrical characteristics of a transistor due to diffusion of the metal element included in the pair of electrodes 21 and 22 can also be prevented.

The thickness of the gate insulating film 17 is greater than or equal to 5 nm and less than or equal to 400 nm, greater than or equal to 10 nm and less than or equal to 300 nm, or greater than or equal to 50 nm and less than or equal to 250 nm.

The oxide semiconductor film 18 is formed using, typically, In—Ga oxide, In—Zn oxide, and an In-M-Zn oxide (M is Ga, Y, Zr, La, Ce, or Nd). Further, the oxide semiconductor film 18 is formed using a homologous compound represented by $InMO_3(ZnO)_w$ (M is Ga, Y, Zr, La, Ce, or Nd, and m is a natural number).

In the case where the oxide semiconductor film 18 is an In-M-Zn oxide film (M is Ga, Y, Zr, La, Ce, or Nd), it is preferable that the atomic ratio of metal elements of a sputtering target used for forming a film of the In-M-Zn oxide satisfy In M and Zn M As the atomic ratio of metal elements of such a sputtering target, In:M:Zn=1:1:1 and In:M:Zn=3:1:2 are preferable. Note that the proportion of the atomic ratio of the oxide semiconductor film 18 varies within a range of ±40% of the above atomic ratio of metal elements of a sputtering target as an error.

Note that in the case where the oxide semiconductor film 18 is an In-M-Zn oxide film, the proportions of In and M are as follows: the atomic percentage of In is greater than or equal to 25 atomic % and the atomic percentage of M is less than 75 atomic %, or the atomic percentage of In is greater than or equal to 34 atomic % and the atomic percentage of M is less than 66 atomic %.

The energy gap of the oxide semiconductor film 18 is 2 eV or more, 2.5 eV or more, or 3 eV or more. With the use of an oxide semiconductor having such a wide energy gap, the off-state current of the transistor 60 can be reduced.

The thickness of the oxide semiconductor film 18 is greater than or equal to 3 nm and less than or equal to 200 nm, greater than or equal to 3 nm and less than or equal to 100 nm, or greater than or equal to 3 nm and less than or equal to 50 nm.

Note that it is preferable to use, as the oxide semiconductor film 18, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic".

A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases.

Further, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V.

Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

A transistor in which an oxide semiconductor film having a structure similar to that of a CAAC oxide film described later (hereinafter, referred to as a c-axis aligned crystalline oxide semiconductor (CAAC-OS) film) is used as the oxide semiconductor film 18 has a small variation in electrical characteristics caused by irradiation with visible light or ultraviolet light.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 18. Specifically, the hydrogen concentration of the oxide semiconductor film 18, which is measured by secondary ion mass spectrometry (SIMS), is lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$.

When silicon or carbon which is one of elements belonging to Group 14 is contained in the oxide semiconductor film 18, the amount of oxygen vacancies is increased, and the oxide semiconductor film 18 becomes an n-type film. Thus, the concentration of silicon or carbon of the oxide semiconductor film 18 or the concentration of silicon or carbon of the vicinity of the interface between the oxide film 19 and the oxide semiconductor film 18 (the concentration is measured by SIMS) is lower than or equal to $2 \times 10^{18}$ atoms/cm$^3$, or lower than or equal to $2 \times 10^{17}$ atoms/cm$^3$.

Further, the concentration of alkali metal or alkaline earth metal of the oxide semiconductor film 18, which is measured by SIMS, is lower than or equal to $1 \times 10^{18}$ atoms/cm$^3$, or lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 18.

Further, when containing nitrogen, the oxide semiconductor film 18 easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5 \times 10^{18}$ atoms/cm$^3$.

The oxide semiconductor film 18 may have a non-single-crystal structure, for example. The non-single crystal structure includes a CAAC-OS, a polycrystalline structure, a microcrystalline structure described later, or an amorphous structure, for example. Among the non-single crystal structure, the amorphous structure has the highest density of defect levels, whereas the CAAC-OS has the lowest density of defect levels.

Note that the oxide semiconductor film 18 may be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

The oxide film 19 is typically In—Ga oxide, In—Zn oxide, or an In-M-Zn oxide (M is Ga, Y, Zr, La, Ce, or Nd). The energy at the conduction band bottom of the oxide film 19 is closer to a vacuum level than that of the oxide semiconductor film 18 is, and typically, the difference between the energy at the conduction band bottom of the oxide film 19 and the energy at the conduction band bottom of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 19 and the electron affinity of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less.

In the case where the oxide film 19 is an In-M-Zn oxide film (M is Ga, Y, Zr, La, Ce, or Nd), the atomic ratio of metal elements of a sputtering target used for formation of the In-M-Zn oxide film preferably satisfies M>In and Zn>0.5× M, and more preferably, also Zn M As the atomic ratio of metal elements of such a sputtering target, In:Ga:Zn=1:3:2, In:Ga:Zn=1:3:3, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:4:3, In:Ga:Zn=1:4:4, In:Ga:Zn=1:4:5, In:Ga:Zn=1:4:6, In:Ga:Zn=1:4:7, In:Ga:Zn=1:4:8, In:Ga:Zn=1:4:9, In:Ga:Zn=1:4:10, In:Ga:Zn=1:5:3, In:Ga:Zn=1:5:4, In:Ga:Zn=1:5:5, In:Ga:Zn=1:5:6, In:Ga:Zn=1:5:7, In:Ga:Zn=1:5:8, In:Ga:Zn=1:5:9, In:Ga:Zn=1:5:10, In:Ga:Zn=1:6:4, In:Ga:Zn=1:6:5, In:Ga:Zn=1:6:6, In:Ga:Zn=1:6:7, In:Ga:Zn=1:6:8, In:Ga:Zn=1:6:9, and In:Ga:Zn=1:6:10 are preferable. When the atomic ratio of metal elements of a sputtering target used for formation of the In-M-Zn oxide film is M>In and Zn M, the CAAC oxide film can be formed. Note that the proportion of each metal element in the atomic ratio of the oxide film 19 formed using the above-described sputtering target varies within a range of ±40% of the above atomic ratio of metal elements of a sputtering target as an error.

Further, the oxide film 19 is formed using the CAAC oxide film.

The CAAC oxide film is one of oxide semiconductor films having a plurality of crystal parts. The crystal parts included in the CAAC oxide film each have c-axis alignment. In a plan transmission electron microscope (TEM) image, the area of the crystal parts included in the CAAC oxide film is greater than or equal to 2500 nm$^2$, greater than or equal to 5 μm$^2$, or greater than or equal to 1000 μm$^2$. Further, in a cross-sectional TEM image, when the proportion of the crystal parts is greater than or equal to 50%, greater than or equal to 80%, or greater than or equal to 95% of the CAAC oxide film, the CAAC oxide film is a thin film having physical properties similar to those of a single crystal.

In a TEM image of the CAAC oxide film, a boundary between crystal parts, that is, a grain boundary is not clearly observed. Thus, in the CAAC oxide film, a reduction in electron mobility due to the grain boundary is less likely to occur.

According to the TEM image of the CAAC oxide film observed in a direction substantially parallel to a sample surface (cross-sectional TEM image), metal atoms are arranged in a layered manner in the crystal parts. Each metal atom layer has a morphology reflected by a surface over which the CAAC oxide film is formed (hereinafter, a surface over which the CAAC oxide film is formed is referred to as a formation surface) or a top surface of the CAAC oxide film, and is arranged in parallel to the formation surface or the top surface of the CAAC oxide film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC oxide film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC oxide film, spots (luminescent spots) having alignment are shown.

From the results of the cross-sectional TEM image and the plan TEM image, alignment is found in the crystal parts in the CAAC oxide film.

A CAAC oxide film is subjected to structural analysis with an X-ray diffraction (XRD) apparatus. When the CAAC oxide film is analyzed by an out-of-plane method, a peak appears frequently when the diffraction angle (2θ) is around 31°. This peak is derived from the (00x) plane (x is an integer) of the InGaZn oxide crystal, which indicates that crystals in the CAAC oxide film have c-axis alignment, and that the c-axes are aligned in a direction substantially perpendicular to the formation surface or the top surface of the CAAC oxide film.

On the other hand, when the CAAC oxide film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (0 axis) with 2θ fixed at around 56°. In the case where the sample is a single-crystal metal oxide semiconductor film of InGaZn oxide, six peaks appear. The six peaks are derived from crystal planes equivalent to the (110) plane. On the other hand, in the case of a CAAC oxide film, a peak is not clearly observed even when 0 scan is performed with 2θ fixed at around 56°.

According to the above results, in the CAAC oxide film, which has c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC oxide film or is formed through crystallization treatment such as heat treatment. As described above, the c-axis of the crystal part is aligned in a direction parallel to a normal vector of a formation surface or a normal vector of a top surface of the CAAC oxide film. Thus, for example, in the case where a shape of the CAAC oxide film is changed by etching or the like, the c-axis of the crystal part might not be necessarily parallel to a normal vector of a formation surface or a normal vector of a top surface of the CAAC oxide film.

Further, the degree of crystallinity in the CAAC oxide film is not necessarily uniform. For example, in the case where crystal growth leading to the CAAC oxide film occurs from the vicinity of the top surface of the film, the degree of the crystallinity in the vicinity of the top surface is higher than that in the vicinity of the formation surface in some cases. Further, when an impurity is added to the CAAC oxide film, the crystallinity in a region to which the impurity is added is changed, and the degree of crystallinity in the CAAC oxide film varies depending on regions.

Note that when the CAAC oxide film is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC oxide film. It is preferable that in the CAAC oxide film, a peak of 2θ appear at around 31° and a peak of 2θ do not appear at around 36°.

The oxide film 19 is formed using the CAAC oxide film, which has c-axis alignment, and in which a grain boundary is not found and the c-axes are aligned in a direction parallel to a normal vector of a formation surface or a normal vector of a top surface, thereby functioning as a film preventing transfer of the metal element included in the pair of electrodes 21 and 22, for example, copper, aluminum, gold, silver, or molybdenum. Thus, the metal element included in the pair of electrodes 21 and 22 is not easily transferred to the oxide semiconductor film 18. As a result, the impurities in the oxide semiconductor film 18 of the multilayer film 20 can be reduced. Further, a transistor of which electrical characteristics are improved can be manufactured.

When the oxide film 19 contains a larger amount of Ga, Y, Zr, La, Ce, or Nd in an atomic ratio than the amount of In in an atomic ratio, any of the following effects may be obtained: (1) the energy gap of the oxide film 19 is widened; (2) the electron affinity of the oxide film 19 is decreased; (3) diffusion of external impurities is reduced; and (4) an insulating property of the oxide film 19 is increased as compared to the oxide semiconductor film 18. Further, oxygen vacancies are less likely to be generated in the oxide film 19 containing a larger amount of Ga, Y, Zr, La, Ce, or Nd in an atomic ratio than the amount of In in an atomic ratio because Ga, Y, Zr, La, Ce, or Nd is a metal element which is strongly bonded to oxygen.

In the case where the oxide film 19 is an In-M-Zn oxide film, the proportions of In and M when summation of In and M is assumed to be 100 atomic % are as follows: the atomic percentage of In is less than 50 atomic % and the atomic percentage of M is greater than or equal to 50 atomic %; or the atomic percentage of In is less than 25 atomic % and the atomic percentage of M is greater than or equal to 75 atomic %.

In the case where each of the oxide semiconductor film 18 and the oxide film 19 is an In-M-Zn oxide film (M is Ga, Y, Zr, La, Ce, or Nd), the proportion of M atoms (M is Ga, Y, Zr, La, Ce, or Nd) in the oxide film 19 is higher than that in the oxide semiconductor film 18. Typically, the proportion of M in each of the films is 1.5 or more times, twice or more, or three or more times as high as that in the oxide semiconductor film 18.

In the case where each of the oxide semiconductor film 18 and the oxide film 19 is an In-M-Zn oxide film (M is Ga, Y, Zr, La, Ce, or Nd), when In:M:Zn=$x_1$:$y_1$:$z_1$ [atomic ratio] is satisfied in the oxide film 19 and In:M:Zn=$x_2$:$y_2$:$z_2$ [atomic ratio] is satisfied in the oxide semiconductor film 18, $y_1/x_1$ is higher than $y_2/x_2$. For example, $y_1/x_1$ is 1.5 or more times as high as $y_2/x_2$. Alternatively, $y_1/x_1$ is twice or more as high as $y_2/x_2$, or $y_1/x_1$ is three or more times as high as $y_2/x_2$. In this case, it is preferable that in the oxide semiconductor film, $y_2$ be higher than or equal to $x_2$ because a transistor including the oxide semiconductor film can have stable electric characteristics.

An oxide semiconductor film and an oxide film with low carrier density are used as the oxide semiconductor film 18 and the oxide film 19. For example, an oxide semiconductor film and an oxide film each having carrier density of $1\times10^{17}/cm^3$ or lower, $1\times10^{15}/cm^3$ or lower, $1\times10^{13}/cm^3$ or lower, or $1\times10^{11}/cm^3$ or lower are used as the oxide semiconductor film 18 and the oxide film 19.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 18 be set to be appropriate.

The oxide film 19 also serves as a film which relieves damage to the oxide semiconductor film 18 at the time of forming the oxide insulating film 24 later.

The thickness of the oxide film 19 is greater than or equal to 3 nm and less than or equal to 100 nm, or greater than or equal to 3 nm and less than or equal to 50 nm.

In the transistor 60 described in this embodiment, the oxide film 19 is formed using the CAAC oxide film. Thus, the oxide film 19 can reduce diffusion of external impurities, and can reduce the amount of impurities which are transferred from the pair of electrodes 21 and 22 to the oxide semiconductor film 18. Thus, even when the pair of electrodes 21 and 22 is formed using copper, aluminum, gold, silver, or molybdenum, or even when a film of the pair of electrodes 21 and 22 that is in contact with the oxide film 19 is formed using a low-resistance material, such as copper, aluminum, gold, silver, or molybdenum, copper, aluminum, gold, silver, or molybdenum in the pair of electrodes 21 and 22 is not easily transferred to the oxide semiconductor film 18 through the oxide film 19. As a result, variation in the threshold voltage of the transistor can be reduced.

The oxide film 19 is provided between the oxide semiconductor film 18 and the oxide insulating film 23. Hence, if trap states are formed between the oxide film 19 and the oxide insulating film 23 owing to impurities and defects, electrons flowing in the oxide semiconductor film 18 are less likely to be captured by the trap states because there is a distance between the trap states and the oxide semiconductor film 18. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, an oxygen vacancy is less likely to be formed in the oxide film 19.

Consequently, the impurity concentration and the amount of oxygen vacancies in the oxide semiconductor film 18 can be reduced.

Further, in the transistor 60 described in this embodiment, the pair of electrodes 21 and 22 is formed in contact with the multilayer film 20.

The pair of electrodes 21 and 22 is formed using a single-layer structure or a stacked-layer structure of a single metal that is a low-resistance material, such as copper, aluminum, gold, silver, or molybdenum or a compound or an alloy including any of these metals as its main component. For example, a single-layer structure of an aluminum film containing silicon, a single-layer structure of a copper film, a single-layer structure of a gold film, a two-layer structure in which a titanium film is stacked over an aluminum film, a two-layer structure in which a copper film, a silver film, or a gold film is stacked over a copper-magnesium-aluminum alloy film, and the like can be given. In the pair of electrodes 21 and 22 with a stacked-layer structure, a film in contact with the oxide film 19 is formed using a low-resistance material, such as copper, aluminum, gold, silver, or molybdenum.

Since the pair of electrodes 21 and 22 is formed using a low-resistance material, such as copper, aluminum, gold, silver, or molybdenum, a semiconductor device in which wiring delay is suppressed can be manufactured using a large-sized substrate. Furthermore, a semiconductor device with reduced power consumption can be manufactured.

The oxide insulating film 23 is an oxide insulating film which is permeable to oxygen. The oxide insulating film 23 also serves as a film which relieves damage to the multi-layer film 20 at the time of forming the oxide insulating film 24 which is formed later.

As the oxide insulating film 23, a silicon oxide film, a silicon oxynitride film, or the like having a thickness greater than or equal to 5 nm and less than or equal to 150 nm, or greater than or equal to 5 nm and less than or equal to 50 nm, can be used. Note that in this specification, a "silicon oxynitride film" refers to a film that includes more oxygen than nitrogen, and a "silicon nitride oxide film" refers to a film that includes more nitrogen than oxygen.

Further, it is preferable that the number of defects in the oxide insulating film 23 be small, and typically the spin density of a signal due to a dangling bond of silicon, which appears when g is 2.001, be lower than or equal to $3\times10^{17}$ spins/cm$^3$ by ESR measurement. This is because if the density of defects in the oxide insulating film 23 is high, oxygen is bonded to the defects and the amount of oxygen that permeates the oxide insulating film 23 is decreased.

Further, it is preferable that the number of defects at the interface between the oxide insulating film 23 and the multi-layer film 20 be small, and typically the spin density of a signal due to an oxygen vacancy in the multi-layer film 20, which appears when g is 1.93, be lower than or equal to $1\times10^{17}$ spins/cm$^3$, more preferably lower than or equal to the lower limit of detection by ESR measurement.

Note that all oxygen atoms entering the oxide insulating film 23 from the outside are not transferred to the outside of the oxide insulating film 23 and some oxygen remains in the oxide insulating film 23 in some cases. Further, oxygen enters the oxide insulating film 23 and oxygen contained in the oxide insulating film 23 is transferred to the outside of the oxide insulating film 23, whereby transfer of oxygen in the oxide insulating film 23 occurs in some cases.

An oxide insulating film which is permeable to oxygen is formed as the oxide insulating film 23, so that oxygen released from the oxide insulating film 24 formed over the oxide insulating film 23 can be transferred to the oxide semiconductor film 18 through the oxide insulating film 23.

Further, the oxide insulating film 24 is formed to be in contact with the oxide insulating film 23. The oxide insulating film 24 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film in which the amount of released oxygen converted into oxygen atoms is greater than or equal to $1.0\times10^{18}$ atoms/cm$^3$, or greater than or equal to $3.0\times10^{20}$ atoms/cm$^3$ in TDS analysis.

As the oxide insulating film 24, a silicon oxide film, a silicon oxynitride film, or the like having a thickness greater than or equal to 30 nm and less than or equal to 500 nm, or greater than or equal to 50 nm and less than or equal to 400 nm can be used.

Further, it is preferable that the number of defects in the oxide insulating film 24 be small, and typically the spin density of a signal due to a dangling bond of silicon, which appears when g is 2.001, be lower than or equal to $1.5\times10^{18}$ spins/cm$^3$, more preferably lower than or equal to $1\times10^{18}$ spins/cm$^3$ by ESR measurement. Since the distance between the multi-layer film 20 and the oxide insulating film 24 is greater than the distance between the multi-layer film 20 and the oxide insulating film 23, the oxide insulating film 24 may have a higher defect density than the oxide insulating film 23.

Further, it is possible to prevent outward diffusion of oxygen from the multilayer film 20 and entry of hydrogen, water, or the like into the multilayer film 20 from the outside by providing the nitride insulating film 25 having a blocking effect against oxygen, hydrogen, water, alkali metal, alkaline earth metal, and the like over the oxide insulating film 24. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

Next, a method for manufacturing the transistor 60 illustrated in FIGS. 1A to 1C is described with reference to FIGS. 2A to 2E.

Figure 2A:
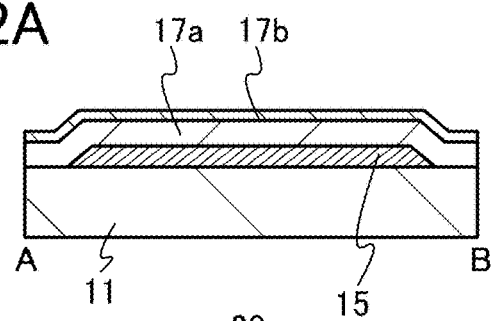
FIGS. 2A to 2E are cross-sectional views illustrating one embodiment of a method for manufacturing a transistor.

As illustrated in FIG. 2A, the gate electrode 15 is formed over the substrate 11, and the nitride insulating film 17a and an oxide insulating film 17b are formed over the gate electrode 15.

Here, a glass substrate is used as the substrate 11.

A method for forming the gate electrode 15 is described below. First, a conductive film is formed by a sputtering method, a CVD method, an evaporation method, or the like. Then, a mask is formed over the conductive film by a photolithography process. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 100-nm-thick tungsten film is formed by a sputtering method. Next, a mask is formed by a photolithography process, and the tungsten film is subjected to dry etching with the use of the mask to form the gate electrode 15.

The nitride insulating film 17a and the oxide insulating film 17b are formed by a sputtering method, a CVD method, an evaporation method, or the like.

In the case of forming a silicon nitride film or a silicon nitride oxide film as the nitride insulating film 17a, a deposition gas containing silicon and a nitrogen gas and/or an ammonia gas are preferably used as a source gas. Typical examples of the deposition gas containing silicon include silane, disilane, trisilane, and silane fluoride.

In the case of forming a silicon oxide film or a silicon oxynitride film as the oxide insulating film 17b, a deposition gas containing silicon and an oxidizing gas are preferably used as a source gas. As the oxidizing gas, oxygen, ozone, dinitrogen monoxide, nitrogen dioxide, and the like are given.

Moreover, in the case of forming a gallium oxide film as the oxide insulating film 17b, a metal organic chemical vapor deposition (MOCVD) method can be employed.

Figure 2B:
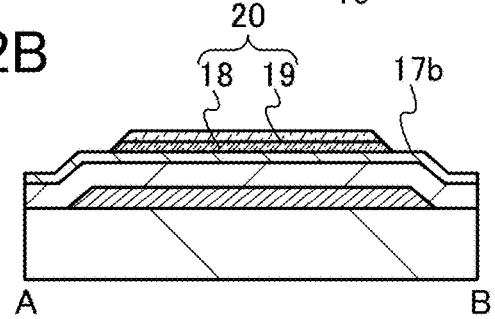

Next, as illustrated in FIG. 2B, the oxide semiconductor film 18 and the oxide film 19 are formed over the oxide insulating film 17b.

Methods for forming the oxide semiconductor film 18 and the oxide film 19 are described below. An oxide semiconductor film which is to be the oxide semiconductor film 18 and an oxide film which is to be the oxide film 19 are successively formed over the gate insulating film 17. Next, after a mask is formed over the oxide film by a photolithography process, the oxide semiconductor film and the oxide film are partly etched with the use of the mask; thus, as shown in FIG. 2B, the multilayer film 20 which includes the oxide semiconductor film 18 and the oxide film 19 that are subjected to element isolation is formed. After that, the mask is removed.

The oxide semiconductor film to be the oxide semiconductor film 18 and the oxide film to be the oxide film 19 can be formed by a sputtering method, a coating method, a pulsed laser deposition method, a laser ablation method, or the like.

In the case where the oxide semiconductor film and the oxide film are formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Further, a target may be appropriately selected in accordance with the composition of the oxide semiconductor film and the oxide film to be formed.

In the case where the oxide semiconductor film to be the oxide semiconductor film 18 and the oxide film to be the oxide film 19 are formed using a CAAC-OS film and a CAAC oxide film, respectively, a target including a polycrystalline metal oxide having c-axis alignment is preferably used. The target including a polycrystalline metal oxide having c-axis alignment has a cleavage plane where the crystal is cleaved along a plane parallel to a surface subjected to sputtering by sputtered particles. When the sputtered particle collides with the target, part of the target (flat-plate particles) is separated by being cut out along the cleavage plane and a portion where an interatomic bond is weak. The flat-plate particles are deposited on a deposition surface, so that the CAAC-OS film and the CAAC oxide film can be formed. Note that the flat-plate particle may have a hexagonal prism shape in which the cleavage plane is a flat plane parallel to an a-b plane or a triangular prism shape in which the cleavage plane is a flat plane parallel to an a-b plane.

In the case where the oxide semiconductor film to be the oxide semiconductor film 18 and the oxide film to be the oxide film 19 are In-M-Zn oxide films, the atomic ratio of metal elements of the sputtering target for each film preferably satisfies Zn By heating at a temperature higher than or equal to 200° C. and lower than or equal to 500° C., in ZnO, which is a hexagonal crystal, Zn atoms and O atoms are bound in a hexagonal shape on the a-b plane and c-axes are aligned. Thus, the ZnO is used as a seed crystal and the flat-plate particles are deposited so as to be aligned with the orientation of the ZnO, whereby a CAAC-OS film and a CAAC oxide film each having a crystal part whose area is greater than or equal to 2500 nm$^2$, greater than or equal to 5 μm$^2$, or greater than or equal to 1000 μm$^2$ in a plan TEM image can be formed.

Note that the oxide semiconductor film and the oxide film are not formed by simply stacking each film, but are formed to form a continuous junction (here, in particular, a structure in which the energy of the bottom of the conduction band is changed continuously between each film). In other words, a stacked-layer structure in which there exists no impurity which forms a defect level such as a trap center or a recombination center at each interface is provided. If an impurity exists between the oxide semiconductor film and the oxide film which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In order to obtain an intrinsic or substantially intrinsic oxide semiconductor film, besides the high vacuum evacuation of the chamber, a high purification of a sputtering gas is also needed. As an oxygen gas or an argon gas used for a sputtering gas, a gas which is highly purified to have a dew point of −40° C. or lower, −80° C. or lower, −100° C. or lower, or −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=1:1:1), and then a 20-nm-thick In—Ga—Zn oxide film is formed as the oxide film by a sputtering method using an In—Ga—Zn oxide target (In:Ga:Zn=1:3:4). Next, a mask is formed over the oxide film, and the oxide semiconductor film and the oxide film are partly and selectively etched to form the multilayer film 20 including the oxide semiconductor film 18 and the oxide film 19.

After that, first heat treatment is performed. By the first heat treatment, hydrogen, water, and the like are released from the oxide semiconductor film 18, so that the amount of hydrogen and water in the oxide semiconductor film 18 can be reduced. The heat treatment is performed typically at a temperature higher than or equal to 300° C. and lower than or equal to 400° C., or higher than or equal to 320° C. and lower than or equal to 370° C.

An electric furnace, an RTA apparatus, or the like can be used for the first heat treatment. With the use of an RTA apparatus, the heat treatment can be performed at a temperature higher than or equal to the strain point of the substrate if the heating time is short. Thus, the heat treatment time can be shortened.

The first heat treatment is preferably performed under an atmosphere of nitrogen, oxygen, ultra-dry air (air in which a water content is 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

Figure 2C:
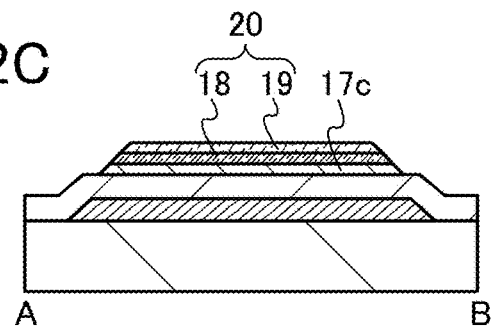

Next, as illustrated in FIG. 2C, the oxide insulating film 17b is partly etched to form the oxide insulating film 17c. Through the above steps, the gate insulating film 17 including the nitride insulating film 17a and the oxide insulating film 17c can be formed. The oxide insulating film 17b is etched using the multilayer film 20 as a mask, whereby the separated oxide insulating film 17c subjected to element isolation can be formed. Alternatively, after the multilayer film 20 is formed using a mask formed in a photolithography process, the oxide insulating film 17b is etched using the mask, whereby the separated oxide insulating film 17c subjected to element isolation is formed and heat treatment may be performed after that instead of after the formation of the multilayer film 20. As a result, the separated oxide insulating film 17c subjected to element isolation can be formed without an increase in the number of photomasks. Further, part of the nitride insulating film 17a can be exposed.

Figure 2D:
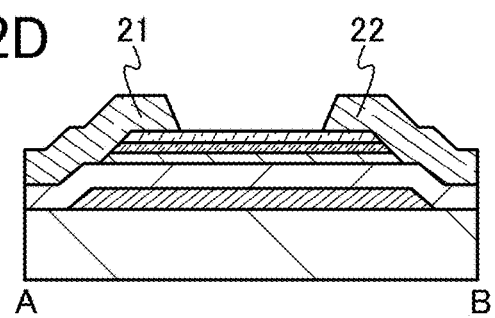

Next, as shown in FIG. 2D, the pair of electrodes 21 and 22 is formed.

A method for forming the pair of electrodes 21 and 22 is described below. First, a conductive film is formed by a sputtering method, a CVD method, an evaporation method, or the like. Then, a mask is formed over the conductive film by a photolithography process. Next, the conductive film is etched with the use of the mask to form the pair of electrodes 21 and 22. After that, the mask is removed.

Here, a 400-nm-thick copper film is formed by a sputtering method. Next, a mask is formed over the copper film by a photolithography process and the copper film is dry-etched with use of the mask to form the pair of electrodes 21 and 22.

In this embodiment, the pair of electrodes 21 and 22 is mainly in contact with the nitride insulating film 17a of the gate insulating film 17 and a contact area between the pair of electrodes 21 and 22 and the oxide insulating film 17c is extremely small. The nitride insulating film 17a has a function of preventing oxidization and diffusion of the metal element included in the pair of electrodes 21 and 22. Thus, since the pair of electrodes 21 and 22 is in contact with the nitride insulating film 17a of the gate insulating film 17, oxidization and diffusion of the metal element included in the pair of electrodes 21 and 22 can be prevented.

Figure 2E:
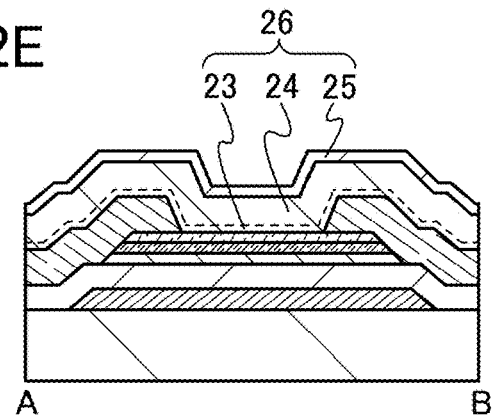

Next, as shown in FIG. 2E, the oxide insulating film 23 is formed over the multilayer film 20 and the pair of electrodes 21 and 22. Next, the oxide insulating film 24 is formed over the oxide insulating film 23.

Note that after the oxide insulating film 23 is formed, the oxide insulating film 24 is preferably formed in succession without exposure to the air. After the oxide insulating film 23 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 23 and the oxide insulating film 24 can be reduced and oxygen in the oxide insulating film 24 can be transferred to the oxide semiconductor film 18; accordingly, the amount of oxygen vacancies in the oxide semiconductor film 18 can be reduced.

As the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 180° C. and lower than or equal to 400° C., or higher than or equal to 200° C. and lower than or equal to 370° C., the pressure is greater than or equal to 20 Pa and less than or equal to 250 Pa, or greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 23. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which is permeable to oxygen can be formed as the oxide insulating film 23. Further, by providing the oxide film 19 and the oxide insulating film 23, damage to the oxide semiconductor film 18 can be reduced in a step of forming the oxide insulating film 24 which is formed later.

As for the oxide insulating film 23, a silicon oxide film or a silicon oxynitride film can be formed as the oxide insulating film 23 under the following conditions: the substrate placed in a treatment chamber of a plasma CVD apparatus that is vacuum-evacuated is held at a temperature higher than or equal to 300° C. and lower than or equal to 400° C., or higher than or equal to 320° C. and lower than or equal to 370° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, owing to the substrate temperature is higher than or equal to 300° C. and lower than or equal to 400° C., or higher than or equal to 320° C. and lower than or equal to 370° C., the bonding strength between silicon and oxygen becomes strong. Thus, as the oxide insulating film 23, a dense and hard oxide insulating film which is permeable to oxygen, typically, a silicon oxide film or a silicon oxynitride film of which etching using hydrofluoric acid of 0.5 wt % at 25° C. is performed at a rate lower than or equal to 10 nm/min, or lower than or equal to 8 nm/min can be formed.

In the process, the oxide insulating film 23 is formed while heating is performed; thus, hydrogen, water, or the like contained in the oxide semiconductor film 18 can be released in the step. Hydrogen contained in the oxide semiconductor film 18 is bonded to an oxygen radical formed in plasma to form water. Since the substrate is heated in the step of forming the oxide insulating film 23, water formed by bonding of oxygen and hydrogen is released from the oxide semiconductor film. That is, when the oxide insulating film 23 is formed by a plasma CVD method, the amount of water and hydrogen contained in the oxide semiconductor film can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 60 can be reduced and change in threshold voltage can be inhibited. Further, by setting the pressure in the treatment chamber to be greater than or equal to 100 Pa and less than or equal to 250 Pa, damage to the multilayer film 20 including the oxide semiconductor film 18 can be reduced when the oxide insulating film 23 is formed, so that the amount of oxygen vacancies contained in the oxide semiconductor film 18 can be reduced. In particular, when the film formation temperature of the oxide insulating film 23 or the oxide insulating film 24 which is formed later is set to be high, typically higher than 220° C., part of oxygen contained in the oxide semiconductor film 18 is released and oxygen vacancies are easily formed. Further, when the film formation conditions for reducing the amount of defects in the oxide insulating film 24 which is formed later are used to increase reliability of the transistor, the amount of released oxygen is easily reduced. Thus, it is difficult to reduce the number of oxygen vacancies in the oxide semiconductor film 18 in some cases. However, by setting the pressure in the treatment chamber to be greater than or equal to 100 Pa and less than or equal to 250 Pa to reduce damage to the oxide semiconductor film 18 at the time of forming the oxide insulating film 23, the number of oxygen vacancies in the oxide semiconductor film 18 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 23 can be reduced. Consequently, the amount of hydrogen entering the oxide semiconductor film 18 can be reduced; thus, the negative shift in the threshold voltage of the transistor can be inhibited.

Here, as the oxide insulating film 23, a 50-nm-thick silicon oxynitride film is formed by a plasma CVD method in which silane with a flow rate of 30 sccm and dinitrogen monoxide with a flow rate of 4000 sccm are used as source gases, the pressure in the treatment chamber is 200 Pa, the substrate temperature is 220° C., and a high-frequency power of 150 W is supplied to parallel plate electrodes with the use of a 27.12 MHz high-frequency power source. Under the above conditions, a silicon oxynitride film which is permeable to oxygen can be formed. Note that a method for forming the oxide insulating film 23 is not limited to the method using the 27.12 MHz high-frequency power source described in this embodiment, and the oxide insulating film 23 may be formed using a 13.56 MHz high-frequency power source, for example.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition.

On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 23 is provided over the multilayer film 20. Accordingly, in the step of forming the oxide insulating film 24, the oxide insulating film 23 serves as a protective film of the multilayer film 20. Moreover, the oxide film 19 serves as a protective film of the oxide semiconductor film 18. Consequently, the oxide insulating film 24 can be formed using the high-frequency power having a high power density while damage to the oxide semiconductor film 18 is reduced.

Note that in the film formation conditions of the oxide insulating film 24, the flow rate of the deposition gas containing silicon relative to the oxidizing gas can be increased, whereby the amount of defects in the oxide insulating film 24 can be reduced. Typically, it is possible to form an oxide insulating film in which the amount of defects is small, i.e. the spin density of a signal which appears at g=2.001 originating from a dangling bond of silicon is lower than $6\times10^{17}$ spins/cm$^3$, lower than or equal to $3\times10^{17}$ spins/cm$^3$, or lower than or equal to $1.5\times10^{17}$ spins/cm$^3$ by ESR measurement. As a result, the reliability of the transistor can be improved.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$. Note that a method for forming the oxide insulating film 24 is not limited to the method using the 27.12 MHz high-frequency power source described in this embodiment, and the oxide insulating film 24 may be formed using a 13.56 MHz high-frequency power source, for example.

Next, second heat treatment is performed. The heat treatment is performed typically at a temperature higher than or equal to 150° C. and lower than or equal to 300° C., or higher than or equal to 200° C. and lower than or equal to 250° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be transferred to the oxide semiconductor film 18, so that the amount of oxygen vacancies contained in the oxide semiconductor film 18 can be reduced.

Further, in the case where water, hydrogen, or the like is contained in the oxide insulating film 23 and the oxide insulating film 24, when the nitride insulating film 25 having a function of blocking water, hydrogen, and the like is formed later and heat treatment is performed, water, hydrogen, or the like contained in the oxide insulating film 23 and the oxide insulating film 24 are transferred to the oxide semiconductor film 18, so that defects are generated in the oxide semiconductor film 18. However, by the heating, water, hydrogen, or the like contained in the oxide insulating film 23 and the oxide insulating film 24 can be released; thus, variation in electrical characteristics of the transistor 60 can be reduced, and change in threshold voltage can be inhibited.

Note that when the oxide insulating film 24 is formed over the oxide insulating film 23 while being heated, oxygen can be transferred to the oxide semiconductor film 18 to reduce the number of oxygen vacancies in the oxide semiconductor film 18; thus, the heat treatment is not necessarily performed.

Further, when the heat treatment is performed at a temperature higher than or equal to 150° C. and lower than or equal to 300° C., or higher than or equal to 200° C. and lower than or equal to 250° C., diffusion of copper, aluminum, gold, silver, molybdenum, or the like and entry of the element into the oxide semiconductor film can be inhibited.

Here, heat treatment is performed at 220° C. for one hour in an atmosphere of nitrogen and oxygen.

Further, when the pair of electrodes 21 and 22 is formed, the multilayer film 20 is damaged by the etching of the conductive film, so that oxygen vacancies are generated on the back channel side (the side of the multilayer film 20 which is opposite to the side facing to the gate electrode 15) of the multilayer film 20. However, with the use of the oxide insulating film containing oxygen at a higher proportion than the stoichiometric composition as the oxide insulating film 24, the oxygen vacancies generated on the back channel side can be repaired by heat treatment. By this, defects contained in the multilayer film 20 can be reduced, and thus, the reliability of the transistor 60 can be improved.

Next, the nitride insulating film 25 is formed by a sputtering method, a CVD method, or the like.

Note that in the case where the nitride insulating film 25 is formed by a plasma CVD method, the substrate placed in the treatment chamber of the plasma CVD apparatus that is vacuum-evacuated is preferably set to be higher than or equal to 300° C. and lower than or equal to 400° C., or higher than or equal to 320° C. and lower than or equal to 370° C., so that a dense nitride insulating film can be formed.

In the case where a silicon nitride film is formed by the plasma CVD method as the nitride insulating film 25, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, or greater than or equal to 10 and less than or equal to 50.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7\times10^{-1}$ W/cm$^2$.

By the above-described steps, the protective film 26 including the oxide insulating film 23, the oxide insulating film 24, and the nitride insulating film 25 can be formed.

Next, heat treatment may be performed. The heat treatment is performed typically at a temperature higher than or equal to 150° C. and lower than or equal to 300° C., or higher than or equal to 200° C. and lower than or equal to 250° C.

Through the above-described process, the transistor 60 can be manufactured.

In this embodiment, the oxide film formed using the CAAC oxide film is provided between the oxide semiconductor film and the pair of electrodes. The oxide film can reduce diffusion of external impurities to the oxide semiconductor film, and can reduce the amount of impurities diffused from the pair of electrodes to the oxide semiconductor film. Thus, even if the pair of electrodes is formed using copper, aluminum, gold, silver, or molybdenum, variation in the threshold voltage of the transistor can be reduced.

Further, in this embodiment, the first heat treatment and the second heat treatment are performed in the manufacturing process of the transistor. By forming the multilayer film including the oxide semiconductor film, the concentration of impurities in the oxide semiconductor film can be reduced, and a carrier trap in defect states can be prevented. As a result, even when each heat treatment is performed at 400° C. or lower, it is possible to manufacture a transistor of which the amount of variation in threshold voltage is equivalent to that of a transistor subjected to heat treatment at a high temperature. Consequently, the manufacturing cost of a semiconductor device can be reduced.

Further, the oxide insulating film containing oxygen at a higher proportion than the stoichiometric composition is formed to overlap with the oxide semiconductor film which serves as a channel region, and thus, oxygen in the oxide insulating film can be transferred to the oxide semiconductor film. Consequently, the amount of oxygen vacancies in the oxide semiconductor film can be reduced.

In particular, the oxide insulating film which is permeable to oxygen is formed between the oxide semiconductor film serving as a channel region and the oxide insulating film which contains oxygen at a higher proportion than the stoichiometric composition. Thus, damage to the oxide semiconductor film at the time of forming the oxide insulating film which contains oxygen at a higher proportion than the stoichiometric composition can be suppressed. Consequently, the amount of oxygen vacancies in the oxide semiconductor film can be reduced.

When the oxide film is formed over the oxide semiconductor film, damage to the oxide semiconductor film at the time of forming the oxide insulating film which contains oxygen at a higher proportion than the stoichiometric composition can be further suppressed. In addition, by forming the oxide film, entry of the constituent elements of an insulating film formed over the oxide semiconductor film, e.g., the oxide insulating film, into the oxide semiconductor film can be suppressed.

From the above, as for a semiconductor device including an oxide semiconductor film, a semiconductor device in which the amount of defects is reduced can be obtained. Further, as for a semiconductor device including an oxide semiconductor film, a semiconductor device with improved electrical characteristics can be obtained.

<Diffusion Mechanism of Metal Element in Oxide Semiconductor Film>

Calculation results of a diffusion mechanism of a metal element in an oxide semiconductor film are shown below.

Here, calculation was performed on an In—Ga—Zn oxide film (hereinafter, referred to as IGZO (111)) formed as an oxide semiconductor film using a sputtering target with a composition of In:Ga:Zn=1:1:1 in atomic ratio. Assuming that Cu was positioned as a metal element between lattices of a crystal included in the IGZO (111), calculation on how easily Cu is diffused was performed.

Figure 4:
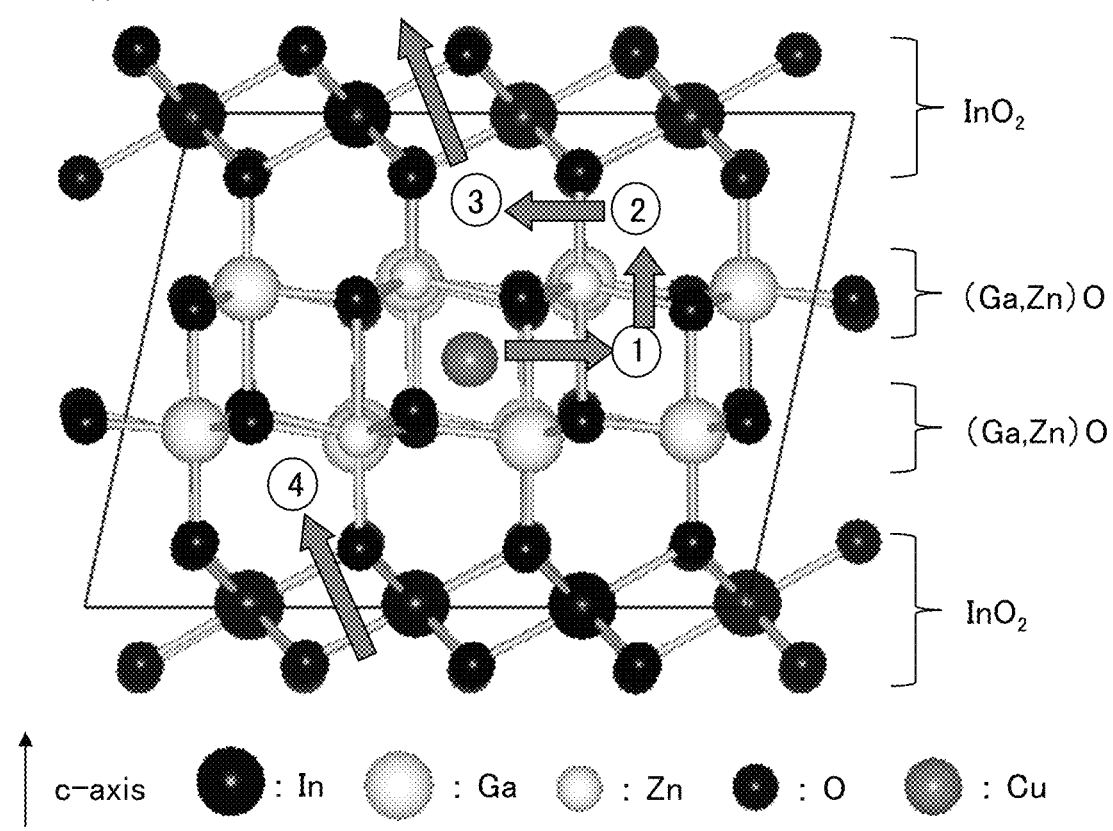
FIG. 4 shows a calculation model of IGZO (111)

A calculation model is shown in FIG. 4. There are four paths denoted by arrows in FIG. 4, which are diffusion paths of Cu. An activation barrier in each path was calculated by a nudged elastic band (NEB) method. In FIG. 4, each state is denoted by a number. The NEB method is a method of searching a state in which needed energy is the lowest in states from the initial state to the final state. Further, periodic boundary conditions were used for the calculation model. In the oxide semiconductor film, a direction parallel to a normal vector of a formation surface or a normal vector of a top surface is a c-axis direction, and the direction is referred to as a vertical direction. Further, a direction perpendicular to the c-axis direction, that is, an a-b plane direction is referred to as a lateral direction.

Path 1 represents lateral diffusion of Cu between a (Ga,Zn)O layer and a (Ga,Zn)O layer, that is, transfer from the initial state to State 1 in FIG. 4.

Path 2 represents vertical diffusion of Cu passing through the (Ga,Zn)O layer, that is, transfer from State 1 to State 2 in FIG. 4.

Path 3 represents lateral diffusion of Cu between the (Ga,Zn)O layer and an InO$_2$ layer, that is, transfer from State 2 to State 3 in FIG. 4.

Path 4 represents vertical diffusion of Cu passing through the InO$_2$ layer, that is, transfer from State 3 to State 4 in FIG. 4.

Next, the calculation conditions are shown in Table 1.

TABLE 1

| | |
|---|---|
| software | VASP (Vienna Ab-initio Simulation Package) |
| model | c-IGZO(111) crystal + Cu (113 atoms) |
| exchange-correlation potential | GGA/PBE |
| cut-off energy | 500 eV |
| K-point | 2 × 2 × 3 |

Figure 5A:
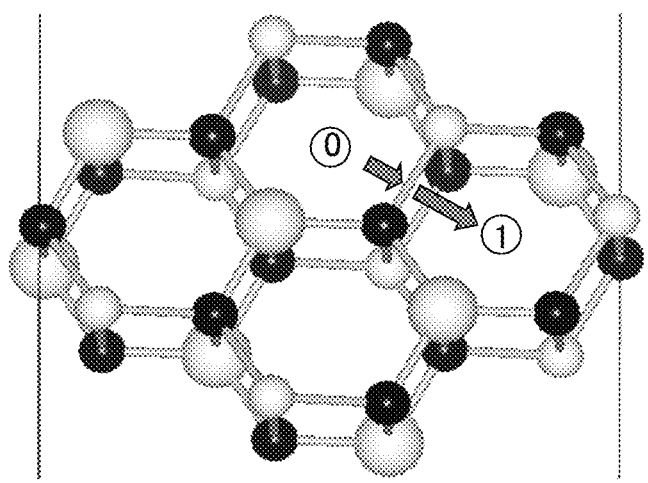
FIGS. 5A and 5B show a diffusion path and an activation barrier for Cu.
Figure 5B:
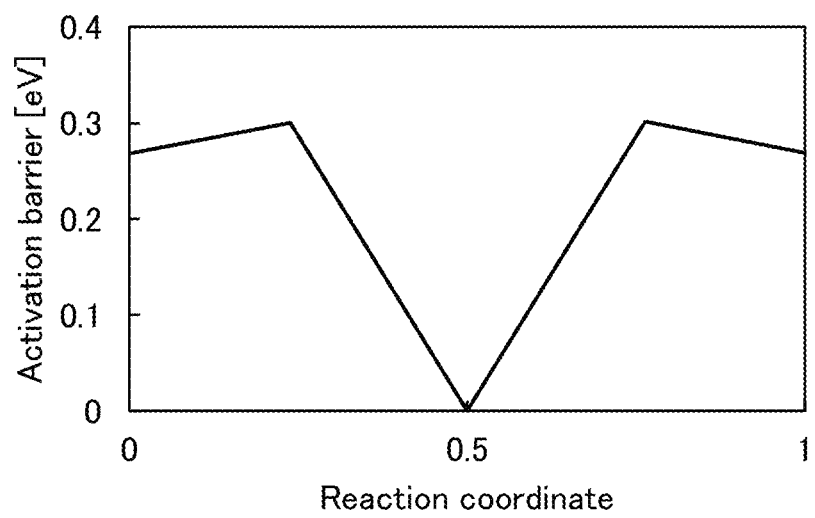

Path 1, that is, a path with a low barrier in lateral diffusion of Cu between the (Ga,Zn)O layer and the (Ga,Zn)O layer is illustrated in FIG. 5A and an activation barrier is shown in FIG. 5B. As shown in FIG. 5B, Cu in the course of diffusion is more stable in terms of energy than Cu between lattices. The activation barrier when Cu is transferred from a stable state to a position between lattices is approximately 0.30 eV; thus, the lateral diffusion of Cu between the (Ga,Zn)O layer and the (Ga,Zn)O layer presumably occurs even at room temperature.

Figure 6A:
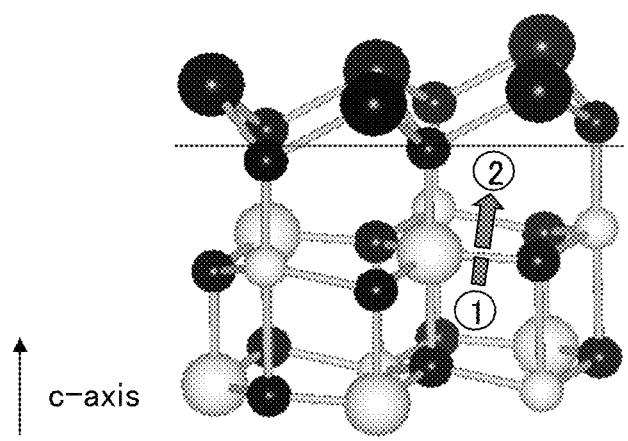
FIGS. 6A and 6B show a diffusion path and an activation barrier for Cu.
Figure 6B:
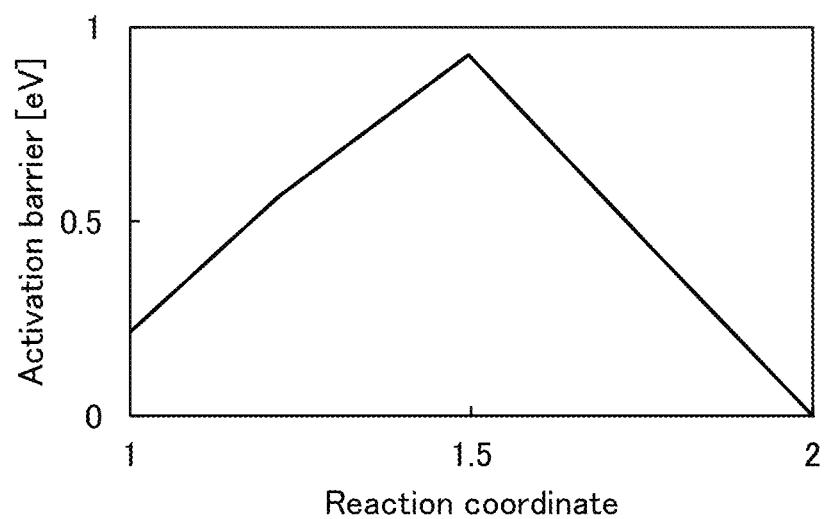

Path 2, that is, a path with a low barrier in vertical diffusion of Cu passing through the (Ga,Zn)O layer is illustrated in FIG. 6A and an activation barrier is shown in FIG. 6B. As shown in FIG. 6B, Cu is unstable when Cu is in the (Ga,Zn)O layer, and the activation barrier in such a state is approximately 0.71 eV. Thus, the vertical diffusion of Cu passing through the (Ga,Zn)O layer presumably hardly occurs at room temperature.

Figure 7A:
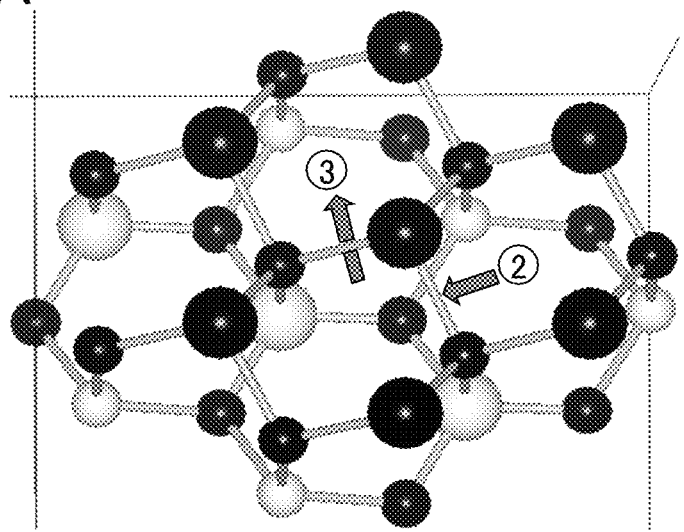
FIGS. 7A and 7B show a diffusion path and an activation barrier for Cu.
Figure 7B:
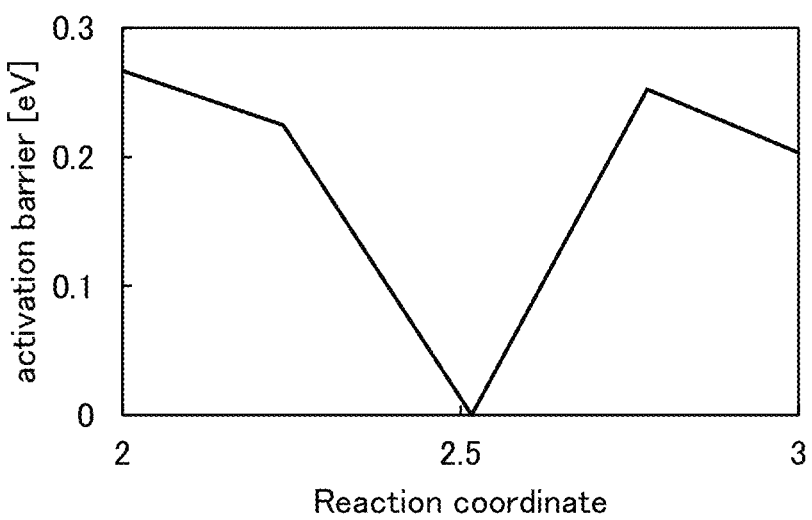

Path 3, that is, a path with a low barrier in lateral diffusion of Cu between the (Ga,Zn)O layer and the $InO_2$ layer is illustrated in FIG. 7A and an activation barrier is shown in FIG. 7B. As shown in FIG. 7B, Cu in the course of diffusion is more stable in terms of energy than Cu between lattices. The activation barrier when Cu is transferred from a stable state to a position between lattices is approximately 0.25 eV; thus, the lateral diffusion of Cu between the (Ga,Zn)O layer and the $InO_2$ layer presumably occurs even at room temperature.

Figure 8A:
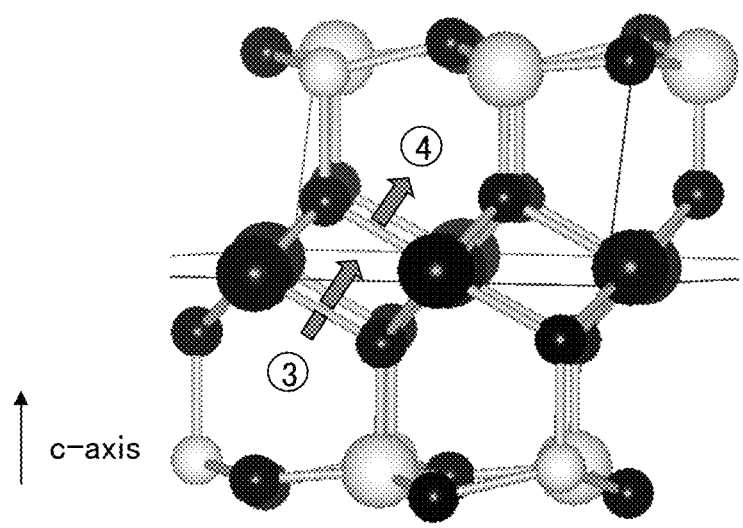
FIGS. 8A and 8B show a diffusion path and an activation barrier for Cu.
Figure 8B:
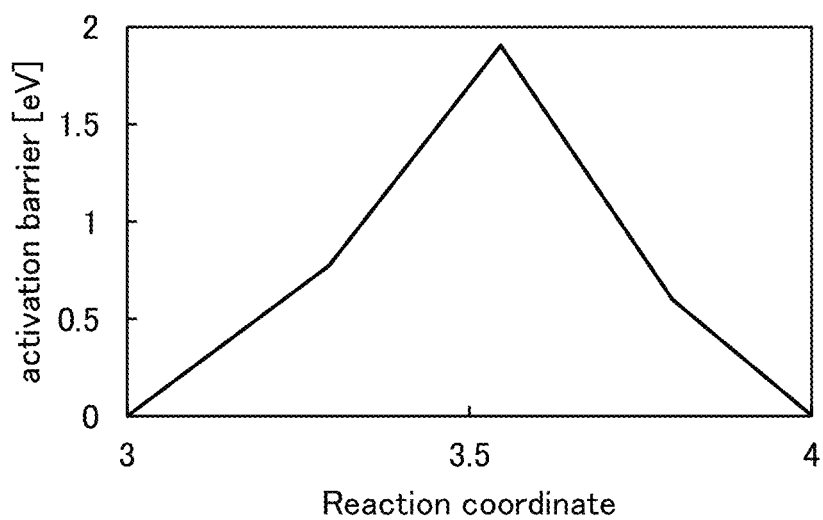

Path 4, that is, a path with a low barrier in vertical diffusion of Cu passing through the $InO_2$ layer is illustrated in FIG. 8A and an activation barrier is shown in FIG. 8B. As shown in FIG. 8B, Cu is unstable when in the $InO_2$ layer, and the activation barrier in such a state is approximately 1.90 eV. Thus, the vertical diffusion of Cu passing through the $InO_2$ layer presumably hardly occurs even at high temperature.

Figure 9:
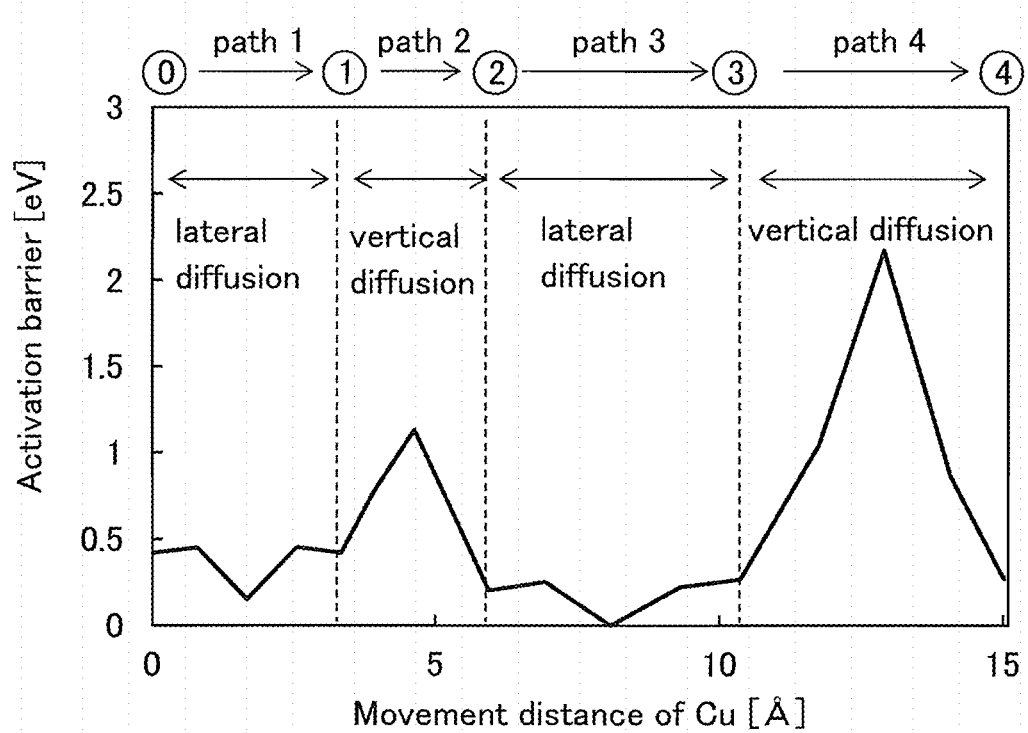
FIG. 9 shows an activation barrier for Cu.

The activation barriers in the arrows in FIG. 4, that is, the activation barriers in the initial state, Path 1, Path 2, Path 3, and Path 4 are shown in FIG. 9. In FIG. 9, the horizontal axis indicates the movement distance of Cu and the vertical axis indicates an activation barrier.

As shown in FIG. 9, Cu is stable in terms of energy when existing between the (Ga,Zn)O layer and the $InO_2$ layer, and the activation barrier in Path 4 in which Cu passes through the $InO_2$ layer is the highest. Thus, it is found that Cu is not easily diffused in a diffusion path in which Cu passes through an $InO_2$ layer.

Here, as a comparative example, ZnO with a hexagonal crystal structure was calculated in a manner similar to that of IGZO (111). The results are shown below.

Figure 10:
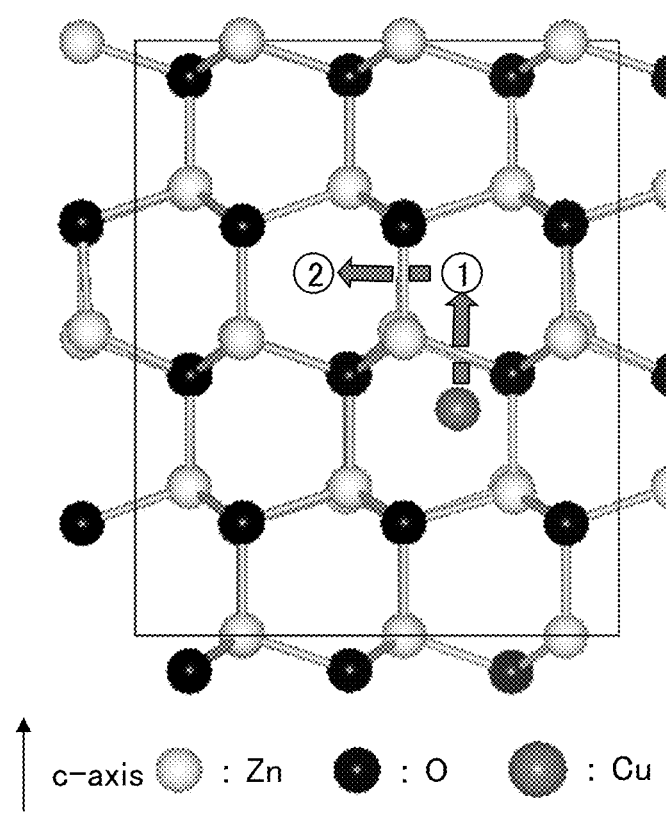
FIG. 10 shows a calculation model of ZnO.

A calculation model is shown in FIG. 10. Here, a 72-atom supercell in which a primitive lattice of ZnO crystal is doubled in all the axes directions is used. There are two paths indicated by the arrows in FIG. 10, which are diffusion paths of Cu. An activation barrier in each path was calculated by a NEB method.

Path 1 represents vertical diffusion of Cu in the c-axis direction, that is, transfer from the initial state to State 1 in FIG. 10.

Path 2 represents lateral diffusion of Cu in the b-axis direction, that is, transfer from State 1 to State 2 in FIG. 10.

Next, the calculation conditions are shown in Table 2.

TABLE 2

| | |
|---|---|
| software | VASP (Vienna Ab-initio Simulation Package) |
| model | ZnO crystal + Cu (73 atoms) |
| exchange-correlation potential | GGA/PBE |
| cut-off energy | 500 eV |
| K-point | 4 × 4 × 3 |

Figure 11A:
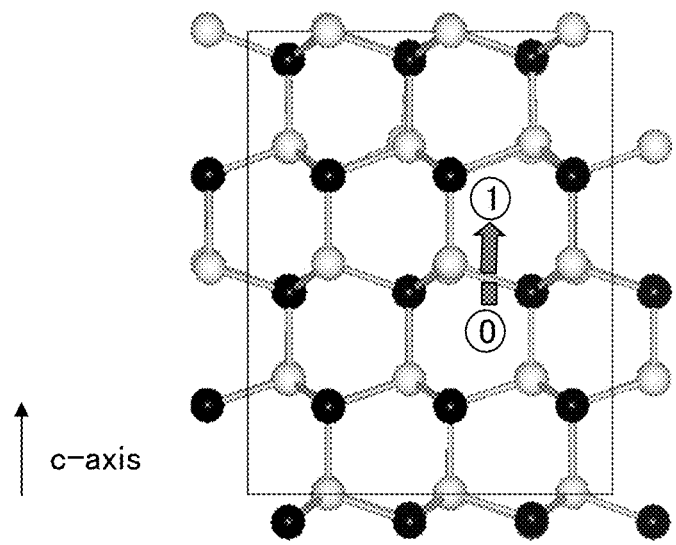
FIGS. 11A to 11C show a diffusion path and an activation barrier for Cu.
Figure 11B:
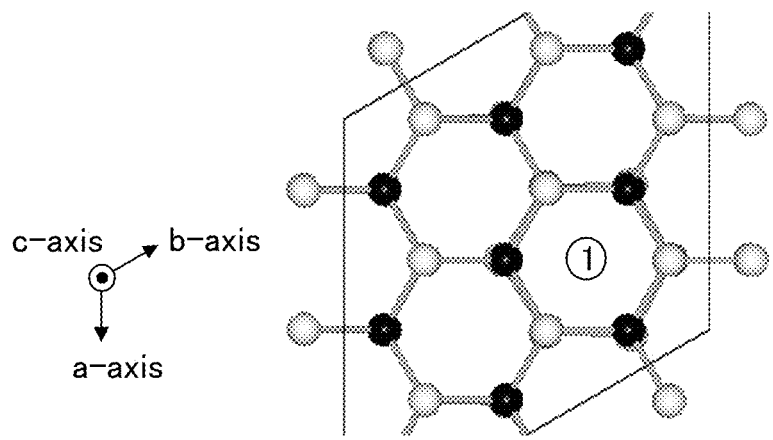
Figure 11C:
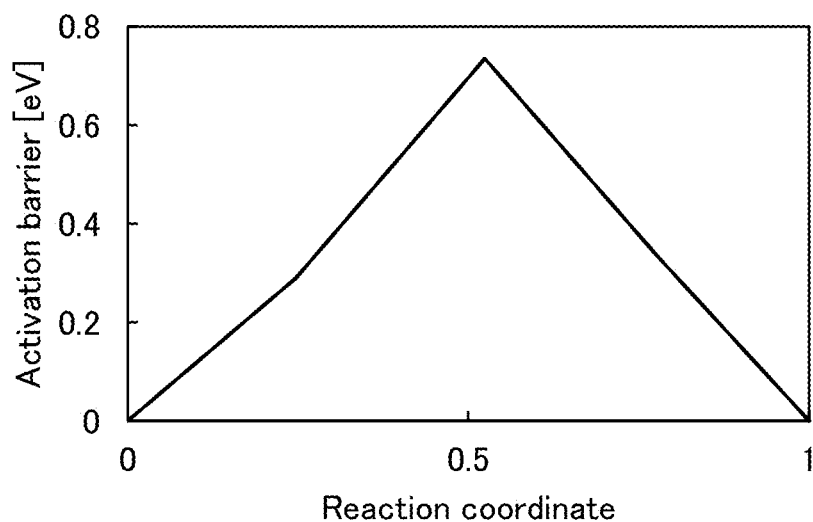

Path 1, that is, a diffusion path for Cu in vertical diffusion of Cu in the c-axis direction seen from the direction perpendicular to the c axis is illustrated in FIG. 11A, a diffusion path of Cu seen from the c-axis direction is illustrated in FIG. 11B, and an activation barrier is shown in FIG. 11C. As shown in FIG. 11C, Cu is unstable when in a plane surrounded by Zn atoms, and the activation barrier in such a case is approximately 0.73 eV. Thus, the vertical diffusion of Cu in the c-axis direction presumably hardly occurs at room temperature.

Figure 12A:
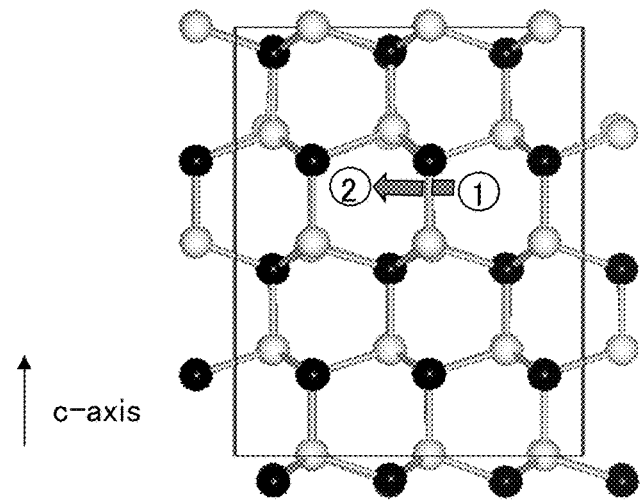
FIGS. 12A to 12C show a diffusion path and an activation barrier for Cu.
Figure 12B:
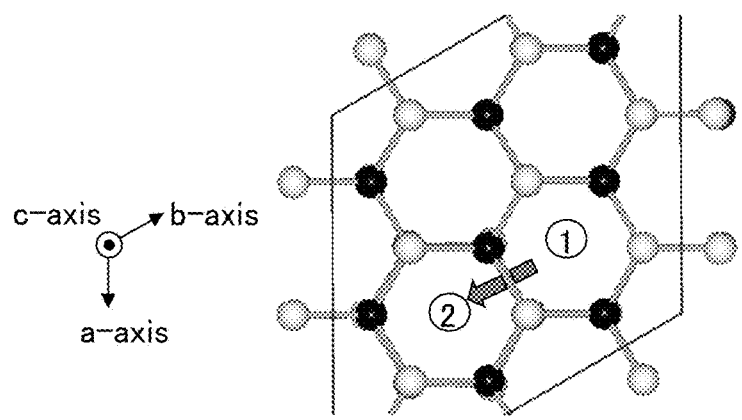
Figure 12C:
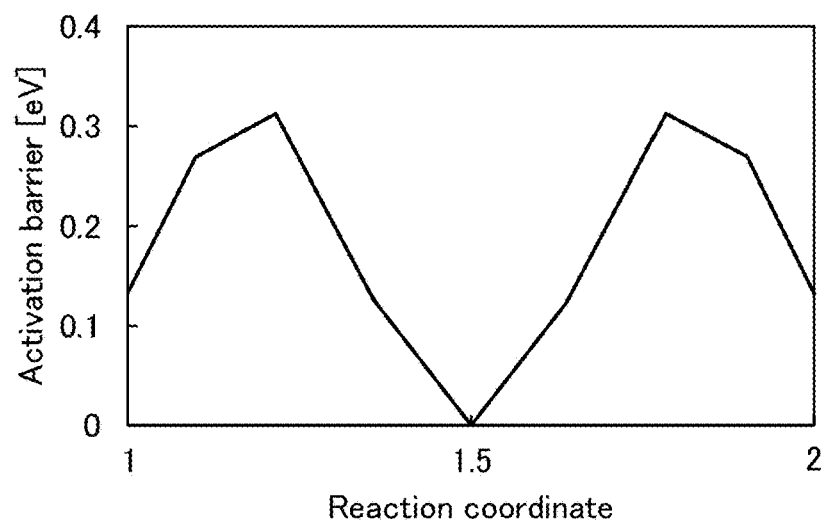

Path 2, that is, a diffusion path for Cu in lateral diffusion of Cu in the b-axis direction seen from the direction perpendicular to the c axis is illustrated in FIG. 12A, a diffusion path for Cu seen from the c-axis direction is illustrated in FIG. 12B, and an activation barrier is shown in FIG. 12C. As shown in FIG. 12C, Cu in the course of diffusion and at a position where a Cu atom is bonded to two O atoms is more stable in terms of energy than Cu between lattices. The activation barrier when Cu is transferred from a stable state to a position between lattices is approximately 0.32 eV; thus, the lateral diffusion of Cu in the b-axis direction presumably occurs even at room temperature.

Figure 13:
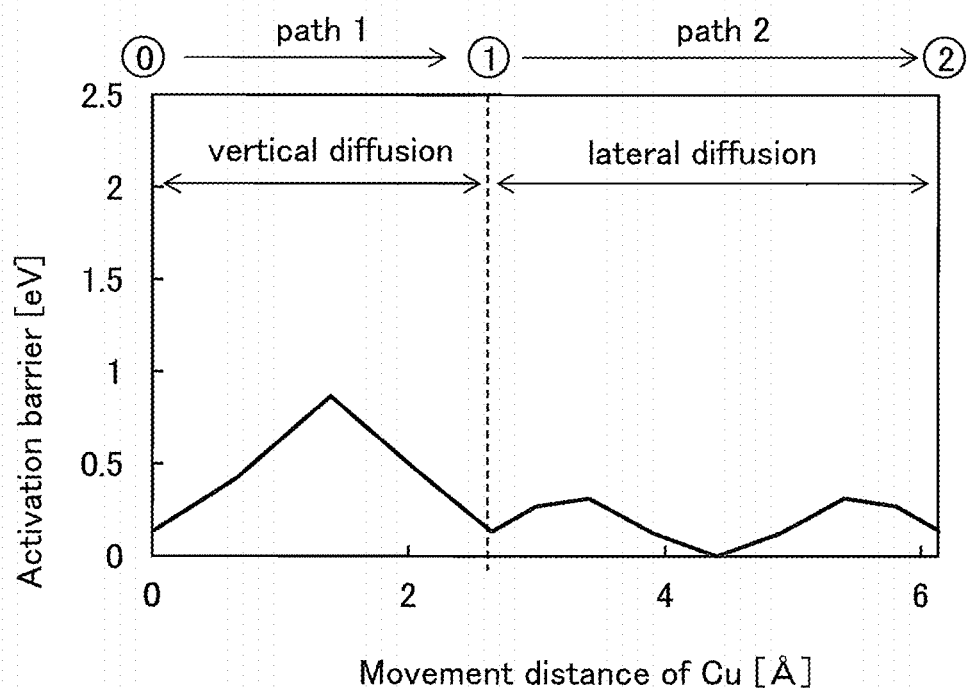
FIG. 13 shows an activation barrier for Cu.

The activation barriers in the arrows in FIG. 10, that is, the activation barriers in the initial state, Path 1, and Path 2 are shown in FIG. 13.

As shown in FIG. 13, Cu is stable in terms of energy in the course of lateral diffusion f Cu and at a position where a Cu atom is bonded to two O atoms, and the activation barrier in vertical diffusion in the c-axis direction is the highest.

As compared with the activation barrier in Path 4 in FIG. 9, that is, the activation barrier when Cu passes through the $InO_2$ layer (approximately 1.9 eV), the activation barrier in Path 1 in FIG. 13, that is, the activation barrier in the vertical diffusion of Cu in ZnO (approximately 0.7 eV) is low. Thus, it is probable that an effect of inhibiting Cu diffusion in the vertical direction in IGZO (111) is higher than that in ZnO.

Thus, when a CAAC oxide film, which has c-axis alignment and in which a grain boundary is not found and the c-axes are aligned in a direction parallel to a normal vector of a formation surface or a normal vector of a top surface, is provided between an oxide semiconductor film and a pair of electrodes and the pair of electrodes is formed using Cu, diffusion of Cu to the oxide semiconductor film can be reduced in a channel-etched transistor.

<Band Structure of Transistor>

Next, a band structure of the multilayer film 20 is described with reference to FIGS. 3A and 3B.

Here, for example, In—Ga—Zn oxide having an energy gap of 3.15 eV is used as the oxide semiconductor film 18, and In—Ga—Zn oxide having an energy gap of 3.5 eV is used as the oxide film 19. The energy gaps can be measured using a spectroscopic ellipsometer (UT-300 manufactured by HORIBA JOBIN YVON SAS.).

The energy difference between the vacuum level and the top of the valence band (also called ionization potential) of the oxide semiconductor film 18 and the energy difference between the vacuum level and the top of the valence band of the oxide film 19 were 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 18 and the energy gap therebetween of the oxide film 19 were 4.85 eV and 4.7 eV, respectively.

Figure 3A:
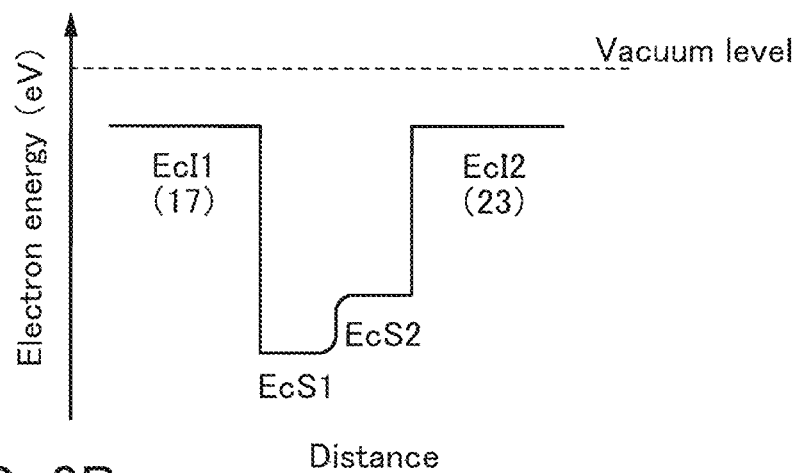
FIGS. 3A and 3B each show a band structure of a transistor.

FIG. 3A schematically illustrates a part of the band structure of the multilayer film 20. Here, the case where a silicon oxide film is provided in contact with the multilayer film 20 will be described. In FIG. 3A, EcI1 denotes the energy of the bottom of the conduction band in the silicon oxide film; EcS1 denotes the energy of the bottom of the conduction band in the oxide semiconductor film 18; EcS2 denotes the energy of the bottom of the conduction band in the oxide film 19; and EcI2 denotes the energy of the bottom of the conduction band in the silicon oxide film. Further, EcI1 and EcI2 correspond to the gate insulating film 17 and the oxide insulating film 23 in FIG. 1B, respectively.

As illustrated in FIG. 3A, there is no energy barrier between the oxide semiconductor film 18 and the oxide film 19, and the energy level of the bottom of the conduction band gradually changes therebetween. In other words, the energy level of the bottom of the conduction band is continuously changed. This is because the multilayer film 20 contains an element contained in the oxide semiconductor film 18 and oxygen is transferred between the oxide semiconductor film 18 and the oxide film 19, so that a mixed layer is formed.

As shown in FIG. 3A, the oxide semiconductor film 18 in the multilayer film 20 serves as a well and a channel region of the transistor including the multilayer film 20 is formed in the oxide semiconductor film 18. Note that since the energy of the bottom of the conduction band of the multilayer film 20 is continuously changed, it can be said that the oxide semiconductor film 18 and the oxide film 19 are continuous.

Although trap states due to defects or impurities such as silicon or carbon, which is a constituent element of the insulating film 23, and such as copper, aluminum, gold, silver, or molybdenum, which is a constituent element of the pair of electrodes 21 and 22, might be formed in the vicinity of the interface between the oxide film 19 and the oxide insulating film 23 as shown in FIG. 3A, the oxide semiconductor film 18 can be distanced from the trap states owing to existence of the oxide film 19. However, when the energy difference between EcS1 and EcS2 is small, an electron in the oxide semiconductor film 18 might reach the trap state by passing over the energy difference. By being trapped in the trap state, a negative fixed charge is generated at the interface with the insulating film, whereby the threshold voltage of the transistor is shifted in the positive direction. Therefore, it is preferable that the energy difference between EcS1 and EcS2 be 0.1 eV or more, or 0.15 eV or more, because a change in the threshold voltage of the transistor is reduced and stable electrical characteristics are obtained.

Figure 3B:
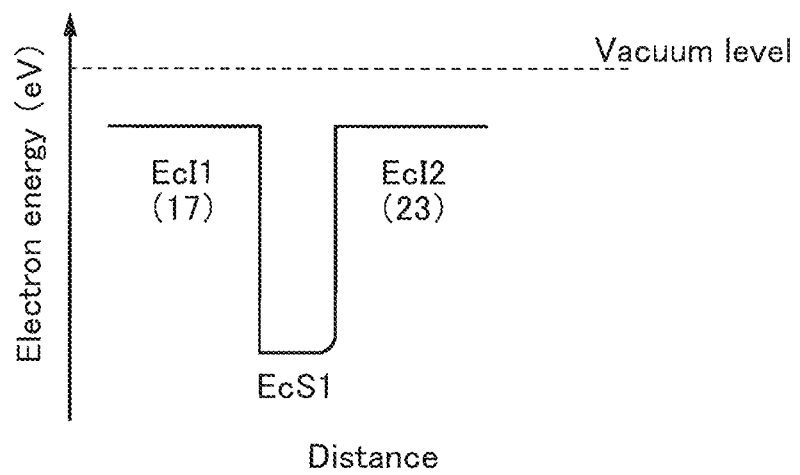

FIG. 3B schematically illustrates a part of the band structure of the multilayer film 20, which is a variation of the band structure shown in FIG. 3A. Here, a structure where silicon oxide films provided in contact with the multilayer film 20 is described. In FIG. 3B, EcI1 denotes the energy of the bottom of the conduction band in the silicon oxide film; EcS1 denotes the energy of the bottom of the conduction band in the oxide semiconductor film 18; and EcI2 denotes the energy of the bottom of the conduction band in the silicon oxide film. Further, EcI1 corresponds to the gate insulating film 17 in FIG. 1B, and EcI2 corresponds to the oxide insulating film 23 in FIG. 1B.

In the transistor illustrated in FIG. 1B, an upper portion of the multilayer film 20, that is, the oxide film 19 might be etched in formation of the pair of electrodes 21 and 22. Further, a mixed layer of the oxide semiconductor film 18 and the oxide film 19 is likely to be formed on the top surface of the oxide semiconductor film 18 in formation of the oxide film 19.

For example, when the oxide semiconductor film 18 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and an oxide film 19 is an oxide film formed with use of, as a sputtering target, In—Ga—Zn oxide whose atomic ratio of In to Ga and Zn is 1:3:2 or In—Ga—Zn oxide whose atomic ratio of In to Ga and Zn is 1:6:4, the Ga content in the oxide film 19 is higher than that in the oxide semiconductor film 18. Thus, a GaOx layer or a mixed layer whose Ga content is higher than that in the oxide semiconductor film 18 can be formed on the top surface of the oxide semiconductor film 18.

For that reason, even in the case where the oxide film 19 is etched, the energy of the bottom of the conduction band of EcS1 on the EcI2 side is increased and the band structure shown in FIG. 3B can be obtained in some cases.

As in the band structure shown in FIG. 3B, in observation of a cross section of a channel region, only the oxide semiconductor film 18 in the multilayer film 20 is apparently observed in some cases. However, a mixed layer that contains Ga more than the oxide semiconductor film 18 does is formed over the oxide semiconductor film 18 in fact, and thus the mixed layer can be regarded as a 1.5-th layer. Note that the mixed layer can be confirmed by analyzing a composition in the upper portion of the oxide semiconductor film 18, when the elements contained in the multilayer film 20 are measured by an EDX analysis, for example. The mixed layer can be confirmed, for example, in such a manner that the Ga content in the composition in the upper portion of the oxide semiconductor film 18 is larger than the Ga content in the oxide semiconductor film 18.

Modification Example 1

A modification example of the multilayer film 20 of the transistor 60 in this embodiment is described with reference to FIGS. 14A and 14B.

Figure 14A:
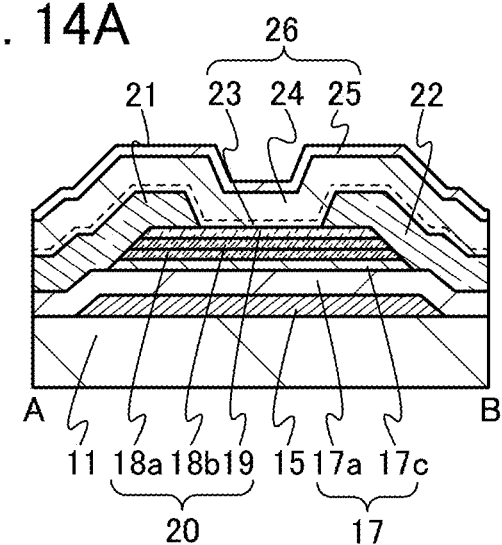
FIGS. 14A and 14B are cross-sectional views each illustrating one embodiment of a transistor.

In the multilayer film 20 of a transistor illustrated in FIG. 14A, a first oxide semiconductor film 18a, a second oxide semiconductor film 18b, and the oxide film 19 are stacked in this order from the gate insulating film 17 side.

The first oxide semiconductor film 18a and the second oxide semiconductor film 18b are each formed using a material similar to that of the above-described oxide semiconductor film 18. In the case where the first oxide semiconductor film 18a and the second oxide semiconductor film 18b are each formed using an In-M-Zn oxide (M is Ga, Y, Zr, La, Ce, or Nd), an atomic ratio of In to M in the first oxide semiconductor film 18a is preferably higher than that in the second oxide semiconductor film 18b. In an In-M-Zn oxide, when an atomic ratio of In to M is high, in other words, the proportion of In is high, carrier mobility (electron mobility) is high. Thus, when the proportion of In in the first oxide semiconductor film 18a in contact with the gate insulating film 17 is higher, the on-state current and the field-effect mobility of the transistor can be increased.

Further, when the first oxide semiconductor film 18a is formed using a CAAC-OS film, diffusion of external impurities can be reduced, and accordingly, the amount of impurities which are transferred from the outside to the first oxide semiconductor film 18a and the second oxide semiconductor film 18b can be reduced.

Figure 14B:
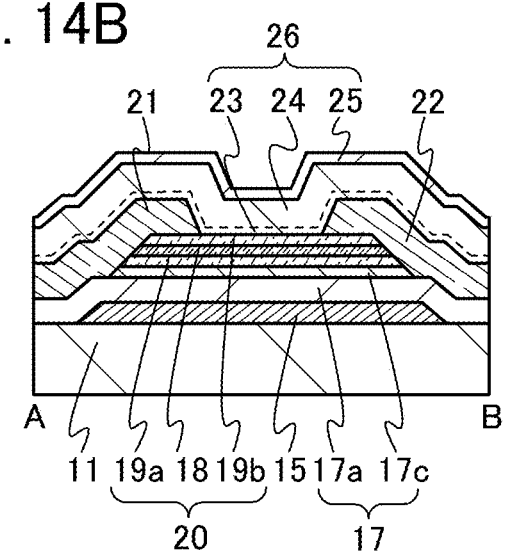

In the multilayer film 20 of a transistor illustrated in FIG. 14B, a first oxide film 19a, the oxide semiconductor film 18, and a second oxide film 19b are stacked in this order from the gate insulating film 17 side.

The first oxide film 19a and the second oxide film 19b are each formed using a material similar to that of the oxide film 19 in Embodiment 1. Note that the atomic ratios of metal elements included in the first oxide film 19a and the second oxide film 19b may be the same or different from each other.

It is preferable that the thickness of the first oxide film 19a be smaller than that of the oxide semiconductor film 18. When the thickness of the first oxide film 19a is greater than or equal to 1 nm and less than or equal to 5 nm, or greater than or equal to 1 nm and less than or equal to 3 nm, the amount of change in threshold voltage of the transistor can be reduced.

In the transistor in FIG. 14B, the first oxide film 19a is provided between the gate insulating film 17 and the oxide semiconductor film 18. Hence, if trap states are formed between the first oxide film 19a and the oxide semiconductor film 18 owing to impurities and defects, electrons flowing in the oxide semiconductor film 18 are less likely to be captured by the trap states because there is a distance between the trap states and the oxide semiconductor film 18. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, when the first oxide film 19a is formed using a CAAC oxide film, diffusion of external impurities can be reduced, and accordingly, the amount of impurities which are transferred from the outside to the oxide semiconductor film 18 can be reduced. Consequently, the impurity concentration in the oxide semiconductor film 18 can be reduced.

Modification Example 2

As for the pair of electrodes 21 and 22 provided in the transistor 60 described in this embodiment, it is preferable to use a conductive material which is easily bonded to oxygen, such as copper, aluminum, and molybdenum, or an alloy thereof. Thus, oxygen contained in the multilayer film 20 and the conductive material contained in the pair of electrodes 21 and 22 are bonded to each other, so that an oxygen deficient region is formed in the multilayer film 20. Further, in some cases, part of constituent elements of the conductive material that forms the pair of electrodes 21 and 22 is mixed into the multilayer film 20. Consequently, low-resistance regions are formed in the vicinity of regions of the multilayer film 20 which are in contact with the pair of electrodes 21 and 22. The low-resistance regions are formed between the gate insulating film 17 and the pair of electrodes 21 and 22 so as to be in contact with the pair of electrodes 21 and 22. Since the low-resistance regions have high conductivity, contact resistance between the multilayer film 20 and the pair of electrodes 21 and 22 can be reduced, and thus, the on-state current of the transistor can be increased.

Further, the pair of electrodes 21 and 22 may each have a stacked-layer structure of the conductive material which is easily bonded to oxygen and a conductive material which is not easily bonded to oxygen, such as titanium nitride, tantalum nitride, or ruthenium. For example, a conductive film may be formed to be in contact with the multilayer film 20 by using a conductive material which is not easily bonded to oxygen, and a conductive film may be formed over the conductive film by using a conductive material which is easily bonded to oxygen. With such a stacked-layer structure, oxidization of the pair of electrodes 21 and 22 can be prevented at the interface between the pair of electrodes 21 and 22 and the oxide insulating film 23, so that the increase of the resistance of the pair of electrodes 21 and 22 can be inhibited.

Modification Example 3

Figure 15:
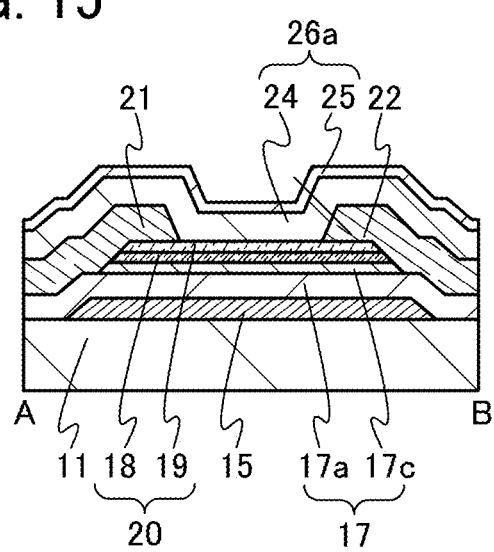
FIG. 15 is a cross-sectional view illustrating one embodiment of a transistor.

As illustrated in FIG. 15, over the transistor 60 in this embodiment, a protective film 26a in which the oxide insulating film 24 and the nitride insulating film 25 are stacked can be provided. In the transistor in FIG. 15, the oxide film 19 is provided over the oxide semiconductor film 18; thus, the oxide film 19 functions as a protective film at the time of formation of the oxide insulating film 24. As a result, when the oxide insulating film 24 is formed, the oxide semiconductor film 18 is not exposed to plasma, and plasma damage which is generated at the time of forming the oxide insulating film 24 by a plasma CVD method with relatively high power can be reduced.

Further, oxygen contained in the oxide insulating film 24 can be directly transferred to the multilayer film 20; thus, the amount of oxygen supplied to the oxide semiconductor film 18 can be increased. As a result, the number of oxygen vacancies in the oxide semiconductor film 18 can be further reduced.

Note that in this embodiment, the multilayer film is a stacked film of the oxide semiconductor film 18 and the oxide film 19; however, an oxide film can be further provided between the gate insulating film 17 and the oxide semiconductor film 18. By providing the oxide film between the gate insulating film 17 and the oxide semiconductor film 18, it is possible to reduce the concentration of silicon and carbon in the vicinity of the interface between the gate insulating film 17 and the multilayer film and the concentration of silicon and carbon in the oxide semiconductor film 18.

Modification Example 4

Figure 32A:
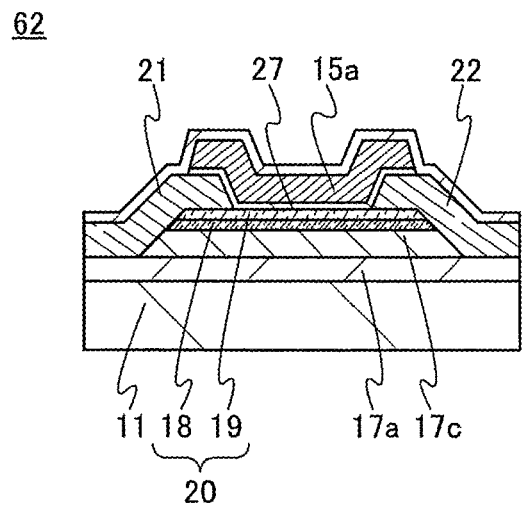
FIGS. 32A and 32B are cross-sectional views each illustrating one embodiment of a transistor.
Figure 32B:
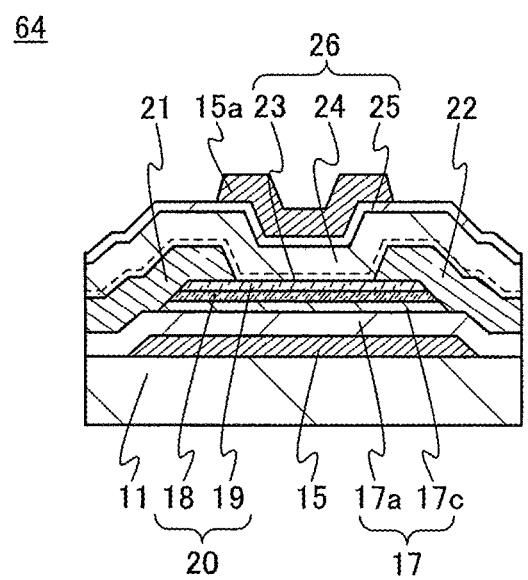

Although a bottom-gate transistor in which the gate electrode 15 is provided between the substrate 11 and the multilayer film 20 is described in this embodiment, as illustrated in FIG. 32A, a top-gate transistor can also be used. That is, a transistor 62, in which the pair of electrodes 21 and 22 is provided over the multilayer film 20, a gate insulating film 27 is provided over the pair of electrodes 21 and 22, and a gate electrode 15a is provided over the gate insulating film 27, can be formed. Note that the oxide insulating film 17c in contact with the multilayer film 20 and the nitride insulating film 17a in contact with the oxide insulating film 17c and the pair of electrodes 21 and 22 are provided between the substrate 11 and the multilayer film 20. Further, as illustrated in FIG. 32B, a dual-gate transistor 64 including the gate electrode 15, the gate insulating film 17 over the gate electrode 15, the multilayer film 20 over the gate insulating film 17, the pair of electrodes 21 and 22 over the multilayer film 20, the protective film 26 over the multilayer film 20 and the pair of electrodes 21 and 22, and the gate electrode 15a over the protective film 26 can be formed.

Embodiment 2

In this embodiment, a semiconductor device including a transistor in which diffusion of a metal element included in the pair of electrodes 21 and 22 can be prevented and a manufacturing method thereof are described with reference to FIGS. 2A to 2C, FIGS. 16A to 16C, and FIGS. 17A to 17D.

Figure 16A:
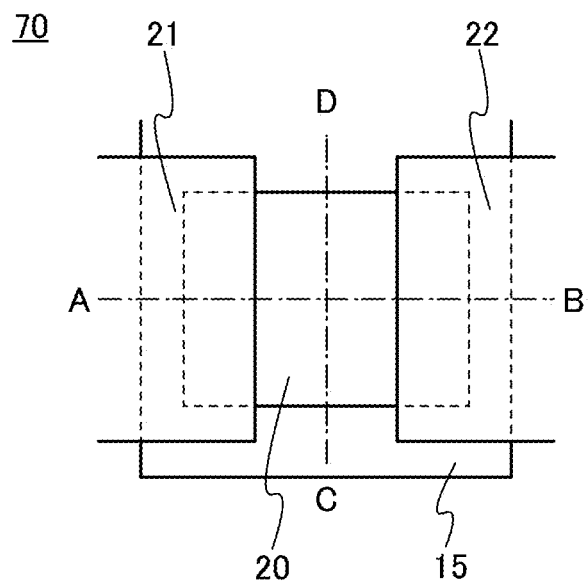
FIGS. 16A to 16C are a top view and cross-sectional views illustrating one embodiment of a transistor.
Figure 16C:
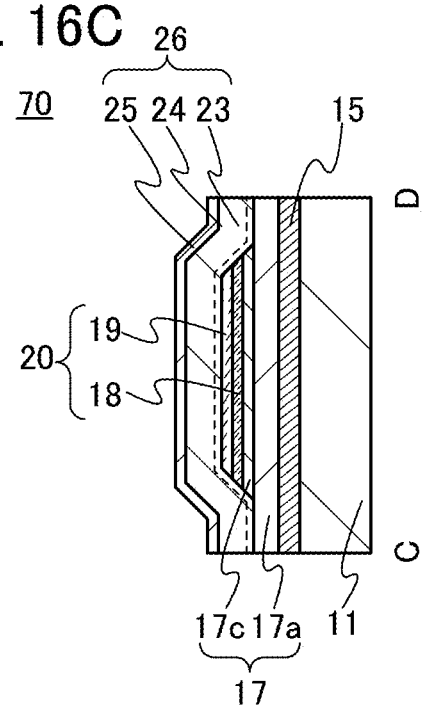
Figure 16B:
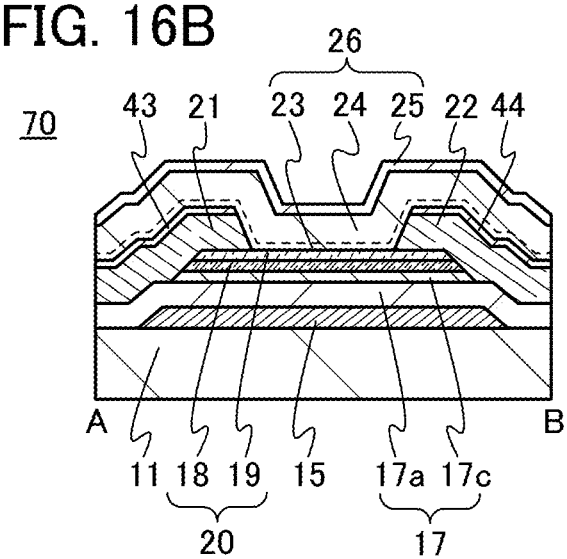

FIGS. 16A to 16C are a top view and cross-sectional views of a transistor 70 included in a semiconductor device. The transistor 70 shown in FIGS. 16A to 16C is a channel-etched transistor. FIG. 16A is a top view of the transistor 70, FIG. 16B is a cross-sectional view taken along dashed-dotted line A-B of FIG. 16A, and FIG. 16C is a cross-sectional view taken along dashed-dotted line C-D of FIG. 16A. Note that in FIG. 16A, the substrate 11, some components of the transistor 70 (e.g., the gate insulating film 17), the oxide insulating film 23, the oxide insulating film 24, the nitride insulating film 25, and the like are not illustrated for clarity.

The transistor 70 illustrated in FIGS. 16B and 16C includes the gate electrode 15 over the substrate 11, the gate insulating film 17 over the substrate 11 and the gate electrode 15, the multilayer film 20 overlapping with the gate electrode 15 with the gate insulating film 17 provided therebetween, and the pair of electrodes 21 and 22 in contact with the multilayer film 20. Furthermore, protective films 43 and 44 are provided over the pair of electrodes 21 and 22. The protective film 26 including the oxide insulating film 23, the oxide insulating film 24, and the nitride insulating film 25 is formed over the gate insulating film 17, the multilayer film 20, the pair of electrodes 21 and 22, and the protective films 43 and 44.

The protective films 43 and 44 function as etching protective films in a processing step for forming the pair of electrodes 21 and 22. Further, the protective films 43 and 44 can prevent the pair of electrodes 21 and 22 from being exposed to plasma, typically, oxygen plasma. Further, the protective films 43 and 44 can prevent diffusion of the metal element included in the pair of electrodes 21 and 22. Thus, the protective films 43 and 44 are formed using a material with plasma resistance. Further, the protective films 43 and 44 are formed using a material which prevents diffusion of the metal element included in the pair of electrodes 21 and 22.

The protective films 43 and 44 can be formed using a nitride insulating film formed of silicon nitride, silicon nitride oxide, aluminum nitride, aluminum nitride oxide, or the like as appropriate. Note that in this specification, a "silicon nitride oxide film" and an "aluminum nitride oxide film" refer to films in which the content (atomic ratio) of nitrogen is higher than that of oxygen and a "silicon oxynitride film" and an "aluminum oxynitride film" refer to films in which the content (atomic ratio) of oxygen is higher than that of nitrogen.

Alternatively, the protective films 43 and 44 can be formed using a light-transmitting conductive film formed of indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, indium tin oxide containing silicon oxide, or the like.

Alternatively, the protective films 43 and 44 can be formed using an oxide semiconductor containing In, Ga, or Zn which can be used for the oxide semiconductor film 18 or the oxide film 19 in Embodiment 1 as appropriate.

In the case where the protective films 43 and 44 are formed using a light-transmitting conductive film, the protective films 43 and 44 each function as an electrode together with the electrodes 21 and 22, respectively.

A mask formed of an organic resin (typically, a mask formed of a resist) used for formation of the pair of electrodes 21 and 22 is removed by ashing treatment in which the mask is decomposed in a gas phase by oxygen plasma. Alternatively, the mask formed of the organic resin can be removed using a stripper after the ashing treatment because the ashing treatment facilitates mask removal using the stripper.

In the case where an oxide insulating film as a protective film is formed over the pair of electrodes 21 and 22 by a sputtering method, a CVD method, or the like, the electrodes 21 and 22 are exposed to oxygen plasma.

When the pair of electrodes 21 and 22 is exposed to oxygen plasma, the metal element included in the pair of electrodes 21 and 22 reacts with oxygen to form a metal oxide. There is a problem in that the metal oxide is diffused into the multilayer film 20 because of its high reactivity. Thus, in the case where the protective films 43 and 44 are provided over the pair of electrodes 21 and 22, the protective films 43 and 44 function as masks and the pair of electrodes 21 and 22 is not easily exposed to oxygen plasma. As a result, the metal oxide in which oxygen and the metal element included in the pair of electrodes 21 and 22 are reacted with each other is not easily generated and the transfer of the metal element included in the pair of electrodes 21 and 22 to the multilayer film 20 can be inhibited.

That is, the concentration of impurities in the multilayer film 20 can be reduced. Further, variation in electrical characteristics of the transistor 70 including the multilayer film 20 can be reduced.

Next, a method for manufacturing the transistor 70 in FIGS. 16A to 16C is described with reference to FIGS. 2A to 2C and FIGS. 17A to 17D.

Figure 17A:
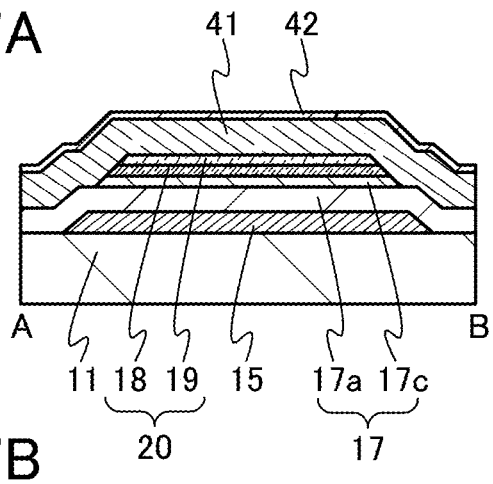
FIGS. 17A to 17D are cross-sectional views illustrating one embodiment of a method for manufacturing a transistor.

Through the steps of FIG. 2A to FIG. 2C in a manner similar to that in Embodiment 1, the gate electrode 15, the gate insulating film 17, the multilayer film 20, a conductive film 41, and a protective film 42 are formed over the substrate 11, as illustrated in FIG. 17A.

The conductive film 41 is to be the pair of electrodes 21 and 22 later. Thus, for the conductive film 41, the material of the pair of electrodes 21 and 22 can be used as appropriate.

The conductive film 41 is formed by a sputtering method, an evaporation method, a CVD method, a printing method, or the like, as appropriate.

Here, a 200-nm-thick copper film is formed as the conductive film 41 by a sputtering method. Further, as the protective film 42, a 200-nm-thick silicon nitride film is formed by a plasma CVD method.

Figure 17B:
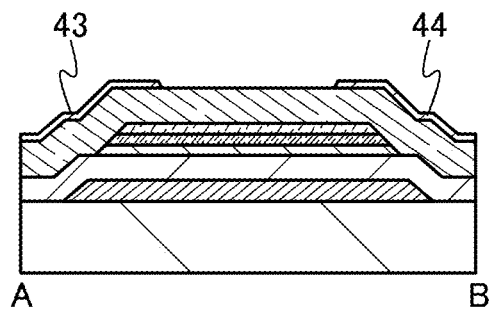

After a mask is formed over the protective film 42, part of the protective film 42 is etched using the mask, so that the protective films 43 and 44 are formed as illustrated in FIG. 17B. The protective film 42 can be etched by dry etching, wet etching, or the like, as appropriate. Note that the protective films 43 and 44 serve as hard masks in a later step and the distance between the protective film 43 and the protective film 44 is a channel length of the transistor; thus, the protective film 42 is preferably etched by dry etching by which anisotropic etching can be conducted.

Here, after the mask is formed in a photolithography process, part of the protective film 42 is etched by a dry etching method, whereby the protective films 43 and 44 are formed.

After that, the mask is preferably removed. As a result, in the step of removing the mask, the multilayer film 20 is covered with the conductive film 41 and is not exposed; thus, the metal element included in the conductive film 41 is not transferred to the multilayer film 20. Here, the mask is subjected to ashing treatment for ease of removal, and then the mask is removed using the resist stripper.

Figure 17C:
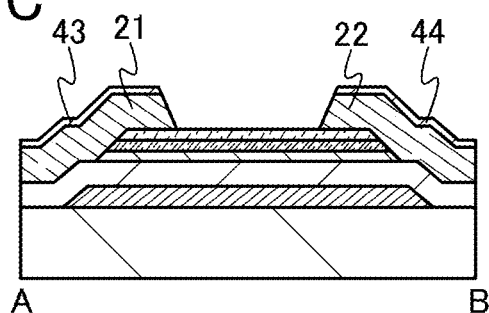

Next, as illustrated in FIG. 17C, part of the conductive film 41 is etched using the protective films 43 and 44 as masks, whereby the pair of electrodes 21 and 22 is formed. For the etching condition in which the protective films 43 and 44 are not etched and the conductive film 41 is selectively etched, acetic acid, perchloric acid, a mixed solution of phosphoric acid, acetic acid, and nitric acid (an aluminum etchant), or the like can be used as appropriate.

Here, the conductive film 41 is selectively etched by a wet etching method using a mixed solution of hydrogen peroxide, ammonium acetate, malonic acid, ethylenediaminetetraacetic acid, and 5-amino-1H-tetrazole monohydrate as an etchant.

Note that after the pair of electrodes 21 and 22 is formed, an etching step to remove the metal element which remains on the multilayer film 20 is preferably added. For example, it is preferable that the pair of electrodes 21 and 22 and the protective films 43 and 44 be not etched, and the surface of the multilayer film 20 be etched by several nanometers, for example, 1 nm to 5 nm. For such an etching condition, hydrofluoric acid, a mixed solution of hydrofluoric acid and ammonium fluoride (also referred to as buffered hydrofluoric acid), a mixed solution of ammonia and hydrogen peroxide water (also referred to as an ammonia hydrogen peroxide mixture), or the like can be used.

Here, by using an etchant of hydrofluoric acid diluted to $\frac{1}{1000}$ of 0.5% dilute hydrofluoric acid, the metal element included in the pair of electrodes 21 and 22 are removed from the surface of the multilayer film 20.

In the process of forming the pair of electrodes 21 and 22 and the process of removing the metal element included in the pair of electrodes 21 and 22 from the surface of the multilayer film 20, the metal element included in the pair of electrodes 21 and 22 is not diffused into the oxide semiconductor film 18, because a film in contact with the pair of electrodes 21 and 22, here, the oxide film 19, is formed using a CAAC oxide film. As a result, the concentration of impurities in the oxide semiconductor film 18 can be reduced.

Figure 17D:
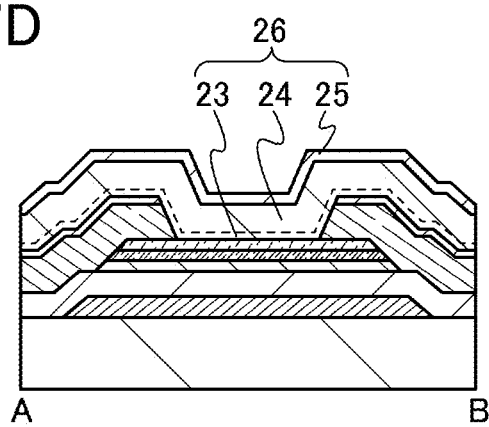

Next, the protective film 26 is formed over the multilayer film 20, the pair of electrodes 21 and 22, and the pair of protective films 43 and 44 as illustrated in FIG. 17D in a manner similar to that in Embodiment 1.

Through the above process, the transistor 70 can be manufactured.

In the transistor in this embodiment, the protective films 43 and 44 are provided over the pair of electrodes. In the pair of electrodes, an area exposed to plasma, for example, oxygen plasma, can be reduced. As a result, generation of a compound of the metal element included in the conductive film due to plasma irradiation can be inhibited; thus, the metal element included in the conductive film is not easily transferred to the multilayer film.

Further, the oxide film formed of the CAAC oxide film is provided between the oxide semiconductor film and the pair of electrodes. Diffusion of impurities from the outside can be inhibited by the oxide film, and accordingly, the amount of impurities which are transferred from the pair of electrodes to the oxide semiconductor film can be reduced. Thus, even when the pair of electrodes is formed using copper, aluminum, gold, silver, or molybdenum, variation in the threshold voltage of the transistor can be reduced.

As a result, diffusion of impurities such as copper, aluminum, gold, silver, and molybdenum which are constituent elements of the wiring and the electrode into the oxide semiconductor film included in the multilayer film can be inhibited. Further, the concentration of impurities in the oxide semiconductor film can be reduced.

In this manner, a semiconductor device with improved electrical characteristics can be obtained. Further, a highly reliable semiconductor device can be obtained.

Modification Example 1

Figure 33A:
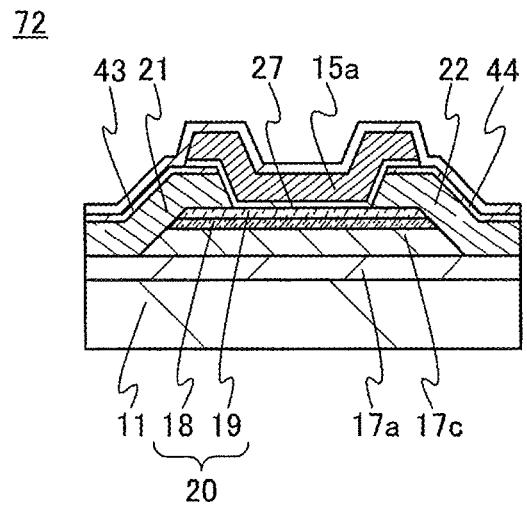
FIGS. 33A and 33B are cross-sectional views each illustrating one embodiment of a transistor.
Figure 33B:
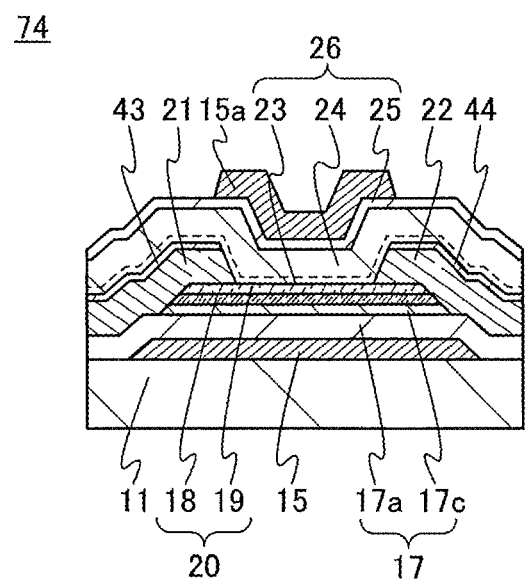

Although a bottom-gate transistor in which the gate electrode 15 is provided between the substrate 11 and the multilayer film 20 is described in this embodiment, as illustrated in FIG. 33A, a top-gate transistor can also be used. That is, a transistor 72, in which the pair of electrodes 21 and 22 is provided over the multilayer film 20, the protective films 43 and 44 are provided over the pair of electrodes 21 and 22, the gate insulating film 27 is provided over the pair of electrodes 21 and 22 and the protective films 43 and 44, and the gate electrode 15*a* is provided over the gate insulating film 27, can be formed. Note that the oxide insulating film 17*c* in contact with the multilayer film 20 and the nitride insulating film 17*a* in contact with the oxide insulating film 17*c* and the pair of electrodes 21 and 22 are provided between the substrate 11 and the multilayer film 20. Further, as illustrated in FIG. 33B, a dual-gate transistor 74 including the gate electrode 15, the gate insulating film 17 over the gate electrode 15, the multilayer film 20 over the gate insulating film 17, the pair of electrodes 21 and 22 over the multilayer film 20, the protective films 43 and 44 over the pair of electrodes 21 and 22, the protective film 26 over the multilayer film 20, the pair of electrodes 21 and 22, and the protective films 43 and 44, and the gate electrode 15*a* over the protective film 26 can be formed.

Embodiment 3

In this embodiment, a semiconductor device of one embodiment of the present invention is described with reference to drawings. Note that in this embodiment, a semiconductor device of one embodiment of the present invention is described taking a display device as an example.

Figure 18A:
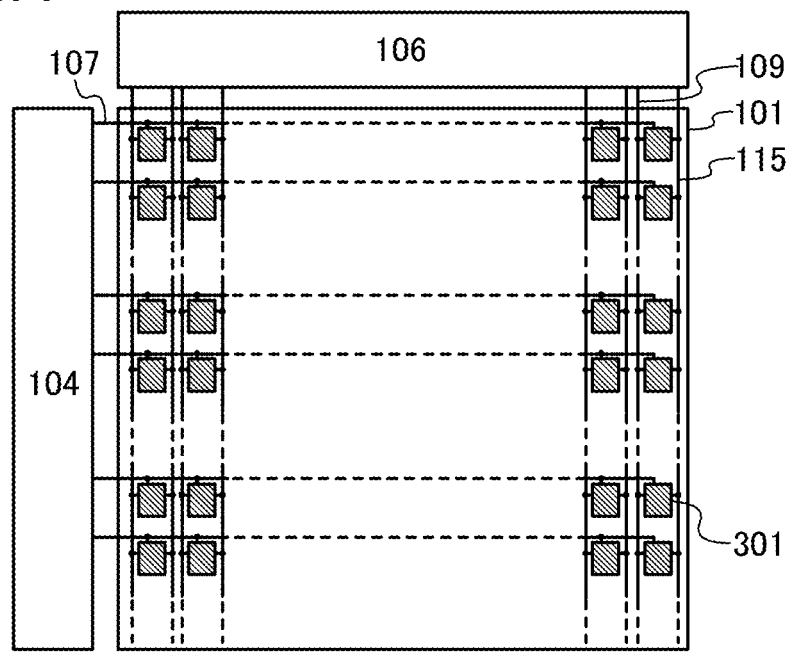
FIGS. 18A to 18C are a block diagram and circuit diagrams illustrating one embodiment of a semiconductor device.

FIG. 18A illustrates an example of a semiconductor device. The semiconductor device in FIG. 18A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 101 includes a plurality of pixels 301 arranged in a matrix. Furthermore, capacitor lines 115 arranged in parallel or substantially in parallel are provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Each scan line 107 is electrically connected to the n pixels 301 in the corresponding row among the pixels 301 arranged in m rows and n columns in the pixel portion 101. Each signal line 109 is electrically connected to the m pixels 301 in the corresponding column among the pixels 301 arranged in m rows and n columns. Note that m and n are each an integer of 1 or more. Each capacitor line 115 is electrically connected to the m pixels 301 in the corresponding column among the pixels 301 arranged in m rows and n columns. Note that in the case where the capacitor lines 115 are arranged in parallel or substantially in parallel along the scan lines 107, each capacitor line 115 is electrically connected to the n pixels 301 in the corresponding row among the pixels 301 arranged in m rows and n columns.

Figure 18B:
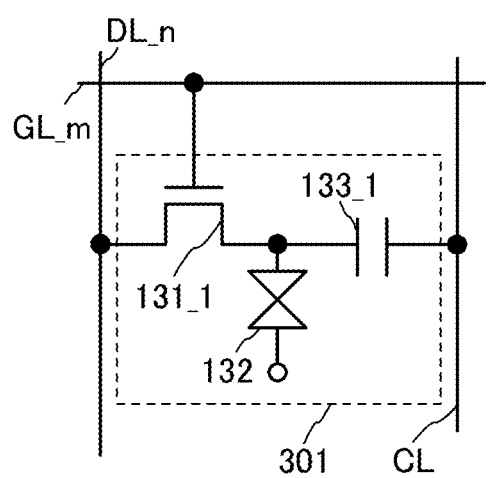
Figure 18C:
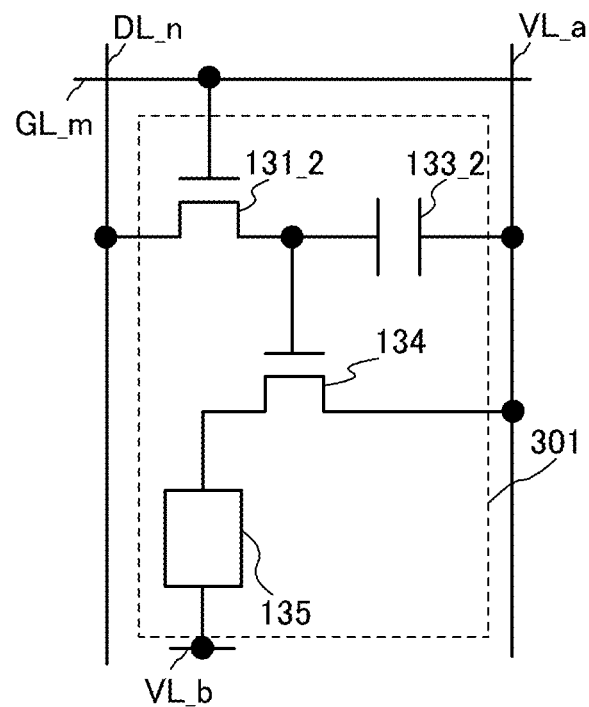

FIGS. 18B and 18C illustrate circuit configurations that can be used for the pixels 301 in the display device illustrated in FIG. 18A.

The pixel 301 illustrated in FIG. 18B includes a liquid crystal element 132, a transistor 131_1, and a capacitor 133_1.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Further, the potential supplied to one of a pair of electrodes of the liquid crystal element 132 in the pixel 301 in one row may be different from the potential supplied to one of a pair of electrodes of the liquid crystal element 132 in the pixel 301 in another row.

As examples of a driving method of the display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the m-th row and the n-th column, one of a source electrode and a drain electrode of the transistor 131_1 is electrically connected to a signal line DL_n, and the other is electrically connected to the other of a pair of electrodes of the liquid crystal element 132. A gate electrode of the transistor 131_1 is electrically connected to a scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a capacitor line CL), and the other is electrically connected to the other of the pair of electrodes of the liquid crystal element 132. The potential of the capacitor line CL is set in accordance with the specifications of the pixel 301 as appropriate. The capacitor 133_1 functions as a storage capacitor for storing written data.

For example, in the display device including the pixel 301 in FIG. 18B, the pixels 301 are sequentially selected row by row by the scan line driver circuit 104, whereby the transistors 131_1 are turned on and a data signal is written.

When the transistors 131_1 are turned off, the pixels 301 in which the data has been written are brought into a holding state. This operation is sequentially performed row by row; thus, an image is displayed.

The pixel 301 illustrated in FIG. 18C includes a transistor 131_2, a capacitor 133_2, a transistor 134, and a light-emitting element 135.

One of a source electrode and a drain electrode of the transistor 1312 is electrically connected to a wiring to which a data signal is supplied (hereinafter referred to as signal line DL_n). A gate electrode of the transistor 131_2 is electrically connected to a wiring to which a gate signal is supplied (hereinafter referred to as scan line GL_m).

The transistor 131_2 has a function of controlling whether to write a data signal by being turned on or off.

One of a pair of electrodes of the capacitor 133_2 is electrically connected to a wiring to which a potential is supplied (hereinafter referred to as a potential supply line VL_a), and the other is electrically connected to the other of the source electrode and the drain electrode of the transistor 1312.

The capacitor 133_2 functions as a storage capacitor for storing written data.

One of a source electrode and a drain electrode of the transistor 134 is electrically connected to the potential supply line VL_a. Further, a gate electrode of the transistor 134 is electrically connected to the other of the source electrode and the drain electrode of the transistor 1312.

One of an anode and a cathode of the light-emitting element 135 is electrically connected to a potential supply line VL_b, and the other is electrically connected to the other of the source electrode and the drain electrode of the transistor 134.

As the light-emitting element 135, an organic electroluminescent element (also referred to as an organic EL element) or the like can be used, for example. Note that the light-emitting element 135 is not limited to organic EL elements; an inorganic EL element including an inorganic material can be used.

A high power supply potential VDD is supplied to one of the potential supply line VL_a and the potential supply line VL_b, and a low power supply potential VSS is supplied to the other.

In the display device including the pixel 301 in FIG. 18C, the pixels 301 are sequentially selected row by row by the scan line driver circuit 104, whereby the transistors 131_2 are turned on and a data signal is written.

When the transistors 131_2 are turned off, the pixels 301 in which the data has been written are brought into a holding state. Further, the amount of current flowing between the source electrode and the drain electrode of the transistor 134 is controlled in accordance with the potential of the written data signal. The light-emitting element 135 emits light with a luminance corresponding to the amount of flowing current. This operation is sequentially performed row by row; thus, an image is displayed.

Figure 19:
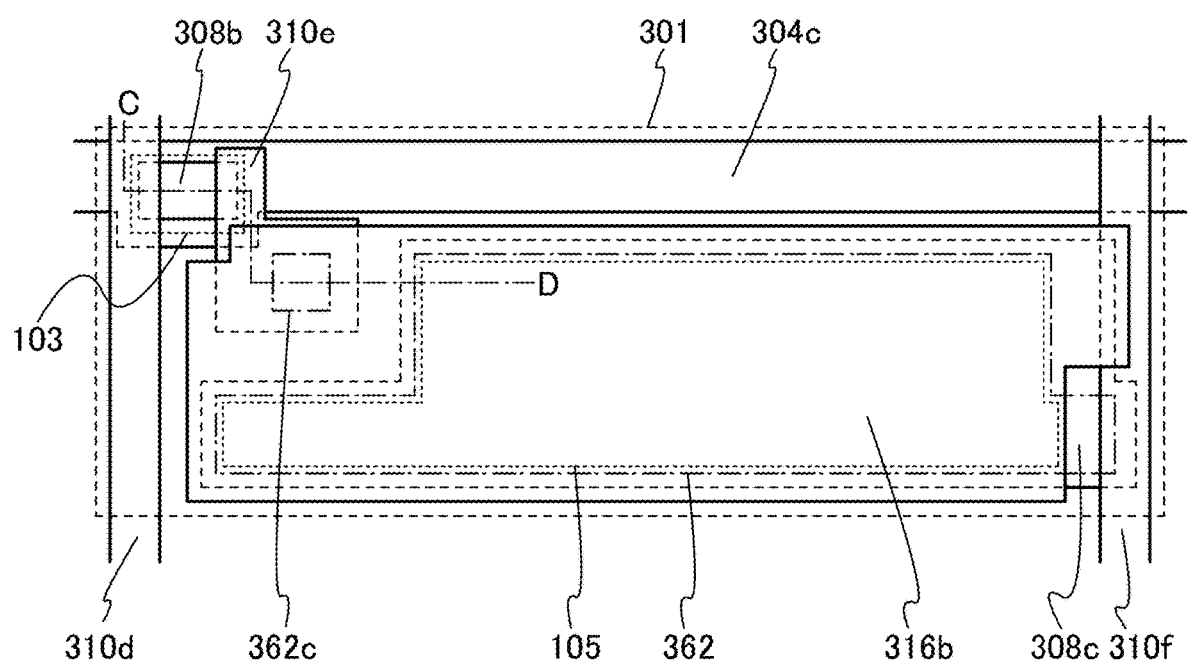
FIG. 19 is a top view illustrating one embodiment of a semiconductor device.

Next, a specific example of a liquid crystal display device including a liquid crystal element in the pixel 301 is described. FIG. 19 is a top view of the pixel 301 illustrated in FIG. 18B. Note that in FIG. 19, a counter electrode and a liquid crystal element are omitted.

In FIG. 19, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 18A), and the conductive film 310d serving as a signal line and the conductive film 310f serving as a capacitor line are electrically connected to the signal line driver circuit 106 (see FIG. 18A).

The transistor 103 is provided at a region where the scan line and the signal line cross each other. The transistor 103 includes the conductive film 304c serving as a gate electrode; the gate insulating film (not illustrated in FIG. 19); a multilayer film 308b where a channel region is formed, over the gate insulating film; and the conductive films 310d and 310e serving as a source electrode and a drain electrode. The conductive film 304c also serves as a scan line, and a region of the conductive film 304c that overlaps with the multilayer film 308b serves as the gate electrode of the transistor 103. In addition, the conductive film 310d also serves as a signal line, and a region of the conductive film 310d that overlaps with the multilayer film 308b serves as the source electrode or drain electrode of the transistor 103. Further, in the top view of FIG. 19, an end portion of the scan line is located on the outer side than an end portion of the multilayer film 308b. Thus, the scan line functions as a light-blocking film for blocking light from a light source such as a backlight. For this reason, the multilayer film 308b included in the transistor is not irradiated with light, so that a variation in the electrical characteristics of the transistor can be suppressed.

The conductive film 310e is electrically connected to the light-transmitting conductive film 316b that serves as a pixel electrode, through an opening 362c.

The capacitor 105 is connected to the conductive film 310f serving as a capacitor line through an opening 362. The capacitor 105 includes a film 308c having conductivity formed over the gate insulating film, a dielectric film formed of a nitride insulating film formed over the transistor 103, and a light-transmitting conductive film 316b serving as a pixel electrode. The film 308c having conductivity has a light-transmitting property; thus, the capacitor 105 has a light-transmitting property.

Thanks to the light-transmitting property of the capacitor 105, the capacitor 105 can be formed large (covers a large area) in the pixel 301. Thus, a semiconductor device having charge capacity increased while improving the aperture ratio, typically, to 50% or more, 55% or more, or 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more.

The pixel 301 illustrated in FIG. 19 has a shape in which a side parallel to the conductive film 304c serving as a scan line is longer than a side parallel to the conductive film 310d serving as a signal line and the conductive film 310f serving as a capacitor line extends in parallel to the conductive film 310d serving as a signal line. As a result, the area where the conductive film 310f occupies the pixel 301 can be decreased, thereby increasing the aperture ratio. The conductive film 310f serving as a capacitor line is in direct contact with the film 308c having conductivity without a connection electrode. The film 308c having conductivity has a light-transmitting property, thereby further increasing the aperture ratio.

Further, according to one embodiment of the present invention, the aperture ratio can be improved even in a display device with a high resolution, which makes it possible to use light from a light source such as a backlight efficiently, so that power consumption of the display device can be reduced.

Figure 20:
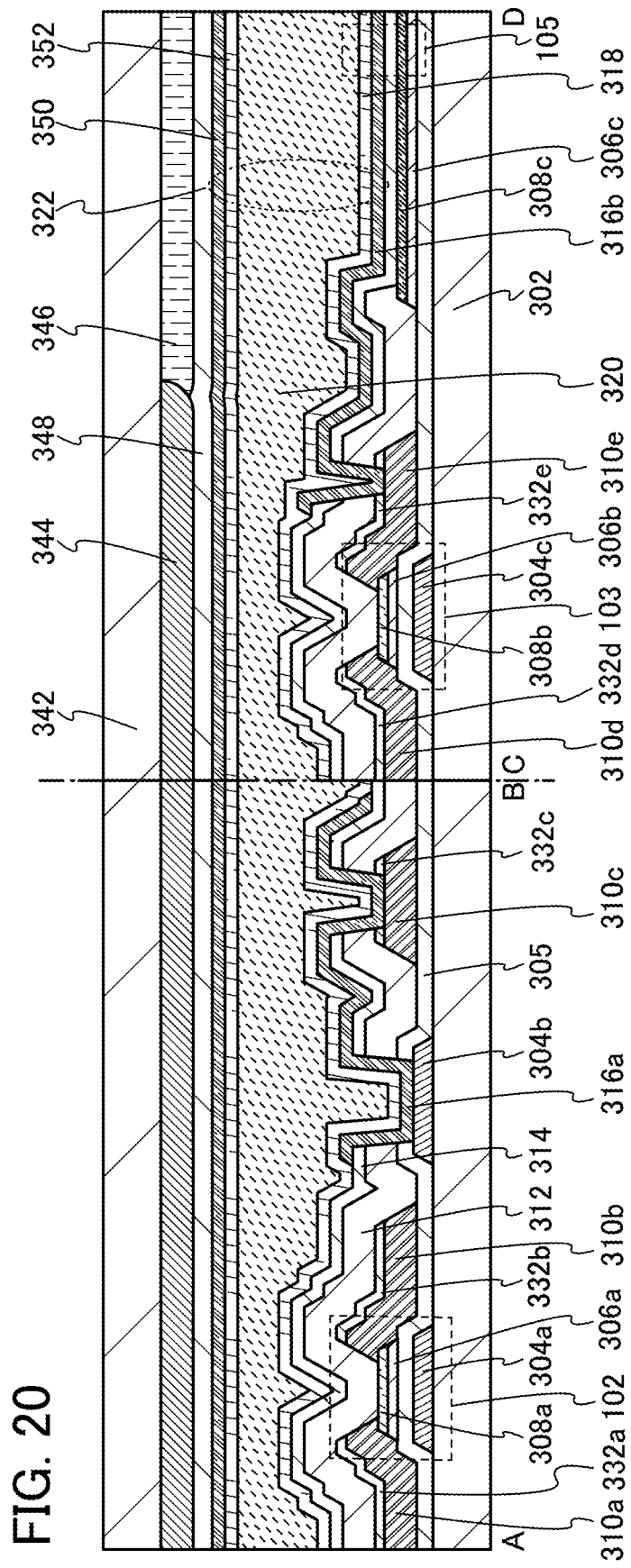
FIG. 20 is a cross-sectional view illustrating one embodiment of a semiconductor device.

Next, FIG. 20 shows a cross section taken along dashed-dotted line C-D in FIG. 19. Note that a cross section A-B in FIG. 20 is a cross-sectional view of a driver circuit portion (a top view thereof is omitted) including the scan line driver circuit 104 and the signal line driver circuit 106. In this embodiment, a liquid crystal display device of a vertical electric field mode is described.

In the liquid crystal display device described in this embodiment, a liquid crystal element 322 is provided between a pair of substrates (a substrate 302 and a substrate 342).

The liquid crystal element 322 includes the light-transmitting conductive film 316b over the substrate 302, films controlling alignment (hereinafter referred to as alignment films 318 and 352), a liquid crystal layer 320, and a conductive film 350. Note that the light-transmitting conductive film 316b functions as one electrode of the liquid crystal element 322, and the conductive film 350 functions as the other electrode of the liquid crystal element 322.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a serving as a gate electrode, insulating films 305 and 306a collectively serving as a gate insulating film, the multilayer film 308a in which a channel region is formed, and the conductive films 310a and 310b serving as a source electrode and a drain electrode. The multilayer film 308a is provided over the gate insulating film. Protective films 332a and 332b are provided over the conductive films 310a and 310b. Insulating films 312 and 314 are provided as protective films over the protective films 332a and 332b. In the case where the protective films 332a and 332b are formed using a light-transmitting conductive film, the protective films 332a and 332b serve as the source electrode and the drain electrode in the transistor 102.

In the pixel portion, the transistor 103 includes the conductive film 304c functioning as a gate electrode, the insulating films 305 and 306b collectively functioning as a gate insulating film, the multilayer film 308b in which a channel region is formed, and the conductive films 310d and 310e functioning as a source electrode and a drain electrode. Further, protective films 332d and 332e are provided over the conductive films 310d and 310e. The insulating films 312 and 314 are provided as protective films over the protective films 332d and 332e. In the case where the protective films 332d and 332e are formed using a light-transmitting conductive film, the protective films 332d and 332e serve as the source electrode and the drain electrode in the transistor 103.

The light-transmitting conductive film 316b functioning as a pixel electrode is connected to the conductive film 310e through an opening provided in the protective film 332e and the insulating films 312 and 314.

Further, the capacitor 105 includes the film 308c having conductivity functioning as one electrode of the capacitor 105, the insulating film 314 functioning as a dielectric film, and the light-transmitting conductive film 316b functioning as the other electrode of the capacitor 105. The film 308c having conductivity is provided over an insulating film 306c.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 316a formed at the same time as the light-transmitting conductive film 316b.

The conductive film 304b and the light-transmitting conductive film 316a are connected to each other through an opening provided in the insulating film 305 and the insulating films 312 and 314. Further, the conductive film 310c and the light-transmitting conductive film 316a are connected to each other through an opening provided in the protective film 332c and the insulating films 312 and 314.

Here, components of the display device shown in FIG. 20 are described below.

The conductive films 304a, 304b, and 304c are formed over the substrate 302. The conductive film 304a functions as a gate electrode of the transistor in the driver circuit portion. The conductive film 304c is formed in the pixel portion 101 and functions as a gate electrode of the transistor in the pixel portion. The conductive film 304b is formed in the scan line driver circuit 104 and connected to the conductive film 310c.

The substrate 302 can be formed using the material of the substrate 11 which is given in Embodiment 1, as appropriate.

The conductive films 304a, 304b, and 304c can be formed using the material and the formation method of the gate electrode 15 which are described in Embodiment 1, as appropriate.

The insulating film 305 is formed over the substrate 302 and the conductive films 304a, 304c, and 304b, and the insulating films 306a, 306b, and 306c are formed over the insulating film 305. The insulating films 305, 306a, and 306b function as a gate insulating film of the transistor in the driver circuit portion and a gate insulating film of the transistor in the pixel portion 101.

The insulating film 305 is formed using the nitride insulating film 17a, which is described as the gate insulating film 17 in Embodiment 1. The insulating films 306a, 306b, and 306c are formed using the oxide insulating film 17c, which is described as the gate insulating film 17 in Embodiment 1.

Over the insulating films 306a, 306b, and 306c, the multilayer films 308a and 308b and the film 308c having conductivity are formed. The multilayer film 308a is formed in a position overlapping with the conductive film 304a and functions as a channel region of the transistor in the driver circuit portion. The multilayer film 308b is formed in a position overlapping with the conductive film 304c and functions as a channel region of the transistor in the pixel portion. The film 308c having conductivity functions as one electrode of the capacitor 105.

The multilayer films 308a and 308b and the film 308c having conductivity can be formed using the material and the formation method of the multilayer film 20 which are described in Embodiment 1, as appropriate.

The film 308c having conductivity is a multilayer film similar to the multilayer films 308a and 308b and contains impurities. An example of the impurities is hydrogen. Instead of hydrogen, as the impurity, boron, phosphorus, tin, antimony, a rare gas element, alkali metal, alkaline earth metal, or the like may be included.

The multilayer films 308a and 308b and the film 308c having conductivity are formed over the insulating films 306a, 306b, and 306c, respectively, but differ in impurity concentration. Specifically, the film 308c having conductivity has a higher impurity concentration than the multilayer films 308a and 308b. For example, the concentration of hydrogen contained in each of the multilayer films 308a and 308b is lower than or equal to $5\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. The concentration of hydrogen contained in the film 308c having conductivity is higher than or equal to $8\times10^{19}$ atoms/cm$^3$, higher than or equal to $1\times10^{20}$ atoms/cm$^3$, or higher than or equal to $5\times10^{20}$ atoms/cm$^3$. The concentration of hydrogen contained in the film 308c having conductivity is greater than or equal to 2 times or greater than or equal to 10 times those in the multilayer films 308a and 308b.

The film 308c having conductivity has lower resistivity than the multilayer films 308a and 308b. The resistivity of the film 308c having conductivity is preferably greater than or equal to $1\times10^{-8}$ times and less than or equal to $1\times10^{-1}$ times the resistivity of the multilayer films 308a and 308b. The resistivity of the film 308c having conductivity is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

The multilayer films 308a and 308b are in contact with the films each formed using a material which can improve characteristics of the interface with the multilayer film, such as the insulating films 306a and 306b and the insulating film 312. Thus, the multilayer films 308a and 308b function as semiconductors, so that the transistors including the multilayer films 308a and 308b have excellent electrical characteristics.

Figure 23A:
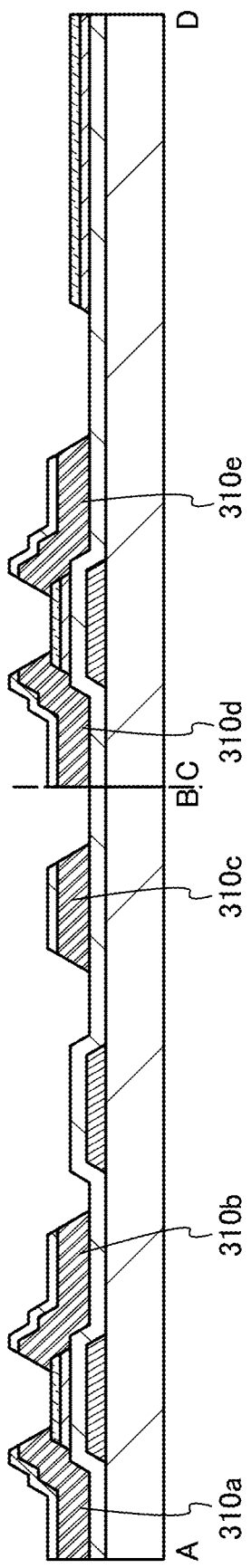
FIGS. 23A to 23C are cross-sectionals views illustrating one embodiment of a method for manufacturing a semiconductor device.
Figure 23B:
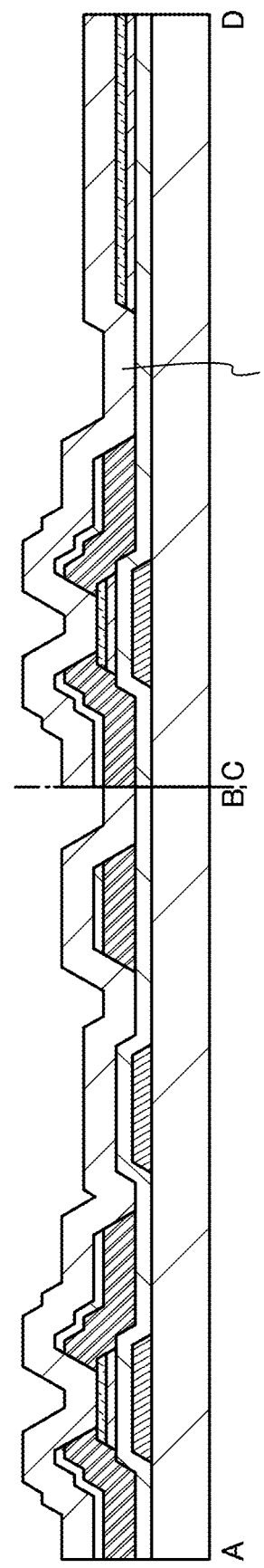
Figure 23C:
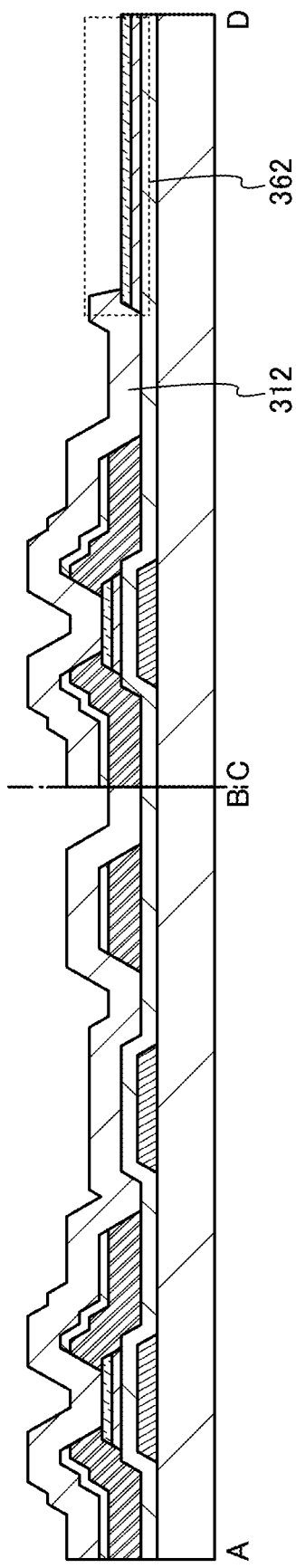

The film 308c having conductivity is in contact with the insulating film 314 in the opening 362 (see FIG. 23C). The insulating film 314 is formed using a material which prevents diffusion of impurities from the outside, such as water, alkali metal, and alkaline earth metal, into the multilayer film, and the material further includes hydrogen. Thus, when hydrogen in the insulating film 314 is diffused into the multilayer film formed at the same time as the multilayer films 308a and 308b, hydrogen is bonded to oxygen and electrons serving as carriers are generated in the oxide semiconductor film included in the multilayer film. Further, when the insulating film 314 is formed by a plasma CVD method or a sputtering method, the multilayer films 308a and 308b are exposed to plasma, so that oxygen vacancies are generated. When hydrogen contained in the insulating film 314 enters the oxygen vacancies, electrons serving as carriers are generated. As a result, the oxide semiconductor film included in the multilayer film has higher conductivity and functions as a conductor; in other words, the oxide semiconductor film can be an oxide semiconductor film with high conductivity. Here, a metal oxide which contains a material similar to those of the multilayer films 308a and 308b as a main component and has higher conductivity because hydrogen concentration of the metal oxide is higher than those of the multilayer films 308a and 308b is referred to as the "film 308c having conductivity".

Note that one embodiment of the present invention is not limited thereto, and it is possible that the film 308c having conductivity is not in contact with the insulating film 314 depending on circumstances.

Further, one embodiment of the present invention is not limited thereto, and the film 308c having conductivity may be formed by a different process from that of the multilayer film 308a or the multilayer film 308b depending on circumstances. In that case, the film 308c having conductivity may include a different material from that of the multilayer film 308a or the multilayer film 308b. For example, the film 308c having conductivity may include indium tin oxide (hereinafter referred to as ITO), indium zinc oxide, or the like.

In the semiconductor device illustrated in this embodiment, one electrode of the capacitor is formed at the same time as the multilayer film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced. Further, since the capacitor has a pair of electrodes formed with the light-transmitting conductive film, it can have a light-transmitting property. As a result, the area occupied by the capacitor can be increased and the aperture ratio in a pixel can be increased.

The protective films 332a, 332b, 332c, 332d, and 332e can be formed using the material and the formation method of the protective films 43 and 44, which are described in Embodiment 2, as appropriate.

The conductive films 310a, 310b, 310c, 310d, and 310e can be formed using the material and the formation method of the pair of electrodes 21 and 22, which are described in Embodiment 1, as appropriate.

Over the insulating films 306a, 306b, and 306c, the multilayer films 308a and 308b, the film 308c having conductivity, the protective films 332a, 332b, 332c, 332d, and 332e, and the conductive films 310a, 310b, 310c, 310d, and 310e, the insulating film 312 and the insulating film 314 are formed. For the insulating film 312, in a manner similar to that of the insulating film 306, a material which can improve characteristics of the interface with the multilayer film is preferably used. The insulating film 312 can be formed using a material and a formation method which are similar to those of the oxide insulating film 24 which are described in Embodiment 1, as appropriate. Further, as described in Embodiment 1, the oxide insulating film 23 and the oxide insulating film 24 may be stacked.

For the insulating film 314, a material which prevents diffusion of impurities from the outside, such as water, alkali metal, and alkaline earth metal, into the multilayer film is preferably used. The insulating film 314 can be formed using the material and the formation method of the nitride insulating film 25 which are described in Embodiment 1, as appropriate.

Further, the light-transmitting conductive films 316a and 316b are provided over the insulating film 314. The light-transmitting conductive film 316a is electrically connected to the conductive film 304b through the opening 364a (see FIG. 24B) and electrically connected to the conductive film 310c through the opening 364b (see FIG. 24B). That is, the light-transmitting conductive film 316a functions as a connection electrode which connects the conductive film 304b and the conductive film 310c. The light-transmitting conductive film 316b is electrically connected to the conductive film 310e through the opening 364c (see FIG. 24B) and functions as the pixel electrode of a pixel. Further, the light-transmitting conductive film 316b can function as the other of the pair of electrodes of the capacitor.

In order to form a connection structure in which the conductive film 304b is in direct contact with the conductive film 310c, it is necessary to perform patterning for forming an opening in the insulating film 305 and to form a mask before the conductive film 310c is formed. When the conductive film 304b is connected to the conductive film 310c with the light-transmitting conductive film 316a as shown in FIG. 20, it is not necessary to form a connection portion where the conductive film 304b is in direct contact with the conductive film 310c. Thus, the number of photomasks can be reduced by one. That is, steps of forming a semiconductor device can be reduced.

For the light-transmitting conductive films 316a and 316b, a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added can be used.

A film having a colored property (hereinafter referred to as a colored film 346) is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the display device is a monochrome display device, for example.

The colored film 346 is a colored film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that an insulating film that functions as an alignment film may be additionally formed on the light-transmitting conductive films 316a and 316b and the conductive film 350.

The liquid crystal layer 320 is formed between the light-transmitting conductive film 316a and the conductive film 350, and the light-transmitting conductive film 316b and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive film 316a and the conductive film 350, and the light-transmitting conductive film 316b and the conductive film 350 to maintain the thickness of the liquid crystal layer 320 (also referred to as a cell gap).

A formation method of the element portion over the substrate 302 in the semiconductor device illustrated in FIG.

20 is described with reference to FIGS. 21A to 21C, FIGS. 22A to 22C, FIGS. 23A to 23C, FIGS. 24A and 24B, and FIGS. 25A and 25B.

First, the substrate 302 is prepared. Here, a glass substrate is used as the substrate 302.

Then, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions not covered with the mask are etched (see FIG. 21A).

The conductive films 304a, 304b, and 304c can be typically formed by an evaporation method, a CVD method, a sputtering method, a spin coating method, or the like.

Figure 21A:
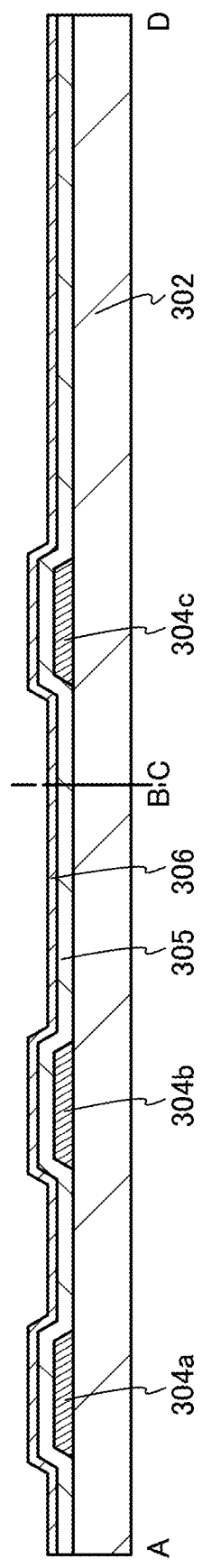
FIGS. 21A to 21C are cross-sectional views illustrating one embodiment of a method for manufacturing a semiconductor device.

Next, the insulating film 305 is formed over the substrate 302 and the conductive films 304a, 304b, and 304c, and then the insulating film 306 is formed over the insulating film 305 (see FIG. 21A).

The insulating films 305 and 306 can be formed by a sputtering method, a CVD method, or the like. Note that it is preferable that the insulating films 305 and 306 be formed in succession in a vacuum, in which case entry of impurities is suppressed.

Figure 21B:
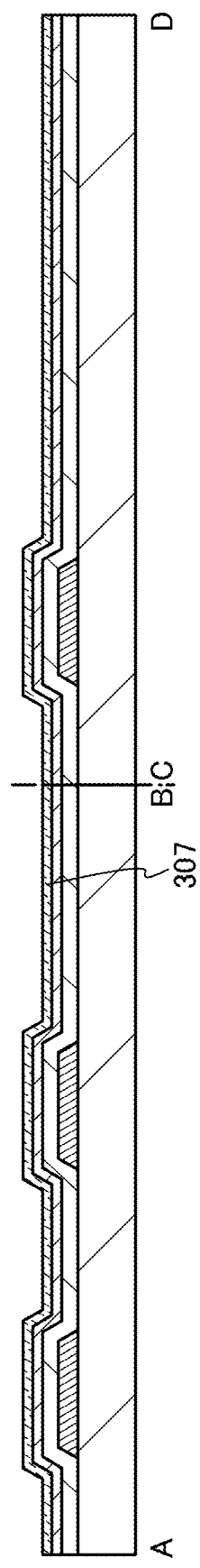
Figure 21C:
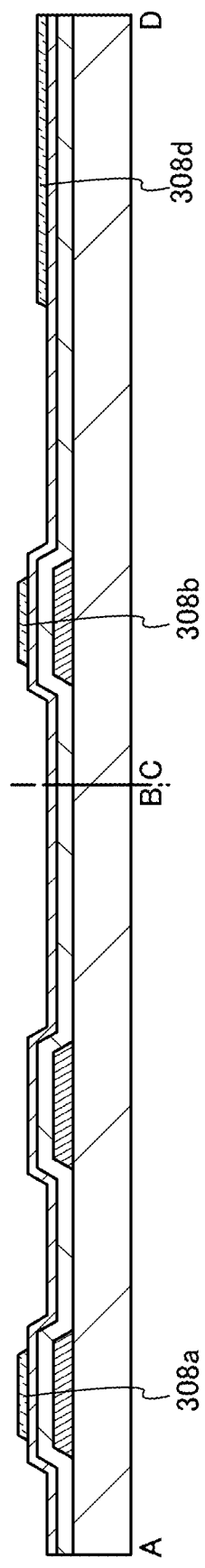

Next, a multilayer film 307 is formed over the insulating film 306 (see FIG. 21B).

The multilayer film 307 can be formed by a sputtering method, a coating method, a pulsed laser deposition method, a laser ablation method, or the like.

Next, the multilayer film 307 is processed into desired regions, so that the island-shaped multilayer films 308a, 308b, and 308d are formed. The oxide semiconductor films 308a, 308b, and 308d can be formed in such a manner that a mask is formed in the desired regions by second patterning and regions not covered with the mask are etched. For the etching, dry etching, wet etching, or a combination of both can be employed (see FIG. 21C).

Then, the insulating film 306 is processed into desired regions to form the island-shaped insulating films 306a, 306b, and 306c. The insulating films 306a, 306b, and 306c can be formed by etching regions not covered with the multilayer films 308a, 308b, and 308d in the insulating film 306. For the etching, dry etching, wet etching, or a combination of both can be employed (see FIG. 22A).

Next, first heat treatment is performed. The first heat treatment is performed under the conditions similar to those of the first heat treatment in Embodiment 1. By the first heat treatment, the crystallinity of the oxide semiconductor that is used for the multilayer films 308a, 308b, and 308d can be improved, and in addition, impurities such as hydrogen and water can be removed from the insulating film 305, the insulating films 306a, 306b, and 306c, and the multilayer films 308a, 308b, and 308d. The first heat treatment may be performed before the oxide semiconductor is etched.

Next, a conductive film 309 and a protective film 330 are formed over the insulating films 306a, 306b, and 306c and the multilayer films 308a, 308b, and 308d (see FIG. 22B).

The conductive film 309 can be formed by a sputtering method, an evaporation method, a CVD method, or a printing method, for example.

The protective film 330 can be formed by a sputtering method or a CVD method, for example.

Then, the protective film 330 is processed into desired regions, so that the protective films 332a, 332b, 332c, 332d, and 332e are formed. The protective films 332a, 332b, 332c, 332d, and 332e can be formed in such a manner that a mask is formed in the desired regions by third patterning and regions not covered with the mask are etched. After that, the mask is removed (see FIG. 22C).

Then, the conductive film 309 is processed into desired regions, so that the conductive films 310a, 310b, 310c, 310d, and 310e are formed. The conductive films 310a, 310b, 310c, 310d, and 310e can be formed in such a manner that the protective films 332a, 332b, 332c, 332d, and 332e serve as masks, and regions not covered with the masks are etched (see FIG. 23A).

Next, an insulating film 311 is formed to cover the insulating films 306a, 306b, and 306c, the multilayer films 308a, 308b, and 308d, the conductive films 310a, 310b, 310c, 310d, and 310e, and the protective films 332a, 332b, 332c, 332d, and 332e (see FIG. 23B).

The insulating film 311 can be formed with a stacked-layer structure under conditions similar to those for the oxide insulating film 23 and the oxide insulating film 24 in Embodiment 1.

Next, the insulating film 311 is processed into desired regions so that the insulating film 312 and the opening 362 are formed. The insulating film 312 and the opening 362 can be formed in such a manner that a mask is formed in the desired regions by fourth patterning and regions not covered with the mask are etched (see FIG. 23C).

The opening 362 is formed so as to expose the surface of the multilayer film 308d. An example of a formation method of the opening 362 includes, but not limited to, a dry etching method. Alternatively, a wet etching method or a combination of dry etching and wet etching can be employed for formation of the opening 362.

After that, the second heat treatment is performed to transfer part of oxygen in the insulating film 312 to the oxide semiconductor films included in the multilayer films 308a and 308b and reduce the amount of oxygen vacancies included in the oxide semiconductor films included in the multilayer films 308a and 308b.

Next, an insulating film 313 is formed over the insulating film 312 and the multilayer film 308d (see FIG. 24A).

The insulating film 313 is preferably formed using a material that can prevent an external impurity such as oxygen, hydrogen, water, alkali metal, or alkaline earth metal, from diffusing into the multilayer film, more preferably formed using the material including hydrogen, and typically an inorganic insulating material containing nitrogen, such as a nitride insulating film, can be used. The insulating film 313 can be formed by a CVD method, for example.

The insulating film 313 is formed using a material which prevents diffusion of impurities from the outside, such as water, an alkali metal, and an alkaline earth metal, into the multilayer film, and the material further includes hydrogen. Thus, when hydrogen in the insulating film 313 is diffused into the multilayer film 308d, hydrogen is bonded to oxygen and electrons serving as carriers are generated in the oxide semiconductor film in the multilayer film 308d. As a result, the conductivity of the oxide semiconductor film in the multilayer film 308d is increased, so that the multilayer film 308d becomes the film 308c having conductivity.

The insulating film 313 is preferably formed at a high temperature to have an improved blocking property; for example, the insulating film 313 is preferably formed at a temperature in the range from the substrate temperature of 100° C. to the strain point of the substrate, or at a temperature in the range from 300° C. to 400° C. When the insulating film 313 is formed at a high temperature, a phenomenon in which oxygen is released from the oxide semiconductor used for the multilayer films 308a and 308b and the carrier density is increased is caused in some cases; therefore, the upper limit of the temperature is a temperature at which the phenomenon is not caused.

Then, the insulating films 305, 312, and 313 and the protective films 332c and 332e are processed into desired regions so that the insulating film 314 and the openings 364a, 364b, and 364c are formed. The insulating film 314 and the openings 364a, 364b, and 364c can be formed in such a manner that a mask is formed in the desired regions by fifth patterning and regions not covered by the mask are etched (see FIG. 24B). In the case where the protective films 332c and 332e are formed using a light-transmitting conductive film, the protective films 332c and 332e are not necessarily etched in this step.

The opening 364a is formed so as to expose a surface of the conductive film 304b. The opening 364b is formed so as to expose the conductive film 310c. The opening 364c is formed so as to expose the conductive film 310e.

An example of a formation method of the openings 364a, 364b, and 364c includes, but not limited to, a dry etching method. Alternatively, a wet etching method or a combination of dry etching and wet etching can be employed for formation of the openings 364a, 364b, and 364c.

Then, a conductive film 315 is formed over the insulating film 314 so as to cover the openings 364a, 364b, and 364c (see FIG. 25A).

The conductive film 315 can be formed by a sputtering method, for example.

Then, the conductive film 315 is processed into desired regions so that the light-transmitting conductive films 316a and 316b are formed. The light-transmitting conductive films 316a and 316b can be formed in such a manner that a mask is formed in the desired regions by sixth patterning and regions not covered with the mask are etched (see FIG. 25B).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

In this embodiment, the conductivity of the oxide semiconductor film in the multilayer film 308d is increased by diffusing hydrogen contained in the insulating film 313 into the multilayer film 308d; however, the conductivity of the oxide semiconductor film in the multilayer film 308d may be increased by covering the multilayer films 308a and 308b with a mask and adding impurities, typically, hydrogen, boron, phosphorus, tin, antimony, a rare gas element, alkali metal, alkaline earth metal, or the like to the multilayer film 308d. Hydrogen, boron, phosphorus, tin, antimony, a rare gas element, or the like is added to the multilayer film 308d by an ion doping method, an ion implantation method, or the like. Further, alkali metal, alkaline earth metal, or the like may be added to the multilayer film 308d by a method in which the multilayer film 308d is exposed to a solution that contains the impurity.

Next, a structure that is formed over the substrate 342 provided so as to face the substrate 302 is described below.

Figure 26A:
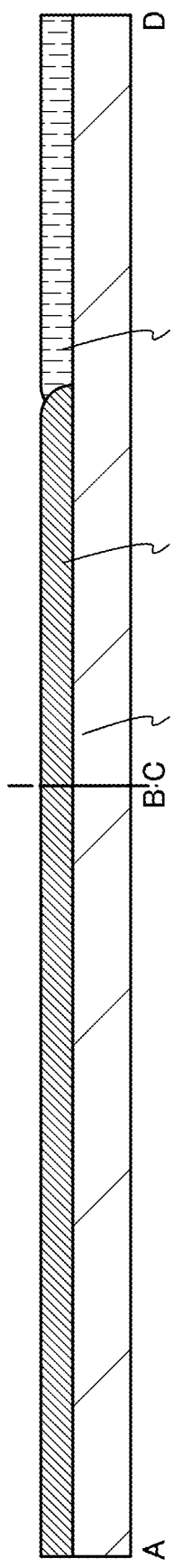
FIGS. 26A to 26C are cross-sectionals views illustrating one embodiment of a method for manufacturing a semiconductor device.

First, the substrate 342 is prepared. For materials of the substrate 342, the materials that can be used for the substrate 302 can be referred to. Then, the light-blocking film 344 and the colored film 346 are formed over the substrate 342 (see FIG. 26A).

The light-blocking film 344 and the colored film 346 each are formed in a desired position with any of various materials by a printing method, an inkjet method, an etching method using a photolithography technique, or the like.

Figure 26B:
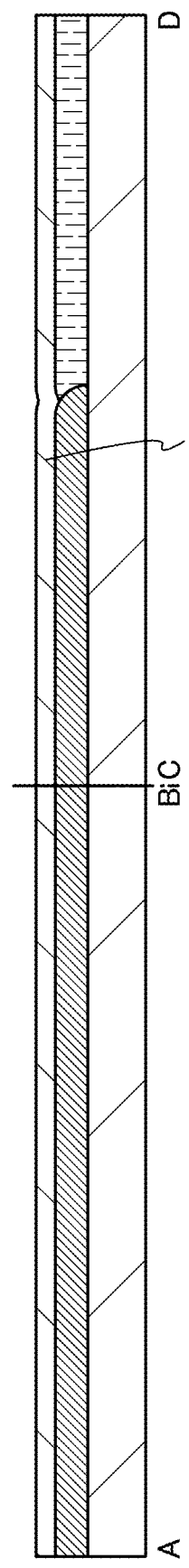

Then, the insulating film 348 is formed over the light-blocking film 344 and the colored film 346 (see FIG. 26B).

For the insulating film 348, an organic insulating film of an acrylic resin, an epoxy resin, polyimide, or the like can be used. With the insulating film 348, an impurity or the like contained in the colored film 346 can be prevented from diffusing into the liquid crystal layer 320, for example. Note that the insulating film 348 is not necessarily formed.

Figure 26C:
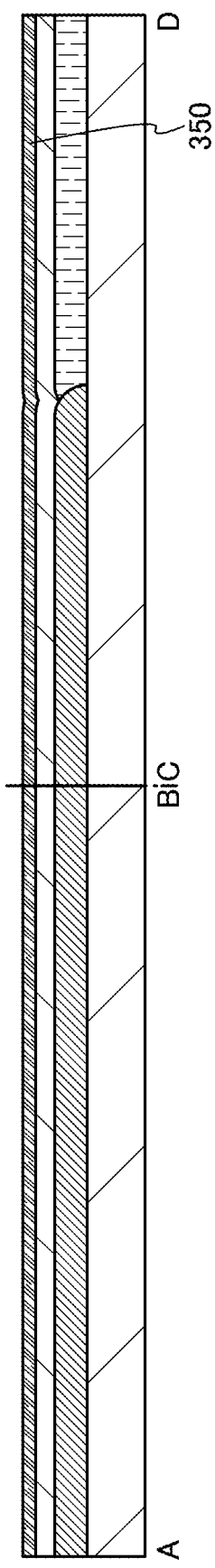

Then, the conductive film 350 is formed over the insulating film 348 (see FIG. 26C). As the conductive film 350, a material that can be used for the conductive film 315 can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 20 can be fabricated.

This embodiment can be combined with another embodiment in this specification as appropriate.

Embodiment 4

In this embodiment, one embodiment which can be applied to the oxide semiconductor film in any of the transistors included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may include a CAAC-OS. Furthermore, the oxide semiconductor film may include an amorphous oxide semiconductor and an oxide semiconductor having a crystal grain. Described below are the single-crystal oxide semiconductor, the polycrystalline oxide semiconductor, and the microcrystalline oxide semiconductor.

<Single-Crystal Oxide Semiconductor>

The single-crystal oxide semiconductor film has a lower impurity concentration and a lower density of defect states (few number of oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has higher density than the CAAC-OS film in some cases. The CAAC-OS film has higher density than the microcrystalline oxide semiconductor film in some cases. The polycrystalline oxide semiconductor film has higher density than the microcrystalline oxide semiconductor film in some cases. The microcrystalline oxide semiconductor film has higher density than the amorphous oxide semiconductor film in some cases.

<Polycrystalline Oxide Semiconductor>

In an image obtained with a TEM, crystal grains can be found in the polycrystalline oxide semiconductor film in some cases. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a grain boundary can be found in the polycrystalline oxide semiconductor film in some cases.

The polycrystalline oxide semiconductor film may include a plurality of crystal grains, and alignment of crystals may be different in the plurality of crystal grains. When the polycrystalline oxide semiconductor film is analyzed by, for example, an out-of-plane method with an XRD apparatus, one or plural peaks appear in some cases. For example, in the case of a polycrystalline IGZO film, a peak at 2θ of around 31° which shows alignment or plural peaks which show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor using the polycrystalline oxide semiconductor film has larger variation in electrical characteristics and lower reliability than a transistor using a CAAC-OS film in some cases.

<Microcrystalline Oxide Semiconductor>

In an image obtained with the TEM, crystal parts cannot be found clearly in the microcrystalline oxide semiconductor in some cases. In most cases, the size of a crystal part in a microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak which shows a crystal plane does not appear. Further, a halo pattern is shown in a selected-area electron diffraction pattern of the nc-OS film obtained by using an electron beam having a diameter larger than the diameter of a crystal part (e.g., larger than or equal to 50 nm). Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Figure 27:
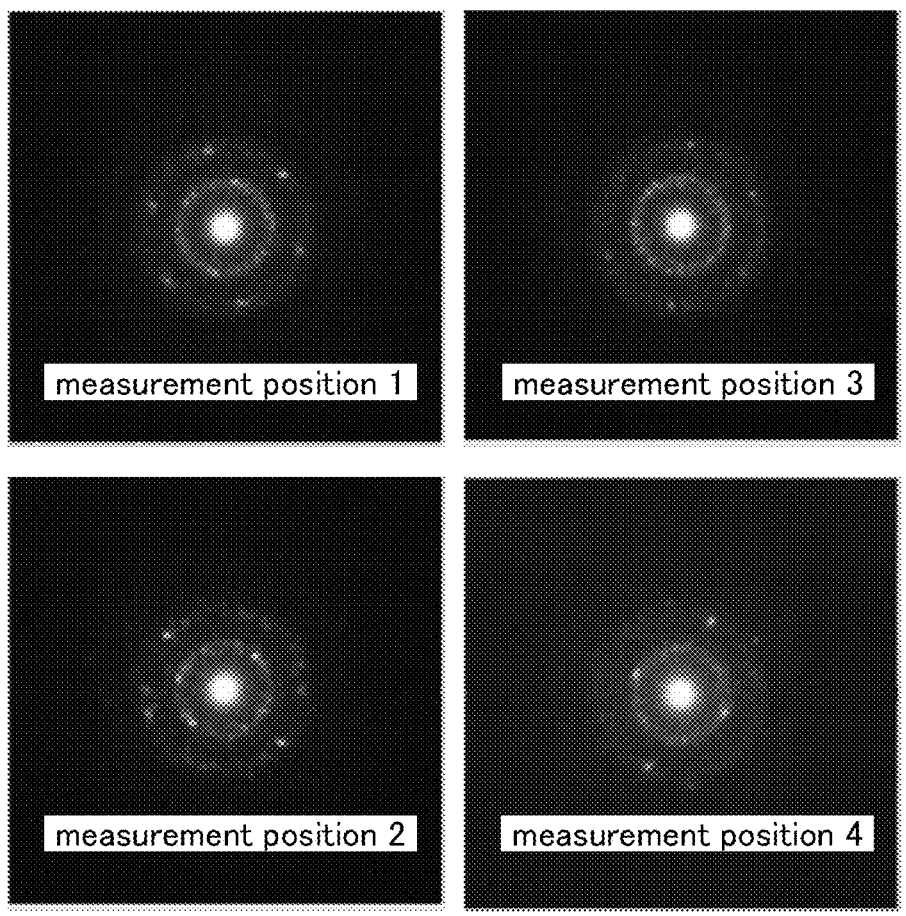
FIG. 27 shows nanobeam electron diffraction patterns of an oxide semiconductor.

FIG. 27 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 27 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film has a higher carrier density than the CAAC-OS film in some cases. The oxide semiconductor film having a high carrier density has high electron mobility in some cases. Thus, a transistor including the nc-OS film has high field-effect mobility in some cases. The nc-OS film has a higher defect state density than the CAAC-OS film, and thus has a lot of carrier traps in some cases. Consequently, a transistor including the nc-OS film has larger variation in electric characteristics and lower reliability than a transistor including the CAAC-OS film.

The nc-OS film can be formed easily as compared to the CAAC-OS film because the nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Embodiment 5

Although the oxide semiconductor film described in the above embodiment can be formed by sputtering, such a film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas) are sequentially introduced plural times to form an In—O layer, a $Ga(CH_3)_3$ gas and an $O_3$ gas) are introduced at a time to form a GaO layer, and then a $Zn(CH_3)_2$ gas and an $O_3$ gas) are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas), it is preferable to use an $O_3$ gas), which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Example 1

In this example, impurity analysis and XRD analysis of an oxide semiconductor film are described with reference to FIGS. 28A and 28B, FIGS. 29A and 29B, FIGS. 30A and 30B, and FIGS. 31A and 31B.

In this example, four kinds of samples (hereinafter Sample A1 to Sample A4) were fabricated as samples for impurity analysis.

First, a fabrication method of Sample A1 is described below.

In Sample A1, a 100-nm-thick In—Ga—Zn oxide film (hereinafter referred to as an IGZO film) was formed over a glass substrate, a 60-nm-thick copper film was formed over the IGZO film, and a 50-nm-thick silicon nitride film was formed over the copper film. After that, heat treatment was performed at 350° C. for one hour in a nitrogen atmosphere.

The IGZO film was formed by a sputtering method using a metal oxide target (In:Ga:Zn=1:1:1) under the following conditions: the flow ratio of the sputtering gas of $Ar/O_2$ was 1/1; the pressure was 0.6 Pa; the AC power was 5000 W; and the substrate temperature was 170° C.

Next, a fabrication method of Sample A2 is described below.

Instead of the conditions for the IGZO film of Sample A1, a 100-nm-thick IGZO film was formed using a metal oxide target (In:Ga:Zn=1:3:4) under the following conditions: the flow ratio of the sputtering gas of $Ar/O_2$ was 2/1; the pressure was 0.4 Pa; the DC power was 200 W; and the substrate temperature was 200° C. This sample is referred to as Sample A2.

Next, a fabrication method of Sample A3 is described below.

Instead of the conditions for the IGZO film of Sample A1, a 100-nm-thick IGZO film was formed using a metal oxide target (In:Ga:Zn=1:3:6) under the following conditions: the flow ratio of the sputtering gas of $Ar/O_2$ was 2/1; the pressure was 0.4 Pa; the DC power was 200 W; and the substrate temperature was 200° C. This sample is referred to as Sample A3.

Next, a fabrication method of Sample A4 is described below.

Instead of the conditions for the IGZO film of Sample A1, a 100-nm-thick IGZO film was formed using a metal oxide target (In:Ga:Zn=1:6:8) under the following conditions: the flow ratio of the sputtering gas of $Ar/O_2$ was 2/1; the pressure was 0.4 Pa; the DC power was 200 W; and the substrate temperature was 200° C. This sample is referred to as Sample A4.

Results of the impurity analysis and results of the XRD analysis of Samples A1 to A4 are shown in FIGS. 28A and 28B, FIGS. 29A and 29B, FIGS. 30A and 30B, and FIGS. 31A and 31B.

FIGS. 28A, 29A, 30A, and 31A show results of the impurity analysis and FIGS. 28B, 29B, 30B, and 31B show results of the XRD analysis. Note that the impurity analysis was performed by secondary ion mass spectrometry (SIMS)

in the direction shown by the hollow arrow in each of FIGS. 28A and 28B, FIGS. 29A and 29B, FIGS. 30A and 30B, and FIGS. 31A and 31B. That is, the measurement was performed from the glass substrate side.

Figure 28A:
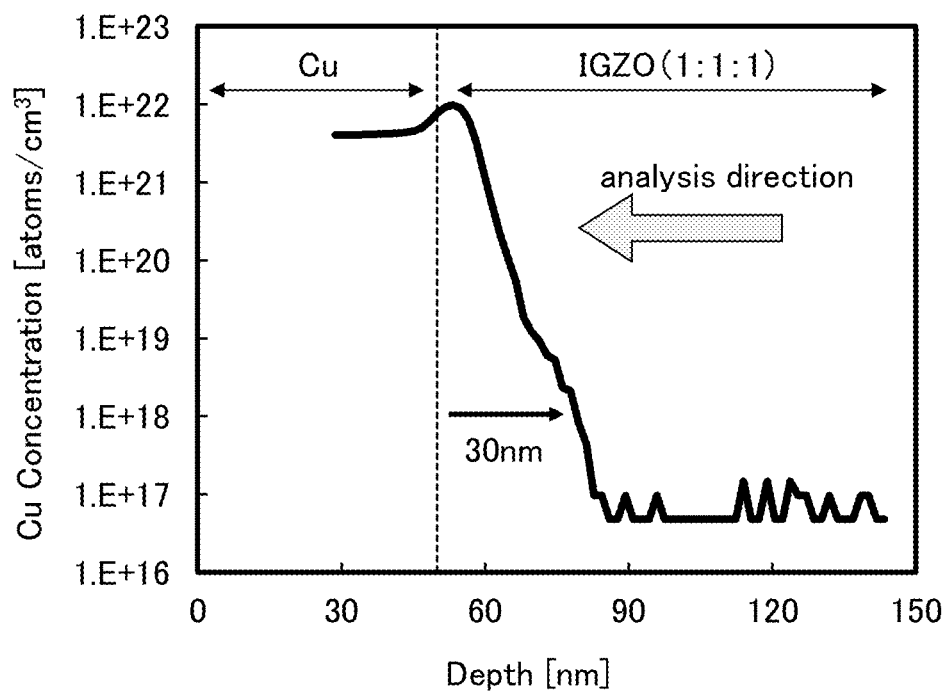
FIGS. 28A and 28B show results of impurity analysis and results of XRD analysis of an oxide semiconductor.
Figure 28B:
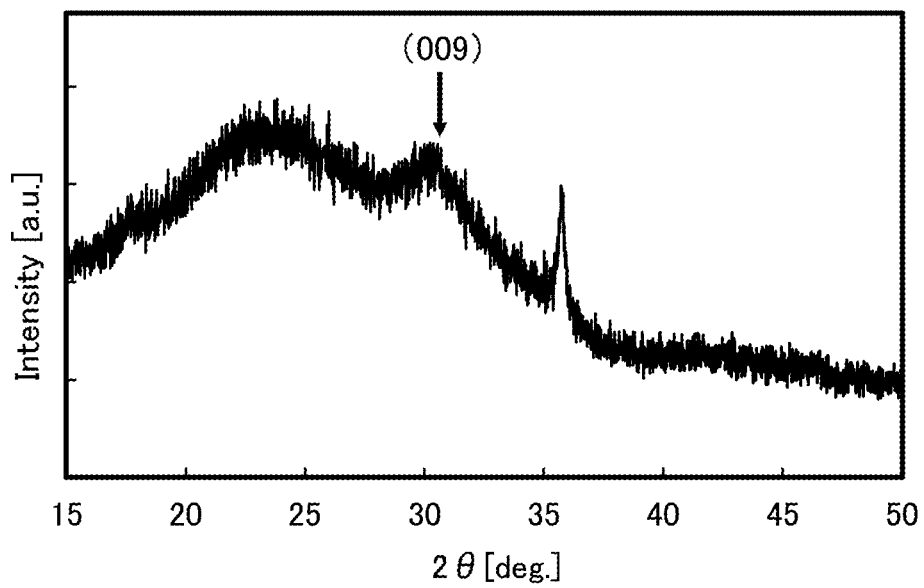
Figure 29A:
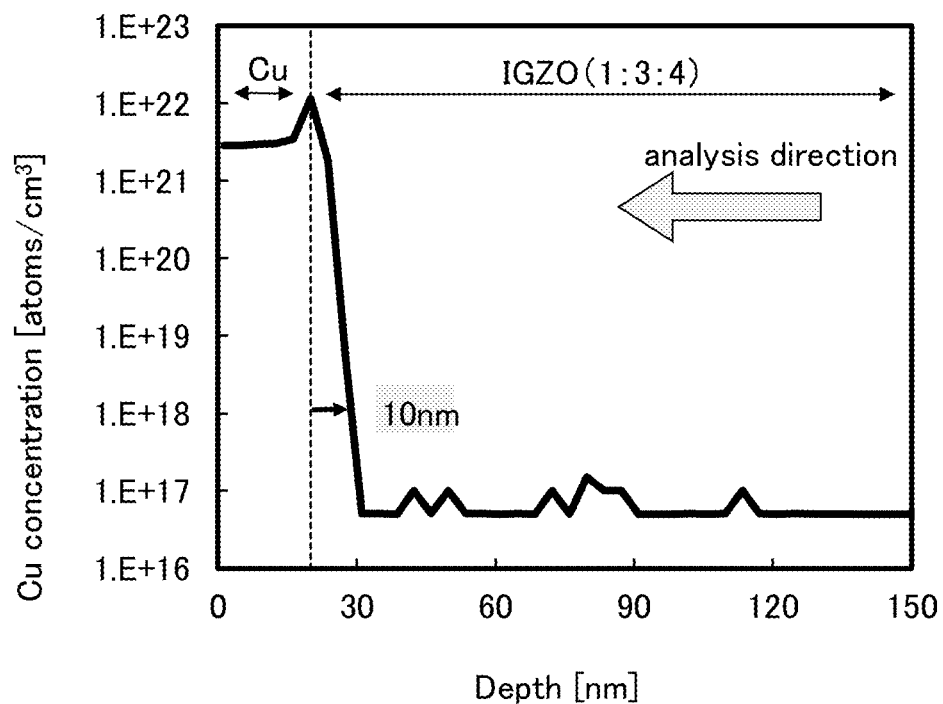
FIGS. 29A and 29B show results of impurity analysis and results of XRD analysis of an oxide semiconductor.
Figure 29B:
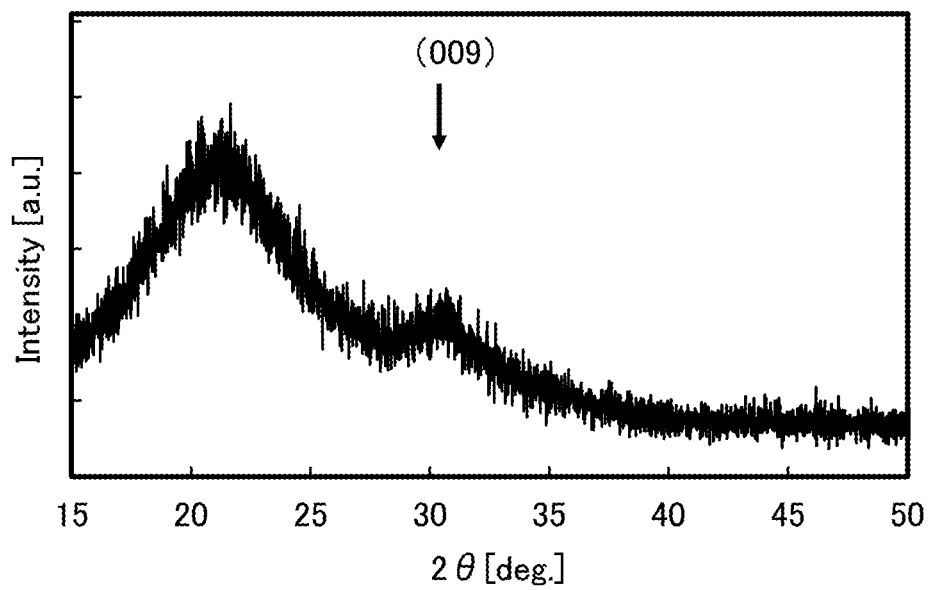
Figure 30A:
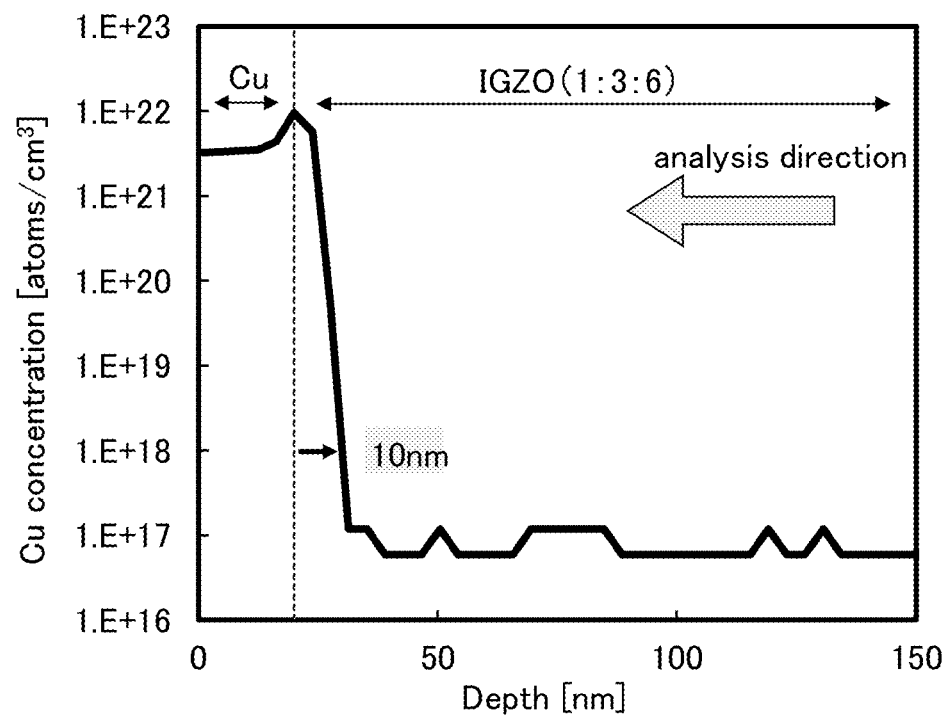
FIGS. 30A and 30B show results of impurity analysis and results of XRD analysis of an oxide semiconductor.
Figure 30B:
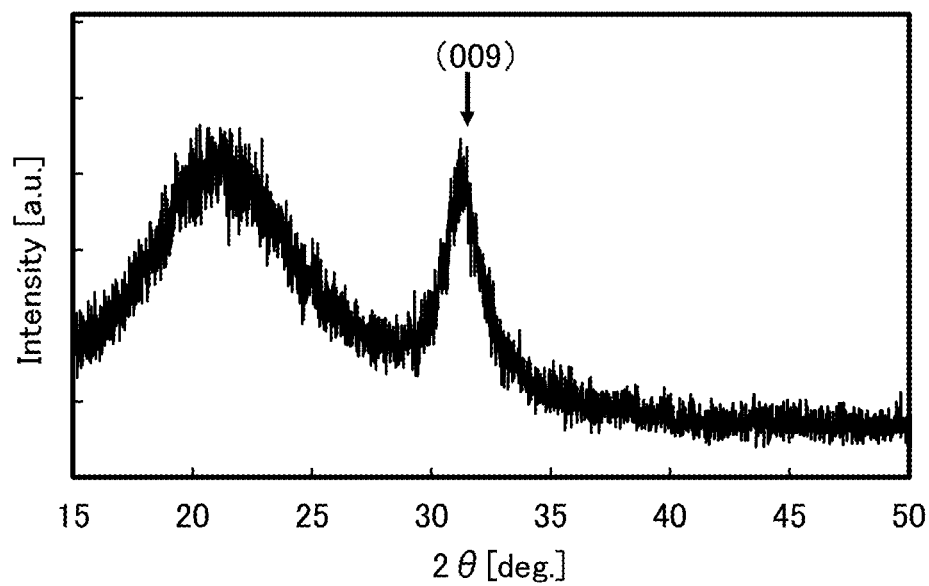
Figure 31A:
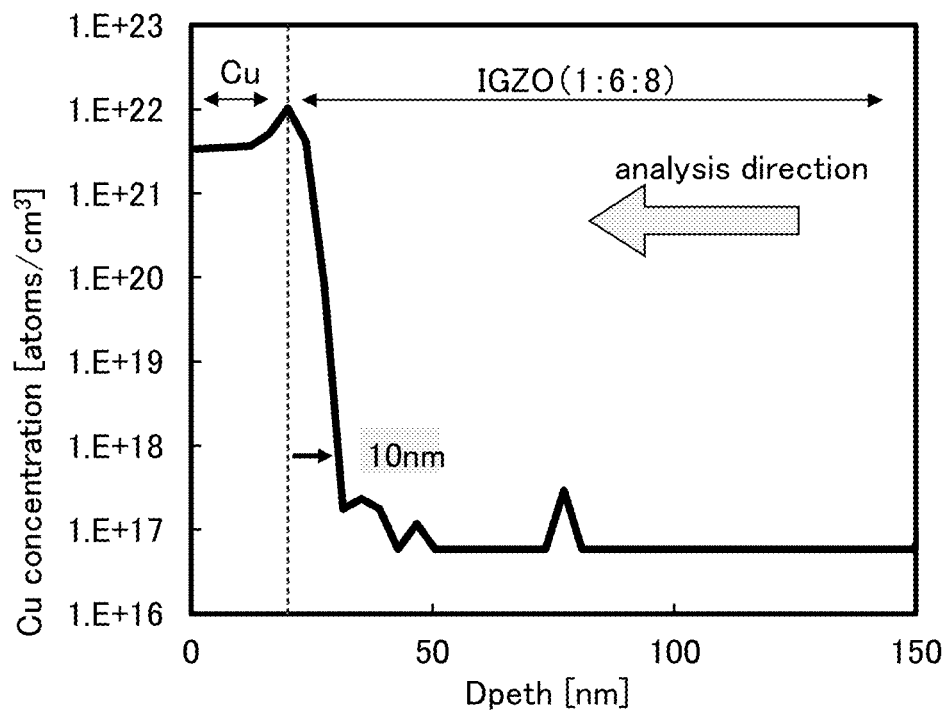
FIGS. 31A and 31B show results of impurity analysis and results of XRD analysis of an oxide semiconductor.
Figure 31B:
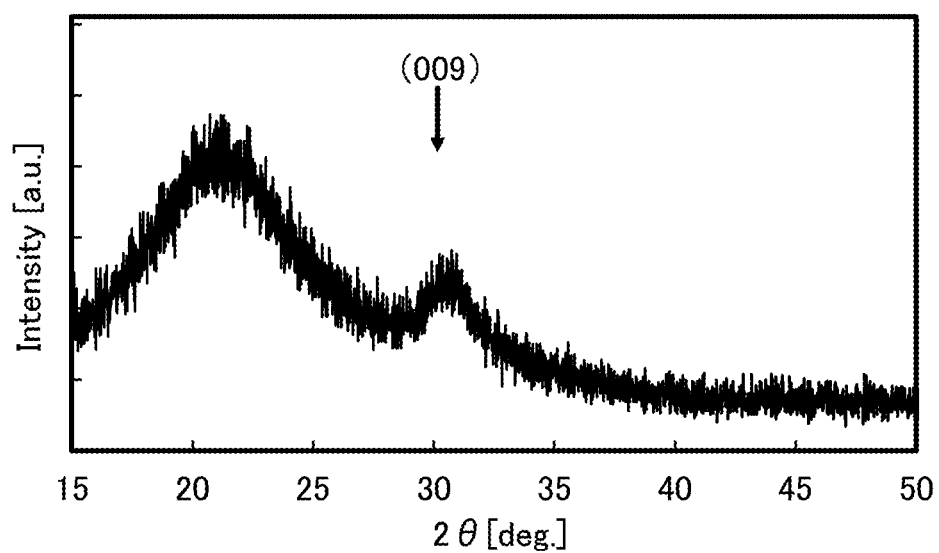

In FIG. 28A, IGZO (1:1:1) represents an IGZO film formed using a sputtering target containing In, Ga, and Zn at an atomic ratio of 1:1:1. In FIG. 29A, IGZO (1:3:4) represents an IGZO film formed using a sputtering target containing In, Ga, and Zn at an atomic ratio of 1:3:4. In FIG. 30A, IGZO (1:3:6) represents an IGZO film formed using a sputtering target containing In, Ga, and Zn at an atomic ratio of 1:3:6. In FIG. 31A, IGZO (1:6:8) represents an IGZO film formed using a sputtering target containing In, Ga, and Zn at an atomic ratio of 1:6:8. Further, in FIGS. 28A, 29A, 30A, and 31A, a dashed line represents the interface between the copper film and the IGZO film.

In a channel region of the transistor, the copper (Cu) concentration which affects the electrical characteristics is higher than or equal to $1 \times 10^{18}$ atoms/cm$^3$.

As shown in FIG. 28A, in Sample A1, a region where the copper (Cu) concentration is $1 \times 10^{18}$ atoms/cm$^3$ is a region apart from the interface between the copper film and the IGZO film by 30 nm to the substrate side.

As shown in FIG. 29A, in Sample A2, a region where the copper (Cu) concentration is $1 \times 10^{18}$ atoms/cm$^3$ is a region apart from the interface between the copper film and the IGZO film by 10 nm to the substrate side.

As shown in FIG. 30A, in Sample A3, a region where the copper (Cu) concentration is $1 \times 10^{18}$ atoms/cm$^3$ is a region apart from the interface between the copper film and the IGZO film by 10 nm to the substrate side.

As shown in FIG. 31A, in Sample A4, a region where the copper (Cu) concentration is $1 \times 10^{18}$ atoms/cm$^3$ is a region apart from the interface between the copper film and the IGZO film by 10 nm to the substrate side.

Based on the above, an IGZO film (1:3:4), an IGZO film (1:3:6), or an IGZO film (1:6:8) is formed over an IGZO film (1:1:1), and a copper film is formed thereover, whereby diffusion of a copper element (Cu) from the copper film into the IGZO film (1:1:1) can be prevented.

Further, as shown in FIGS. 28B, 29B, 30B, and 31B, in the IGZO film included in each sample, a peak is observed at 2θ at around 31°. The peak indicates the (009) plane. As described above, it is found that the IGZO film included in each sample is a c-axis aligned film. That is, each of the IGZO films included in Sample A1 to Sample A4 is a CAAC-OS film or a CAAC oxide film.

This application is based on Japanese Patent Application serial no. 2013-084074 filed with Japan Patent Office on Apr. 12, 2013, the entire contents of which are hereby incorporated by reference.

What is claimed is:

1. A semiconductor device comprising:
a gate electrode over a substrate;
a gate insulating film over the gate electrode;
an oxide semiconductor film over and in contact with the gate insulating film, the oxide semiconductor film comprising In, Ga, and Zn;
an oxide film over and in contact with the oxide semiconductor film, the oxide film comprising In, Ga, and Zn;
a pair of electrodes over and in contact with the oxide film, the pair of electrodes comprising copper;
a pixel electrode electrically connected to one of the pair of electrodes; and
a liquid crystal layer over the pixel electrode,
wherein the oxide film includes a plurality of crystal parts and has c-axis alignment in the plurality of crystal parts,
wherein c-axes are aligned in a direction parallel to a normal vector of a top surface of the oxide semiconductor film or the oxide film,
wherein a proportion of Ga atoms in the oxide film is higher than a proportion of Ga atoms in the oxide semiconductor film, and
wherein, in an atomic ratio of the oxide film, Ga is larger than In, and Zn is larger than Ga.

2. The semiconductor device according to claim 1, wherein the gate insulating film comprises a first insulating film and a second insulating film provided on the first insulating film.

3. The semiconductor device according to claim 2, wherein the first insulating film is a nitride insulating film.

4. The semiconductor device according to claim 2, wherein the second insulating film is an oxide insulating film.

5. The semiconductor device according to claim 1, wherein the pair of electrodes is in contact with a top surface of the gate insulating film.

6. A semiconductor device comprising:
a gate electrode over a substrate;
a gate insulating film over the gate electrode;
an oxide semiconductor film over the gate insulating film, the oxide semiconductor film comprising In, Ga, and Zn;
a pair of electrodes over the oxide semiconductor film, the pair of electrodes comprising copper;
an oxide film provided between the oxide semiconductor film and the pair of electrodes, the oxide film comprising In, Ga, and Zn;
a pixel electrode electrically connected to one of the pair of electrodes; and
a liquid crystal layer over the pixel electrode,
wherein the oxide semiconductor film has a channel formation region,
wherein the pair of electrodes is electrically connected to the oxide semiconductor film through the oxide film,
wherein a proportion of Ga atoms in the oxide film is higher than a proportion of Ga atoms in the oxide semiconductor film, and
wherein, in an atomic ratio of the oxide film, Ga is larger than In, and Zn is larger than Ga.

7. The semiconductor device according to claim 6, wherein the gate insulating film comprises a first insulating film and a second insulating film provided on the first insulating film.

8. The semiconductor device according to claim 7, wherein the first insulating film is a nitride insulating film.

9. The semiconductor device according to claim 7, wherein the second insulating film is an oxide insulating film.

10. The semiconductor device according to claim 6, wherein the oxide film includes a plurality of crystal parts and has c-axis alignment in the plurality of crystal parts.

11. A semiconductor device comprising:
a gate electrode;
a gate insulating film over the gate electrode;
an oxide semiconductor film over the gate insulating film, the oxide semiconductor film comprising In, Ga, and Zn;
a pair of electrodes over the oxide semiconductor film, the pair of electrodes comprising copper;

an oxide film provided between the oxide semiconductor film and the pair of electrodes, the oxide film comprising In, Ga, and Zn;
a pixel electrode electrically connected to one of the pair of electrodes; and
a liquid crystal layer over the pixel electrode,
wherein the oxide semiconductor film has a channel formation region,
wherein the pair of electrodes is electrically connected to the oxide semiconductor film through the oxide film,
wherein a proportion of Ga atoms in the oxide film is higher than a proportion of Ga atoms in the oxide semiconductor film,
wherein, in an atomic ratio of the oxide film, Ga is larger than In, and Zn is larger than Ga, and
wherein the liquid crystal layer is configured to be driven by an FFS mode.

12. The semiconductor device according to claim 11, wherein the gate insulating film comprises a first insulating film and a second insulating film provided on the first insulating film.

13. The semiconductor device according to claim 12, wherein the first insulating film is a nitride insulating film.

14. The semiconductor device according to claim 12, wherein the second insulating film is an oxide insulating film.

15. The semiconductor device according to claim 11, wherein the oxide film includes a plurality of crystal parts and has c-axis alignment in the plurality of crystal parts.

\* \* \* \* \*